US008663487B2

(12) United States Patent
Katoh et al.

(10) Patent No.: US 8,663,487 B2
(45) Date of Patent: Mar. 4, 2014

(54) METHOD FOR MANUFACTURING CRYSTAL OSCILLATOR

(75) Inventors: Akiko Katoh, Hamura (JP); Tohru Yanagisawa, Kodaira (JP)

(73) Assignee: Citizen Holdings Co., Ltd., Tokyo (JP)

( * ) Notice: Subject to any disclaimer, the term of this patent is extended or adjusted under 35 U.S.C. 154(b) by 338 days.

(21) Appl. No.: 12/997,927

(22) PCT Filed: Oct. 16, 2009

(86) PCT No.: PCT/JP2009/068216
§ 371 (c)(1),
(2), (4) Date: Dec. 14, 2010

(87) PCT Pub. No.: WO2010/044491
PCT Pub. Date: Apr. 22, 2010

(65) Prior Publication Data
US 2011/0163063 A1    Jul. 7, 2011

(30) Foreign Application Priority Data

Oct. 16, 2008 (JP) ................................. 2008-267061
Nov. 25, 2008 (JP) ................................. 2008-299479

(51) Int. Cl.
| G01C 19/56 | (2012.01) |
| H03H 9/215 | (2006.01) |
| H03H 9/21 | (2006.01) |
| H03H 9/02 | (2006.01) |
| H03H 3/02 | (2006.01) |
| G01C 19/5628 | (2012.01) |

(52) U.S. Cl.
CPC .................. *H03H 9/215* (2013.01); *H03H 9/21* (2013.01); *H03H 9/02023* (2013.01); *H03H 9/02118* (2013.01); *H03H 2003/026* (2013.01); *G01C 19/5628* (2013.01)
USPC ...... 216/41; 216/2; 216/83; 216/99; 333/200; 331/156; 310/367; 310/370; 73/504.16; 29/25.35

(58) Field of Classification Search
CPC ........... G01C 19/5628; H03H 9/02023; H03H 9/02118; H03H 9/215; H03H 9/21; H03H 2003/026
USPC .......... 216/2, 8, 3, 99, 41; 333/200; 331/156; 310/370, 367; 75/504.16; 29/25.35
See application file for complete search history.

(56) References Cited

U.S. PATENT DOCUMENTS 6,114,801 A *  9/2000  Tanaka et al. ................. 310/365
6,874,348 B2    4/2005  Omawari et al.
(Continued)

FOREIGN PATENT DOCUMENTS

JP    54-053889 A    4/1979
JP    58-29648 B2    6/1983
(Continued)

OTHER PUBLICATIONS

International Search Report for International Application PCT/JP2009/068216, Jan. 19, 2010.
(Continued)

*Primary Examiner* — Lan Vinh
*Assistant Examiner* — David Kaufman

(57) ABSTRACT

The invention is directed to the provision of a method for manufacturing a crystal oscillator manufacturing method that can achieve a highly precise fine adjustment without applying unnecessary external force to a crystal oscillator, and that can adjust a plurality of crystal oscillators in a collective manner. More specifically, the invention provides a method for manufacturing a crystal oscillator includes a first etching step for forming a prescribed external shape, an electrode forming step for forming an electrode at least in a portion of a surface of the external shape, a leakage amount measuring step for measuring leakage amount associated with leakage vibration of the external shape, and a second etching step for etching the external shape by an amount that is determined based on a measurement result of the leakage amount measuring step so as to adjust balance.

21 Claims, 49 Drawing Sheets

(56) References Cited

U.S. PATENT DOCUMENTS

| | | | |
|---|---|---|---|
| 2002/0068230 A1* | 6/2002 | Nakafuku | 430/30 |
| 2004/0174092 A1* | 9/2004 | Iwata | 310/324 |
| 2009/0085428 A1* | 4/2009 | Maeda | 310/312 |
| 2011/0163063 A1* | 7/2011 | Katoh et al. | 216/13 |

FOREIGN PATENT DOCUMENTS

| | | | | |
|---|---|---|---|---|
| JP | 10-206165 A | | 8/1998 | |
| JP | 10206165 A | * | 8/1998 | ............ G01C 19/56 |
| JP | 11-346137 A | | 12/1999 | |
| JP | 2000-124757 A | | 4/2000 | |
| JP | 2002-243451 A | | 8/2002 | |
| JP | 2006-140803 A | | 6/2006 | |
| JP | 2007-093485 A | | 4/2007 | |
| JP | 2007093485 A | * | 4/2007 | ............ G01C 19/56 |
| JP | 2007-306471 A | | 11/2007 | |
| JP | 2008-157845 A | | 7/2008 | |
| JP | 2011097457 A | * | 5/2011 | ............ H03H 3/02 |

OTHER PUBLICATIONS

Motohiro Fujiyoshi et al., "Modeling and Vibration Analysis of Quartz Gyro Sensor," IEICE Transactions, C vol. J87-C, No. 9, No. 712-719.

Japan Patent Office, Office Action for Japanese Patent Application No. 2010-515156, Sep. 17, 2013.

* cited by examiner

Fig.2(a)
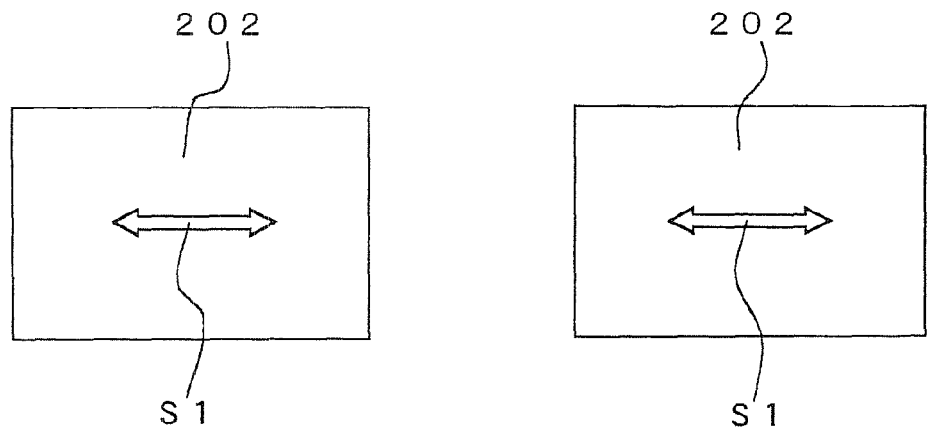
Fig.2(b)
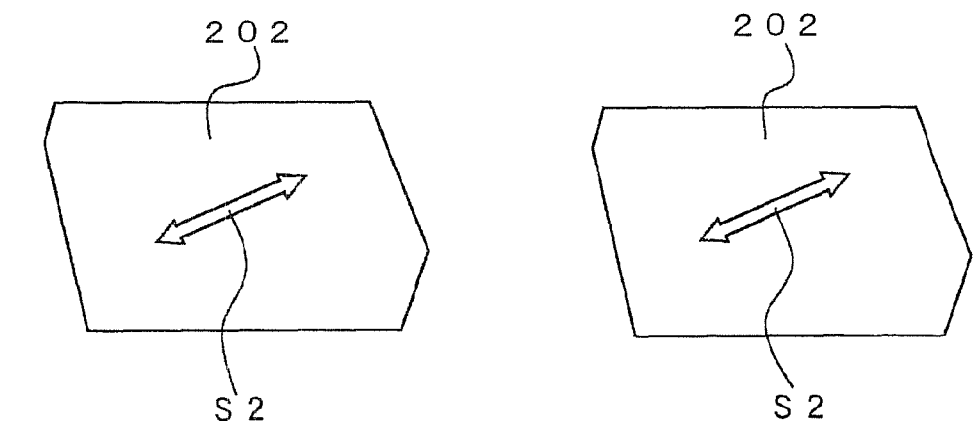
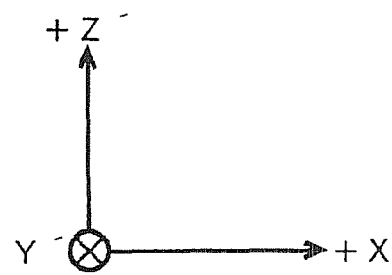

Fig.24

| Device Number | Measured Value of Initial Leakage Amount | First Electrode Processing Position | First Electrode Processing Start Position (from base) (μm) | First Electrode Processing End Position (from base) (μm) | Measured Value of Second Leakage Amount | Predicted Leakage Amount | Adjustment Error | Second Electrode Processing Position | Second Electrode Processing Start Position (from base) (μm) | Second Electrode Processing End Position (from base) (μm) | Measured Value of Final Leakage Amount |
|---|---|---|---|---|---|---|---|---|---|---|---|
| 1 | -2000 | RIGHT | 260 | 760 | -600 | 800 | 1600 | LEFT | 260 | 621 | 50 |
| 2 | 300 | LEFT | 260 | 314 | 120 | -60 | -120 | RIGHT | 1112 | 1200 | -35 |
| 3 | 1500 | LEFT | 260 | 591 | 1200 | 900 | 1800 | LEFT | 533 | 1200 | 85 |
| 4 | -50 | RIGHT | 260 | 269 | 0 | 50 | 100 | LEFT | 1126 | 1200 | 5 |
| 5 | -100 | RIGHT | 260 | 278 | -75 | -50 | -100 | RIGHT | 1126 | 1200 | -80 |
| 6 | 800 | LEFT | 260 | 415 | 600 | 400 | 800 | LEFT | 756 | 1200 | -15 |

Fig.31
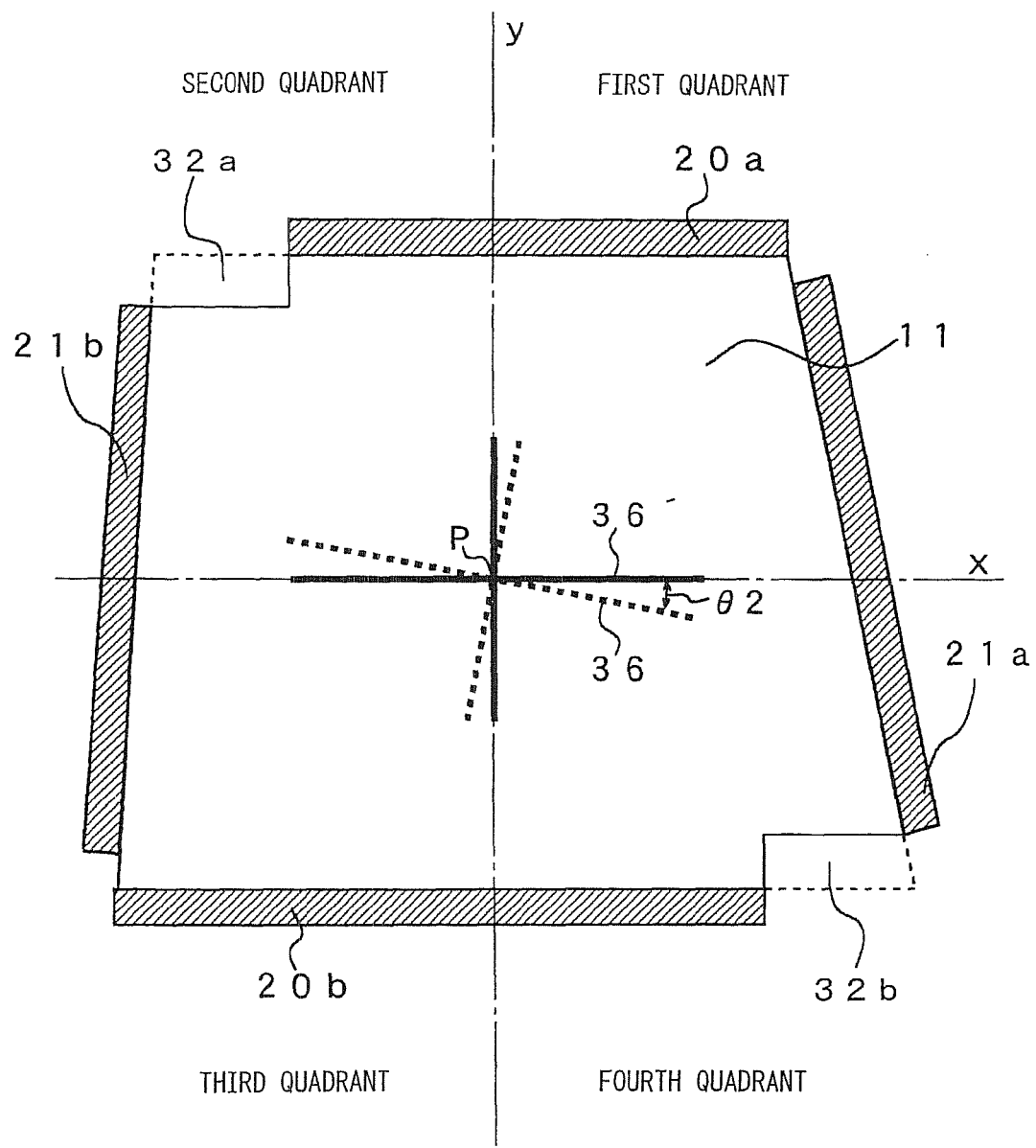
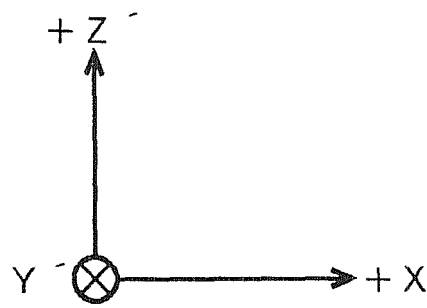

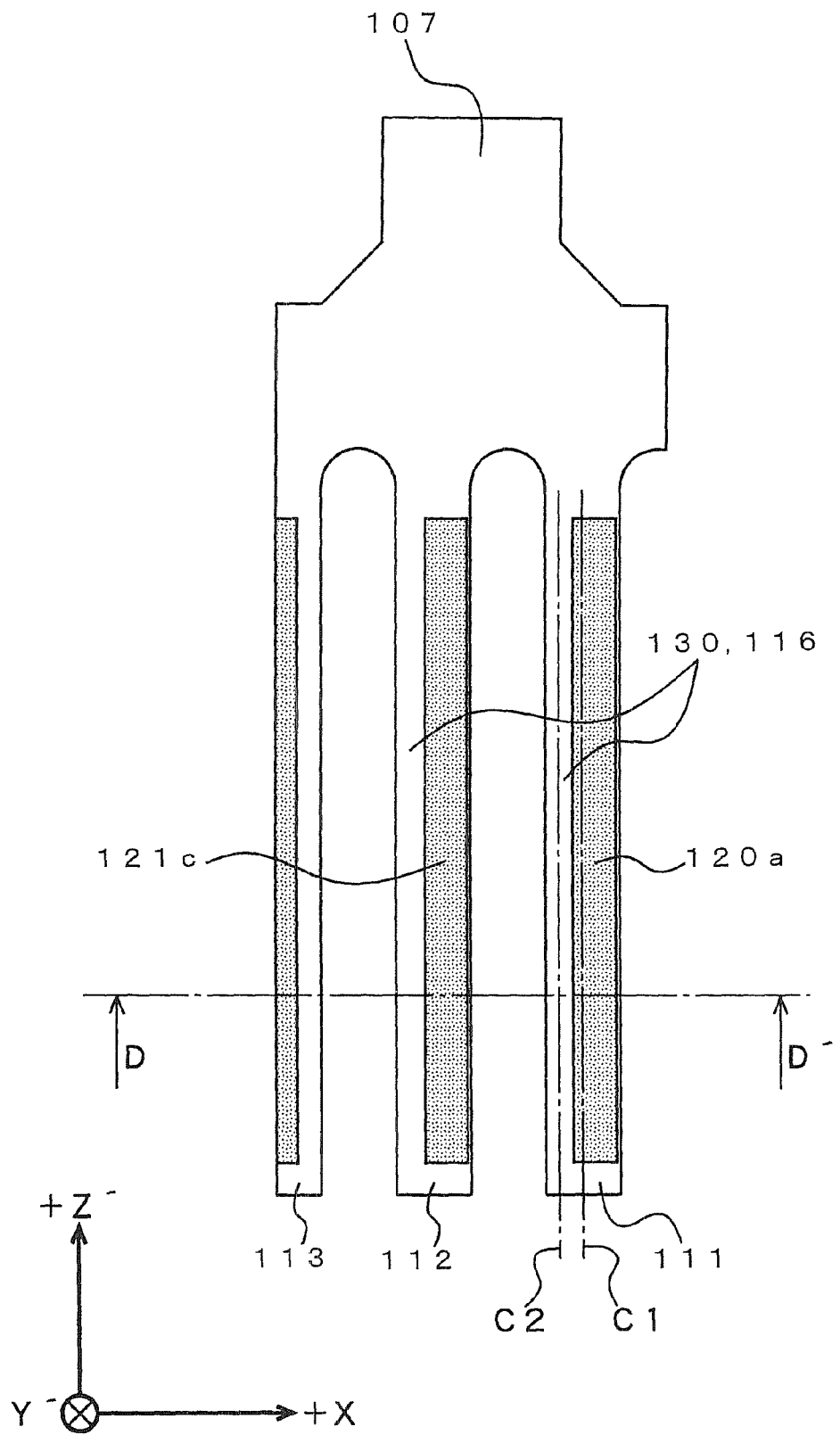

METHOD FOR MANUFACTURING CRYSTAL OSCILLATOR

FIELD OF THE INVENTION

The present invention relates to a method for manufacturing a crystal oscillator used as a vibrating gyro sensor or the like, and more particularly to a manufacturing method that suppresses the generation of leakage vibration known as out-of-plane vibration.

BACKGROUND OF THE INVENTION

A tuning fork crystal oscillator used as a vibrating gyro sensor or the like is manufactured by the steps of cutting a crystal oscillator of a prescribed shape from a crystal wafer, forming electrodes for causing the crystal oscillator to oscillate, and packaging the crystal oscillator with the electrodes formed thereon into a container. Of these steps, the external shape forming step that involves cutting the crystal oscillator from a crystal wafer is an important step since the shape of the crystal oscillator determines the frequency of vibration and greatly affects the performance of the crystal oscillator.

FIG. 1 is a perspective view schematically showing a prior art crystal oscillator.

The external shape of the crystal oscillator 200 is formed by cutting the crystal oscillator from a crystal wafer by etching in the external shape forming step. The crystal oscillator 200 shown here is an oscillator used as a vibrating gyro sensor, and more particularly, a three-pronged tuning fork oscillator having two driving tines 201 and 202 and one detection tine 203 as vibrating tines.

When using the crystal oscillator 200, for example, as a vibrating gyro sensor, flexural vibration in the X axis direction in FIG. 1 is used as driving vibration, and flexural vibration in the Z' axis direction is used as detection vibration which occurs when an angular velocity is applied. Therefore, when no angular velocity is applied, the vibration in the Z' axis direction does not occur.

FIG. 2 is a cross-sectional view of the prior art crystal oscillator 200 taken along line A-A' in FIG. 1, showing the cross section of the driving tine 201, 202. Portions not necessary for the following explanation are not shown in FIG. 2. FIG. 2(a) is a diagram explaining the driving vibration of the driving tine of the crystal oscillator 200, and FIG. 2(b) is a diagram explaining oblique driving vibration occurring in the driving tine of the crystal oscillator 200 and the formation of crystal residues.

FIG. 2(a) shows the ideal driving vibration that should occur when no angular velocity is applied to the crystal oscillator 200, and its vibration direction S1 is parallel to the X axis direction. However, in the crystal oscillator manufactured by the prior art manufacturing method, oblique vibration having a vibration component in the Z' axis direction is observed (as indicated by the vibration direction S2), as shown in FIG. 2(b), when actually no angular velocity is applied.

This is because, in addition to the driving vibration (the vibration in the X axis direction), an out-of-plane vibration (the vibration in the Z' axis direction) that should not occur when no angular velocity is applied to the crystal oscillator 200 occurs due to such factors as the processing accuracy of the crystal oscillator and the anisotropy of the crystal.

If the driving tine 201, 202 vibrates obliquely, the distal end of the detection tine 203 vibrates describing a rectilinear motion in the Z' axis direction or an elliptical motion in the X-Z' plane. This vibration component in the Z' axis direction is called the leakage vibration, and because of this leakage vibration, a leakage signal unrelated to the Coriolis output is produced from the detection electrode of the detection tine 203, resulting in the S/N ratio of the gyro sensor dropping or a degrade in temperature characteristics.

Likewise, in the case of tuning fork crystal oscillators used for ordinary applications such as frequency standards, vibrations are produced by utilizing the flexural vibrational motion in the X axis direction, and in this case also, there has been the problem that the leakage vibration containing the Z' direction component causes the crystal impedance (CI value) to rise, leading to a degradation of the characteristics.

It is believed that manufacturing variations in the cross-sectional shape of the crystal oscillator tines have some bearing on the leakage vibration. In particular, it is believed that variations in the shape of crystal residues generated when manufacturing the crystal oscillator by etching have some bearing on the leakage vibration. That is, the crystal has etching anisotropy, and the etch rate is different in different directions of the crystal. As a result, the side faces of the vibrating tines of the crystal oscillator are not uniformly etched, and residue is left thereon after etching.

The generation of the leakage vibration due to the formation of such residue will be investigated below.

Generally, when investigating the flexure of a beam or the like, the principal axes of its cross section are considered. The principal axes of the cross section are two mutually perpendicular axes, and when a bending force is applied to the beam in the same direction as one principal axis, the beam bends in the same direction as the direction of the applied force. On the other hand, when a bending force is applied in a direction different than the direction of the principal axis, the beam bends in a direction different than the direction in which the force is applied.

In the case of a crystal oscillator, the bending force due to the piezoelectric effect is applied in the X axis direction. Therefore, if one of the principal axes coincides with the X axis, the vibration occurs in the X axis direction, and no leakage vibration is generated. On the other hand, if the principal axis is tilted away from the X axis toward the Z' axis, since the direction of the bending force does not coincide with the direction of the principal axis, oblique vibration containing a Z'-axis component occurs, resulting in the generation of leakage vibration.

The principal axes are determined by the cross-sectional shape of the beam (vibrating tine). As a simple example, in the case of a cross section having an axis of symmetry, the axis of symmetry and an axis perpendicular to it are the principal axes of the cross section. For example, in the case of a rectangular cross section, the lines that bisect the respective pairs of opposite sides are the principal axes.

If a crystal oscillator free from leakage vibration is to be obtained, it is required that one of its principal axes be parallel to the X axis. Since the principal axes are two mutually perpendicular axes, if the cross section has an axis of symmetry parallel to the X axis or Z' axis, then there exists a principal axis parallel to the X axis. That is, if the cross-sectional shape is top-bottom or left-right symmetrical, no leakage vibration occurs.

An investigation has been made to see whether a crystal oscillator having such an axis of symmetry can be obtained when the oscillator is manufactured as in the earlier described example. When the crystal oscillator is manufactured using wet etching, residue is invariably left on the side faces of the vibrating tine. The principal axes of its cross section are therefore determined depending on how the residue is formed. When considering the principal axes of the cross section of the crystal oscillator, first it is necessary to examine how the residue is formed. Since residue shape varies depending on the etching time and etching conditions, it is not possible to generalize, but the process of formation is roughly the same; therefore, the process of residue formation will be described below based on the results observed from the experiment conducted by the present inventor.

FIG. 3 is an enlarged cross-sectional view, taken along line A-A' in FIG. 1, schematically showing the vibrating tine of the crystal oscillator 200 to illustrate one example of how the residues are formed on the vibrating tine. For simplicity of explanation, only one driving tine 201 is shown here, and the side face on the −X side of the crystallographic axis of the crystal is denoted as the first side face and the side face on the +X side as the second side face.

FIG. 3(a) shows the case where the etching time is relatively short. In this case, the residue is formed on the second side face, forming an angle of about 2° with the Z' axis in regions (shallow regions) near the principal faces, i.e., the upper and lower surfaces 201a and 201b, of the oscillator and an angle of about 22° in regions (deeper regions) farther away from them.

Though the depth from the upper and lower surfaces 201a and 201b varies depending on the etching time, the process is essentially the same for both the upper and lower surfaces 201a and 201b.

FIG. 3(b) shows the case where the etching time is relatively long. In this case, the regions forming the angle of about 22° are etched away, and only the residue regions forming the angle of about 2° are left unetched.

In either case, the residue formed on the first side face is very small, but when closely observed, the residue is certainly formed, as shown in FIGS. 3(a) and 3(b). In this case, the residue is formed, forming an angle of about 1° with the Z' axis. The shape of the residue on the first side face is relatively unaffected by the etching time. That is, the etching starts from the edges of the respective etching masks 250a and 250b, and proceeds on both the upper and lower surfaces independently of each other until the wafer is etched through.

Since the residues are formed as a result of etching as described above, the following can be pointed out when the crystal oscillator is manufactured by the method that performs etching from both the upper and lower surfaces of the crystal wafer. First, FIGS. 3(a) and 3(b) each show the case where the etching mask 250a formed on the upper surface of the crystal wafer and the etching mask 250b on the lower surface are in perfect registration. In this case, whether the etching time be short or long, the cross section of the vibrating tine 201 after etching is top-bottom symmetrical about an axis of symmetry substantially parallel to the X axis, and has a principal axis 210 substantially parallel to the X axis, as illustrated. In this case, leakage vibration does not easily occur because the direction of the bending force and the direction of the principal axis 210 both substantially coincide with the X axis.

FIG. 4 shows one example of a cross-sectional view of the driving tine 201 which was formed when the etching masks 250a and 250b were formed one displaced from the other in the X axis direction.

As shown, the cross-sectional shape of the driving tine 201 becomes top-bottom asymmetrical, and does not have an axis of symmetry parallel to the X axis, nor does it have an axis of symmetry parallel to the Z' axis.

In this case, the principal axis 211 is not parallel to the X axis, but is displaced by an angle θ1. As a result, since the direction of the bending force and the direction of the principal axis are different, oblique vibration occurs, resulting in the generation of leakage vibration. There is a document that analyzes the relationship between the oblique vibration and the principal axes of such a cross section (for example, refer to non-patent document 1).

As can be seen from FIG. 4, there is correlation between the amount of displacement, e, of the etching masks 250a and 250b and the angle of displacement, θ1, of the principal axis 211 relative to the X axis. As the amount of displacement, e, increases, the angle of displacement, θ1, also increases, increasing the leakage vibration.

In one known method employed to form the external shape of a crystal oscillator, an etching mask is patterned only on one surface of a crystal wafer, the other surface is completely covered with a corrosion resistant metal film, and etching is performed from the one surface; in another known method, the etching mask pattern formed on the lower surface is made wider than the etching mask pattern on the upper surface, and etching is performed using the upper etching mask pattern as the reference pattern.

FIG. 5 is a cross-sectional view of a driving tine, showing one example of the etching performed using the upper etching mask pattern as the reference pattern.

The driving tine 221 shown here is formed by using the etching mask 251a on the upper surface 221a, which is set as the reference pattern, and the etching mask 251b on the lower surface 221b, which is formed wider than the upper surface. In this case, even if the etching masks 251a and 251b are somewhat displaced relative to each other, the cross-sectional shape is relatively unaffected. However, as described earlier, due to the etching anisotropy of the crystal, a residue forming an angle of about 1° with the Z' axis is formed on the first side face, and a residue forming an angle of about 2° with the Z' axis is formed on the second side face. As a result, the cross-sectional shape of the driving tine 221 is top-bottom asymmetrical as shown, and the principal axis 212 is not parallel to the X axis, but is displaced by an angle θ2, resulting in the generation of leakage vibration.

As described above, crystal oscillators used for such applications as vibrating gyro sensors have had the problem that leakage vibration occurs due to etching mask formation errors, resulting in a degradation of sensor detection accuracy, etc.

To solve the above problem, if the accuracy of etching mask formation is increased, the leakage vibration can be suppressed to a certain degree, but this not only increases the cost, but there is a limit to the degree to which the accuracy can be increased. Furthermore, since the residues cannot be completely eliminated, it has been difficult to suppress the leakage vibration.

In view of the above, a method has been proposed that further processes the vibrating tines after forming the external shape of the crystal oscillator. For example, a crystal oscillator characteristic adjusting method is disclosed that involves grinding the edges of the vibrating tines of the crystal oscillator on a sliding tape and adjusting the balance of the vibrating tines, thereby aiming to suppress the occurrence of leakage vibration (for example, refer to patent document 1).

FIG. 6 is a schematic diagram for explaining the crystal oscillator characteristic adjusting method disclosed in patent document 1.

While applying a constant load to a tape 301 by the weight of a tension roller 300, the tape 301 is placed in contact with an edge of a vibrating tine 310 of the crystal oscillator mounted on a base 311. It is assumed here that the vibrating tine of the crystal oscillator has a cross section such as shown in FIG. 2. In this condition, a driving roller 302 is rotated back and forth, and the weight balance of the vibrating tine 310 is adjusted by forming a ground portion 310a on the vibrating tine 310.

According to the prior art disclosed in patent document 1, the tape 301 can be moved in sliding fashion while pressing it against the edge of the vibrating tine 310 by applying a constant force using the tension roller 300. Finally, a tape take-up reel 303 is rotated by a predetermined amount to take up the tape 301, and at the same time, a tape supply reel 304 is rotated by a predetermined amount to feed the tape 301. With this operation, the portion of the tape 301 that contacts the vibrating tine can be changed to a new portion. According to the characteristic adjusting method that uses such a tape, since the weight balance can be precisely adjusted, the angular velocity can be accurately detected, and since the tension roller 300 serves to prevent an excessive eternal force from being applied to the oscillator, the method has the potential of being able to prevent the breakage of the oscillator.

Instead of using such a tape, the vibrating tines of the crystal oscillator may be ground by etching (for example, refer to patent document 2).

Patent document 2 discloses an oscillator temperature characteristic adjusting method that, after forming the external shape of the piezoelectric oscillator, adjusts the frequency-temperature characteristics of the oscillator by adjusting the plate thickness by performing etching using a metal film such as an electrode film as a mask. According to this prior art method disclosed in patent document 2, since the temperature characteristics can be adjusted by performing re-etching after forming the oscillator, the method has the potential of being able to efficiently manufacture oscillators having excellent frequency-temperature characteristics.

Patent document 1: Japanese Unexamined Patent Publication No. 2002-243451 (Page 7, FIG. 9)

Patent document 2: Japanese Unexamined Patent Publication No. S54-53889 (Page 3, FIG. 5)

Non-patent document 1: Motohiro FUJIYOSHI and five others, "Modeling and Vibration Analysis of Quartz Gyro Sensor," IEICE Transactions, C Vol. J87-C, No. 9, pp. 712-719

SUMMARY OF THE INVENTION

However, with the crystal oscillator characteristic adjusting method disclosed in patent document 1, since the vibrating tines of each individual crystal oscillator are ground one by one, the processing time increases. If the processing time increases, the chance of processing errors and defects occurring also increases, leading to an increase in cost.

Further, if the balance adjustment requires a micron-order accuracy, it is difficult to achieve such a fine adjustment, because it is not possible to precisely touch the vibrating tine by using a tape, router, etc.

Furthermore, even in the case of the grinding using a tension roller, a certain amount of external force is applied to the oscillator; in particular, in the case of a small-sized oscillator, cracks tend to be formed in the oscillator during the adjustment due to the external force, resulting in the problem that the manufacturing yield drops.

On the other hand, in the oscillator temperature characteristic adjusting method disclosed in patent document 2, the plate thickness is adjusted by performing re-etching after forming the oscillator, but the purpose is to improve the frequency-temperature characteristics of the oscillator, not to adjust or correct for the leakage vibration of the oscillator, and no disclosure or suggestion is made on the adjustment of the leakage vibration.

It is an object of the present invention to provide a method for manufacturing a crystal oscillator manufacturing method that can solve the above problems.

It is another object of the present invention to provide a method for manufacturing a crystal oscillator manufacturing method that can achieve a highly precise fine adjustment without applying an external force to a crystal oscillator manufacturing method during the adjustment of the leakage vibration of the crystal oscillator.

It is still another object of the present invention to provide a method for manufacturing a crystal oscillator manufacturing method that can adjust a plurality of crystal oscillators in a collective manner.

It is a further object of the present invention to provide a method for manufacturing a crystal oscillator manufacturing method that can achieve a highly precise fine adjustment without applying an external force to a crystal oscillator during the adjustment of the leakage vibration of the crystal oscillator, and that can adjust a plurality of crystal oscillators in a collective manner.

A method for manufacturing a crystal oscillator according to the present invention includes a first etching step for forming a prescribed external shape, an electrode forming step for forming an electrode at least in a portion of a surface of the external shape, a leakage amount measuring step for measuring a leakage amount associated with leakage vibration of the external shape, and a second etching step for etching the external shape by an amount that is determined based on a measurement result of the leakage amount measuring step so as to adjust balance.

Preferably, in the method for manufacturing the crystal oscillator according to the present invention, the second etching step is performed by using the electrode as a mask.

Preferably, the method for manufacturing the crystal oscillator according to the present invention further includes an electrode processing step for processing the electrode into a prescribed shape based on the measurement result of the leakage amount measuring step, and the second etching step is performed by using the electrode processed in the electrode processing step as a mask.

Preferably, in the method for manufacturing the crystal oscillator according to the present invention, the external shape includes a base portion and a vibrating tine extending from the base portion, and the electrode forming step forms the electrode on the vibrating tine.

Preferably, in the method for manufacturing the crystal oscillator according to the present invention, in the electrode processing step, the electrode is processed in such a manner that a substantially widthwise center of an exposed portion formed by processing the electrode becomes displaced from a substantially widthwise center of the vibrating tine in a widthwise direction of the vibrating tine.

Preferably, the method for manufacturing the crystal oscillator according to the present invention further includes a coarse adjustment step, inserted between the electrode forming step and the leakage amount measuring step, for etching the vibrating tine by using the electrode formed in the electrode processing step as a mask.

Preferably, in the method for manufacturing the crystal oscillator according to the present invention, in the electrode forming step, the electrode is formed in such a manner that a substantially widthwise center of the electrode becomes displaced from a substantially widthwise center of the electroded vibrating tine by a predetermined amount in a widthwise direction of the electrode.

Preferably, in the method for manufacturing the crystal oscillator according to the present invention, in the electrode processing step, the electrode is processed, based on the measurement result of the leakage amount measuring step, in such a manner that either a first region of the electrode, which is a region near the base portion of the vibrating tine, or a second region of the electrode, which is a region near a distal end of the vibrating tine, has a reduced width than its initial state.

Preferably, in the method for manufacturing the crystal oscillator according to the present invention, in the electrode processing step, the electrode is processed in such a manner as to reduce the width of the electrode in the first region when the measurement result of the leakage amount measuring step shows that a large adjustment is necessary, but to reduce the width of the electrode in the second region when the measurement result shows that a small adjustment is necessary.

Preferably, in the method for manufacturing the crystal oscillator according to the present invention, when performing the second etching step and the electrode processing step a plurality of times, the electrode in the first region is chosen as the electrode to be first processed in the electrode processing step.

Preferably, in the method for manufacturing the crystal oscillator according to the present invention, the second etching step determines the amount of etching of the vibrating tine by converting the amount of etching into an equivalent processing time, based on leakage amount information obtained from the measurement result of the leakage amount measuring step.

Preferably, in the method for manufacturing the crystal oscillator according to the present invention, the vibrating tine has a plurality of etch-off portions formed by etching in the second etching step, and when a center of a vibrating axis of a cross section of the vibrating tine is taken as an origin, and a first quadrant, a second quadrant, a third quadrant, and a fourth quadrant are defined by two mutually perpendicular axes passing through the origin, the etch-off portions are provided in quadrants diametrically opposed across the origin.

Preferably, in the method for manufacturing the crystal oscillator according to the present invention, when a center of a vibrating axis of a cross section of the vibrating tine is taken as an origin, and a first quadrant, a second quadrant, a third quadrant, and a fourth quadrant are defined by two mutually perpendicular axes passing through the origin, the amount of etching in the second etching step is the same between any two quadrants diametrically opposed across the origin but differs between any two adjacent quadrants.

Preferably, in the method for manufacturing the crystal oscillator according to the present invention, in the first etching step, a plurality of the external shapes are formed on a single plate of crystal, and in the second etching step, the plurality of external shapes are etched simultaneously.

Preferably, in the method for manufacturing the crystal oscillator according to the present invention, the leakage amount measuring step measures the leakage amount for each one of the plurality of external shapes, and stores positional relationship information associating the measured leakage amount with a corresponding one of the plurality of external shapes.

Preferably, in the method for manufacturing the crystal oscillator according to the present invention, the electrode forming step is performed by irradiating the electrode with laser light.

Preferably, in the method for manufacturing the crystal oscillator according to the present invention, in the first etching step, the external shape whose direction of leakage vibration can be estimated is formed, and in the electrode forming step, the electrode is formed so as to have a cut-out for adjusting balance in accordance with the external shape formed in the first etching step.

Preferably, in the method for manufacturing the crystal oscillator according to the present invention, in the external shape forming step, mask members are formed on both faces of a planar crystal plate, and the mask members on both faces are differently sized widthwise so that the direction of leakage vibration of the external shape to be formed can be estimated in advance.

Preferably, in the method for manufacturing the crystal oscillator according to the present invention, in the external shape forming step, mask members are formed on both faces of a planar crystal plate, and the mask members on both faces are displaced relative to each other by a predetermined amount so that the direction of leakage vibration of the external shape to be formed can be estimated in advance.

Preferably, in the method for manufacturing the crystal oscillator according to the present invention, when the amount of offset at a first side face as measured widthwise of the mask members on both faces is denoted by k1, the amount of offset at a second side face by k2, mask registration accuracy by ±p, etching angle at the first side face by $\alpha$, etching angle at the second side face by $\beta$, and the thickness of the planar crystal plate by t, then the length "c" of a first protruding portion and the length "d" of a second protruding portion satisfy the relations $$c = t \times \tan(\alpha - 90°) + k1$$

$$d = t \times \tan)(\beta - 90°) + k2$$

where k1, k2>p

A method for manufacturing a crystal oscillator according to the present invention is implemented as a method for manufacturing a crystal oscillator that has an external shape having a vibrating tine extending from a base portion and that has an electrode formed on at least one of principal and side faces of the vibrating tine, the method including, an external shape forming step for forming an etching resistant mask member of a prescribed shape on a planar crystal plate, and for forming the external shape by etching the crystal plate into the prescribed shape using the mask member, an electrode forming step for forming the electrode on either the principal face or the side face of the vibrating tine; a leakage amount measuring step for measuring a leakage amount on the crystal oscillator; an electrode processing step for processing the electrode into a prescribed shape based on the measurement result of the leakage amount measuring step, and a balance adjustment step for etching the vibrating tine by using as a mask the electrode processed into the prescribed shape in the electrode processing step.

The invention is also implemented as a method for manufacturing a crystal oscillator that has an external shape having a vibrating tine extending from a base portion and that has an electrode formed on at least one of principal and side faces of the vibrating tine, the method including, an external shape forming step for forming an etching resistant mask member of a prescribed shape on a single planar crystal plate, and for forming the external shapes of a plurality of crystal oscillators by etching the crystal plate into the prescribed shape using the mask member, an electrode forming step for forming the electrode on either the principal face or the side face of the vibrating tine, a leakage amount measuring step for measuring a leakage amount on each individual one of the crystal oscillator pieces, an electrode processing step for processing the electrode of each individual one of the crystal oscillator pieces into a prescribed shape based on the measurement result of the leakage amount measuring step, and a balance adjustment step for etching the crystal plate in a collective manner by using as masks the electrodes each processed into the prescribed shape in the electrode processing step.

The electrode processing step can process the electrode in such a manner that a substantially widthwise center of an exposed portion formed by processing the electrode becomes displaced from a substantially widthwise center of the vibrating tine in a widthwise direction of the vibrating tine.

The leakage amount measuring step can measure not only the leakage amount on each individual one of the crystal oscillator pieces but also positional relationship information associating the measured leakage amount with a corresponding one of the crystal oscillator pieces, and the electrode processing step may perform electrode processing on each individual one of the crystal oscillator pieces based on the positional relationship information.

The method can further includes a coarse adjustment step, inserted between the electrode forming step and the leakage amount measuring step, for etching the vibrating tine by using the electrode formed in the electrode processing step as a mask.

In the electrode forming step, the electrode can be formed in such a manner that a substantially widthwise center of the electrode becomes displaced from a substantially widthwise center of the electroded principal face by a predetermined amount in a widthwise direction of the electrode.

In the electrode processing step, a portion of the electrode can be removed by irradiation with laser light.

When viewed in the plane of the electroded principal face, the region near the base of the vibrating tine may be defined as a first region, and the region located nearer to the distal end of the vibrating tine as a second region; then, the electrode processing step may process the electrode in such a manner as to reduce the width of the electrode in either one of the two regions, based on the measurement result of the leakage amount measuring step.

Further, the electrode processing step can process the electrode in such a manner as to reduce the width of the electrode in the first region when the measurement result of the leakage amount measuring step shows that a large adjustment is necessary, but to reduce the width of the electrode in the second region when the measurement result shows that only a small adjustment is necessary.

When performing the balance adjustment step and the electrode processing step a plurality of times, the electrode in the first region may be chosen as the electrode to be first processed in the electrode processing step.

In the balance adjustment step, the amount of etching of the vibrating tine can be determined by converting the amount of etching into an equivalent processing time, based on leakage amount information obtained from the measurement result of the leakage amount measuring step.

In the adjustment step or the coarse adjustment step, the vibrating tine can be processed by etching so as to have a plurality of etch-off portions on its principal face, and when a center of a vibrating axis of a cross section of the vibrating tine is taken as an origin, and a first quadrant, a second quadrant, a third quadrant, and a fourth quadrant are defined by two mutually perpendicular axes passing through the origin, the etch-off portions may be provided in quadrants diametrically opposed across the origin.

Further, in the adjustment step or the coarse adjustment step, when a center of a vibrating axis of a cross section of the vibrating tine is taken as an origin, and a first quadrant, a second quadrant, a third quadrant, and a fourth quadrant are defined by two mutually perpendicular axes passing through the origin, the amount of etching on the principal face may be set the same between any two quadrants diametrically opposed across the origin but different between any two adjacent quadrants.

According to the method for manufacturing the crystal oscillator of the present invention, since the leakage vibration is adjusted by re-etching the vibrating tine after forming the external shape of the vibrating tine, there is no need to apply an unnecessary external force to the oscillator, unlike the method that grinds the vibrating tine with a tape, router, etc. Accordingly, the leakage vibration can be adjusted stably and accurately without degrading the manufacturing yield, reliability, etc., of the oscillator.

Further, according to the method for manufacturing the crystal oscillator of the present invention, since the electrode is processed based on the result of the measurement of the leakage vibration, and re-etching is performed by using the thus processed electrode as a mask, the leakage vibration can be adjusted at a highly precise, fine level, and thus a high-performance crystal oscillator can be manufactured by suppressing its leakage vibration to a negligible level.

Furthermore, according to the method for manufacturing the crystal oscillator of the present invention, since the plurality of crystal oscillator pieces formed on the same crystal wafer can be adjusted by etching in a collective manner, not only can the adjustment process be simplified and the number of process steps be reduced, but crystal oscillator pieces having uniform and stable performance free from large variations can be manufactured efficiently in large quantities.

When the method for manufacturing the crystal oscillator according to the present invention is used as a gyro sensor, a high-accuracy gyro sensor impervious to leakage vibration can be achieved. On the other hand, when the crystal oscillator manufactured according to the present invention is used as a frequency standard crystal oscillator, since the IC value can be reduced to a low level, a low-power high-performance frequency standard crystal oscillator can be achieved.

A method for manufacturing a crystal oscillator according to the present invention is implemented as a method for manufacturing a crystal oscillator that has an external shape having a vibrating tine extending from a base portion and that has an electrode formed on principal and side faces of the vibrating tine, the method including, an external shape forming step for forming an etching resistant mask member of a prescribed shape on a planar crystal plate, and for forming the external shape by etching the crystal plate through the mask member into a shape such that the direction of leakage vibration of the crystal oscillator can be estimated in advance; an electrode forming step for forming the electrode on the principal face of the vibrating tine so as to have a cut-out for adjusting balance based on the estimated direction of leakage vibration; and a balance adjustment step for etching the vibrating tine by using the electrode formed in the electrode processing step as a mask.

The external shape forming step can form a plurality of external shapes on a single plate of crystal, and the balance adjustment step may etch a plurality of crystal plates in a collective manner.

Further, the substantially widthwise center of the electrode having the cut-out can be displaced from the substantially widthwise center of the vibrating tine in the widthwise direction of the vibrating tine.

In the external shape forming step, mask members can be formed on both faces of the planar crystal plate, and the mask members on both faces may be differently sized widthwise of the vibrating tine so that the direction of leakage vibration of the crystal oscillator to be formed can be estimated in advance.

When the amount of offset at a first side face as measured widthwise of the mask members on both faces is denoted by k1, the amount of offset at a second side face by k2, mask registration accuracy by ±p, etching angle at the first side face by α, etching angle at the second side face by β, and the thickness of the planar crystal plate by t, then the length "c" of a first protruding portion and the length "d" of a second protruding portion may be chosen to satisfy the relations $$c = t \times \tan(\alpha - 90°) + k1$$

$$d = t \times \tan(\beta - 90°) + k2$$

where k1, k2>p

In the external shape forming step, mask members can be formed on both faces of the planar crystal plate, and the mask members on both faces can be displaced relative to each other by a predetermined amount so that the direction of leakage vibration of the crystal oscillator to be formed can be estimated in advance.

The balance adjustment step may be preceded by a leakage amount measuring step for measuring the leakage amount of the crystal oscillator.

If a plurality of external shapes are formed on a single plate of crystal, the leakage amount measuring step may measure not only the leakage amount on each individual one of the crystal oscillator pieces but also positional relationship information associating the measured leakage amount with a corresponding one of the crystal oscillator pieces, and the balance adjustment step may determine the amount of etching by setting as the target value of the balance adjustment the smallest leakage amount taken from among the crystal oscillator pieces.

Likewise, if a plurality of external shapes are formed on a single plate of crystal, the leakage amount measuring step may measure not only the leakage amount on each individual one of the crystal oscillator pieces but also positional relationship information associating the measured leakage amount with a corresponding one of the crystal oscillator pieces, and the balance adjustment step may determine the amount of etching by setting as the target value of the balance adjustment the average leakage amount taken over the crystal oscillator pieces.

If a plurality of external shapes are formed on a single plate of crystal, the leakage amount measuring step may measure not only the leakage amount on each individual one of the crystal oscillator pieces but also positional relationship information associating the measured leakage amount with a corresponding one of the crystal oscillator pieces, and the balance adjustment step may determine the amount of etching by setting as the target value of the balance adjustment a representative value of the leakage amount taken from among the crystal oscillator pieces.

In the balance adjustment step, the amount of etching of the vibrating tine can be determined by converting the amount of etching into an equivalent processing time, based on leakage amount information obtained from the measurement result of the leakage amount measuring step.

In the balance adjustment step, the vibrating tine can be processed by etching so as to have a plurality of etch-off portions on its principal face, and when a center of a vibrating axis of a cross section of the vibrating tine is taken as an origin, and a first quadrant, a second quadrant, a third quadrant, and a fourth quadrant are defined by two mutually perpendicular axes passing through the origin, the etch-off portions may be provided in quadrants diametrically opposed across the origin.

Further, in the balance adjustment step, when a center of a vibrating axis of a cross section of the vibrating tine is taken as an origin, and a first quadrant, a second quadrant, a third quadrant, and a fourth quadrant are defined by two mutually perpendicular axes passing through the origin, the amount of etching on the principal face may be set the same between any two quadrants diametrically opposed across the origin but different between any two adjacent quadrants.

According to the method for manufacturing the crystal oscillator of the present invention, since the leakage vibration is adjusted by re-etching the vibrating tine after forming the external shape of the vibrating tine, the vibrating tine can be processed without applying an unnecessary external force to the oscillator, unlike the method that grinds the vibrating tine with a tape, router, etc.; accordingly, the leakage vibration can be adjusted stably and accurately without degrading the manufacturing yield, reliability, etc., of the oscillator.

Further, since the direction of leakage vibration of the crystal oscillator can be estimated in advance by characterizing the external shape of the crystal oscillator in the external shape forming step, an electrode having a cut-out provided based on the estimated direction of leakage vibration is formed one the driving tine. As a result, the balance adjustment of the leakage vibration can be made by performing etching using as a mask the electrode having such a cut-out; i.e., by adjusting the size and position of the cut-out as well as the etch processing time, the leakage vibration can be accurately adjusted at a fine level, and the crystal oscillator can be thus manufactured by suppressing its leakage vibration highly precisely.

Furthermore, since the plurality of crystal oscillator pieces formed on the same crystal wafer can be adjusted for balance by etching in a collective manner, not only can the adjustment process be simplified and the number of process steps be reduced, but crystal oscillator pieces having uniform and stable performance free from large variations can be manufactured in large quantities efficiently.

When the crystal oscillator according to the present invention is used as a gyro sensor, a high-accuracy gyro sensor impervious to leakage vibration can be achieved. On the other hand, when the crystal oscillator is used as a frequency standard crystal oscillator, since the IC value can be reduced to a low level, a low-power high-performance frequency standard crystal oscillator can be achieved.

BRIEF DESCRIPTION OF THE DRAWINGS

FIGS. 2(a) and 2(b) are cross-sectional views taken along line A-A' in FIG. 1, showing a vibrating tine of the prior art crystal oscillator.

FIG. 24 is a diagram showing specific adjustment examples.

FIG. 31 is an enlarged cross-sectional view explaining how designated portions of the driving tine of the crystal oscillator piece are etched off in a coarse adjustment step according to the second crystal oscillator manufacturing method of the present invention.

FIG. 39 is a top plan view showing one example of the electrodes formed in the electrode forming step according to the third manufacturing method of the present invention are connected.

DETAILED DESCRIPTION OF THE PREFERRED EMBODIMENT

A manufacturing method according to the present invention will be described below with reference to the drawings. It should be noted, however, that the present invention is not limited to the following description, but extends to the inventions described in the appended claims and their equivalents.

Figure 7:
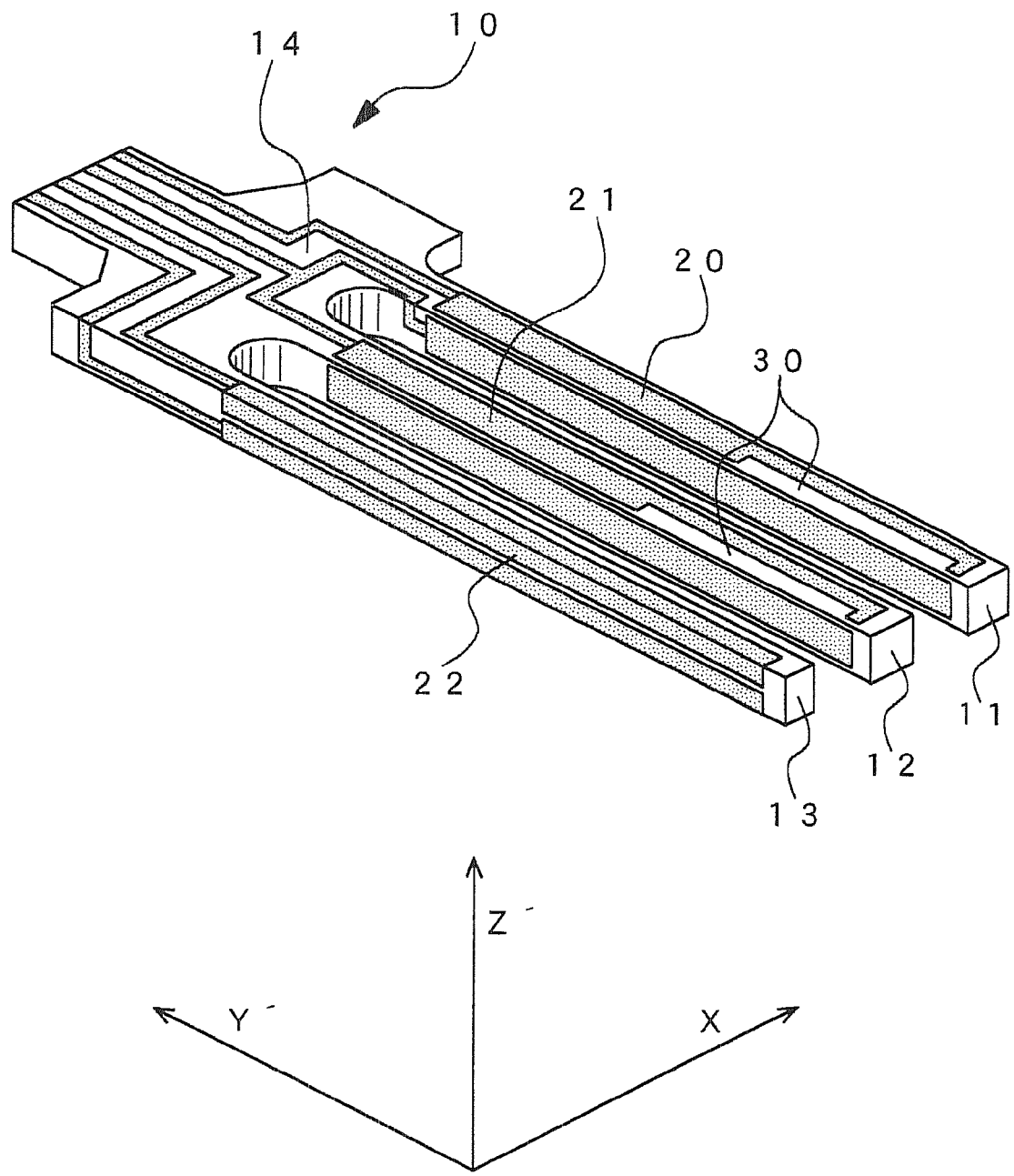
FIG. 7 is a perspective view showing one example of a crystal oscillator manufactured according to a manufacturing method of the present invention.

FIG. 7 is a diagram showing one example of a crystal oscillator manufactured according to the manufacturing method of the present invention.

FIG. 7 is a perspective view schematically showing the crystal oscillator 10, and portions not relevant to the explanation, for example, fixing portions where an electrically conductive adhesive is applied when sealing the crystal oscillator in a sealing member such as a package, are not shown here.

As in the previously described example, the crystal oscillator 10 is formed by cutting it from a crystal wafer by etching. The crystal oscillator 10 shown here is an oscillator used as a vibrating gyro sensor, and more particularly, a three-pronged tuning fork oscillator having two driving tines 11 and 12 and one detection tine 13 as vibrating tines. However, the crystal oscillator 10 need not be limited to a three-pronged tuning fork, but may be, for example, a two-pronged tuning fork, a T-type tuning fork, an H-type tuning fork, or the like. Further, the crystal oscillator 10 can be used in other applications than the vibrating gyro sensor.

The driving tines 11 and 12 and the detection tine 13 are formed so as to extend from a base portion 14. Driving electrodes 20 and 21 are formed on the principal and side faces of the driving tines 11 and 12, and a detection electrode 22 is formed on the principal and side faces of the detection tine 13. Adjustment areas 30 are areas used to adjust the leakage vibration of the crystal oscillator 10. In the adjustment areas 30, designated portions of the driving electrodes 20 and 21 are removed by laser and, using the thus processed driving electrodes as masks, the driving tines 11 and 12 are re-etched in a balance adjustment step.

A major feature of the present invention is to suppress the generation of leakage vibration by re-etching the crystal in the adjustment areas 30 of the driving electrodes 20 and 21 and thereby adjusting the thicknesses of the driving tines 11 and 12 in these areas. The crystal oscillator 10 is formed so that its widthwise direction coincides with the X axis direction, its longitudinal direction coincides with the Y' axis direction, and its thickness direction coincides with the Z' axis direction. This crystal oscillator 10 is common to all the crystal oscillator pieces manufactured by the first and second manufacturing methods described hereinafter.

Figure 8:
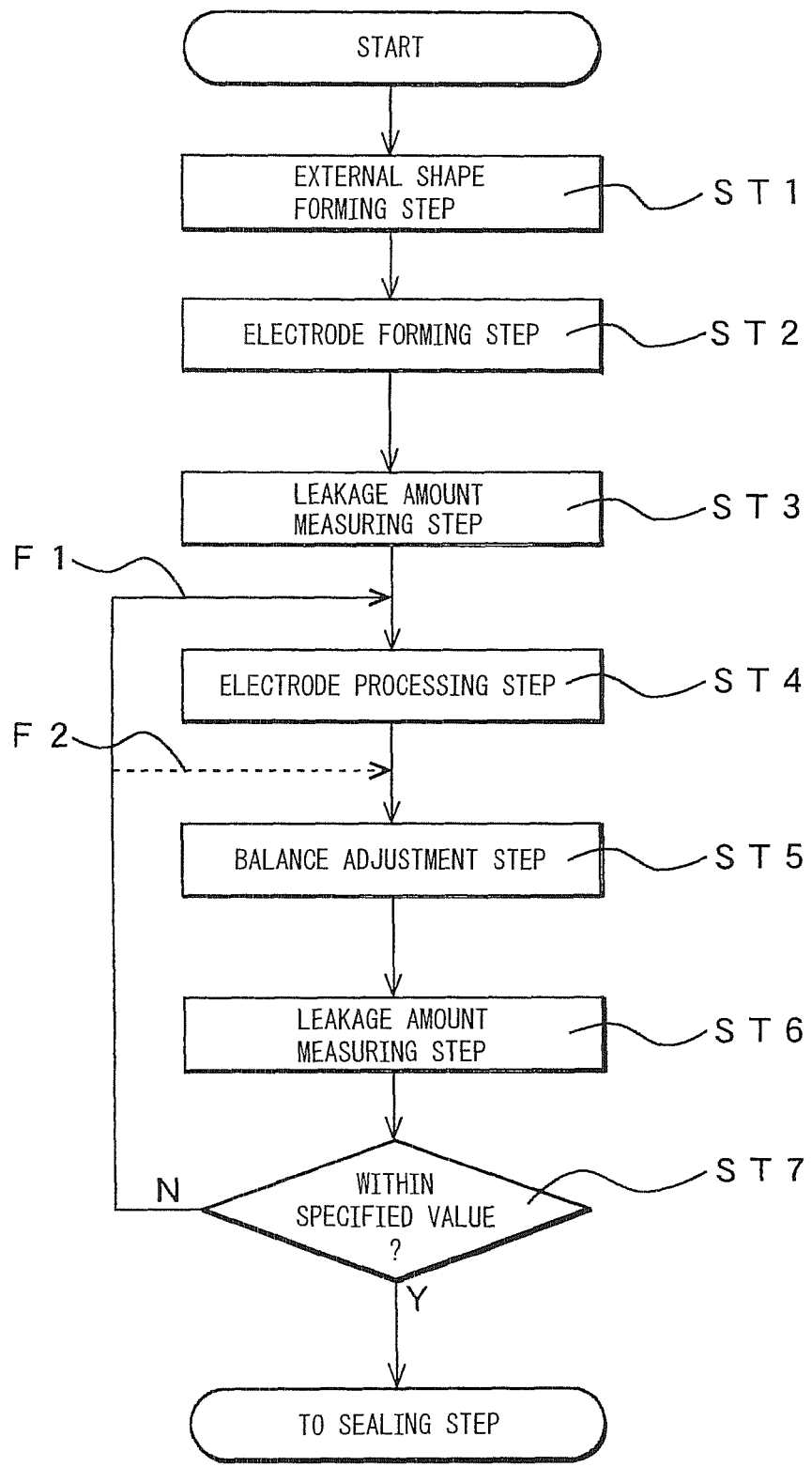
FIG. 8 is a flowchart illustrating the sequence of process steps according to a first manufacturing method of the present invention.

FIG. 8 is a flowchart illustrating the sequence of process steps in the first crystal oscillator manufacturing method according to the present invention.

In the manufacturing method described below, a plurality of crystal oscillator pieces are formed on the same crystal wafer and manufactured as an array of crystal oscillator pieces in a collective manner. However, the first crystal oscillator manufacturing method according to the present invention is not limited to the collective manufacturing of an array of crystal oscillator pieces, but the present invention can also be applied to a manufacturing method that forms one crystal oscillator on one crystal wafer or crystal plate.

First, an external shape forming step (step ST1) is performed that forms an etching resistant mask member on a crystal wafer or a single plate of crystal and then forms the external shapes of a plurality of crystal oscillator pieces. The etching resistant mask member may be formed using, for example, gold (Au). In this case, chromium (Cr) may be deposited to form a base layer underlying the gold. That is, the etching resistant mask member may be formed in a multilayered structure. The base layer of chromium (Cr) serves to enhance the adhesion between the crystal and gold (Au). Using the thus formed etching resistant mask member as a mask, the crystal wafer is etched with a prescribed etching solution, to form the external shapes of the respective crystal oscillator pieces.

Next, an electrode forming step (step ST2) is performed to form electrodes on the principal or side faces of the vibrating tines of each of the crystal oscillator pieces. In the example shown in FIG. 7, the electrodes formed in this step are the driving electrodes 20 and 21 and the detection electrode 22.

Next, a leakage amount measuring step (step ST3) is performed that measures the amount of leakage vibration by driving each individual crystal oscillator piece formed on the crystal wafer. In the leakage amount measuring step, the leakage amount is measured on all of the crystal oscillator pieces formed on the crystal wafer, but if variations in leakage amount are small, for example, the leakage amount may be measured by sampling only some of the crystal oscillator pieces.

Next, based on the measurement result obtained from the leakage amount measuring step, an electrode processing step (step ST4) is performed to process the electrodes of each individual crystal oscillator piece into a prescribed shape. The electrode shape processed in this step refers to the shape of the driving electrodes 20 and 21 whose portions lying in the adjustment areas 30 have been removed (see FIG. 7).

Next, a balance adjustment step (step ST5) is performed that etches the crystal wafer in a collective manner by using as masks the electrodes processed into the prescribed shape in the electrode processing step. In the example shown in FIG. 7, etching is performed on the crystal exposed in the adjustment areas 30 of the respective driving tines 11 and 12.

Next, a leakage amount measuring step (step ST6) is performed that again measures the amount of leakage vibration by driving each individual crystal oscillator piece on the crystal wafer that has been adjusted in the balance adjustment step.

Next, based on the measurement result obtained from the leakage amount measuring step ST6, it is determined whether the leakage amount is brought within a specified value (step ST7). If the determination is affirmative (the leakage amount is brought within the specified value), the leakage vibration adjustment is terminated because the leakage vibration of the crystal oscillator has been suppressed to a negligible level. On the other hand, if the determination is negative (the leakage amount is greater than the specified value), the process returns to step ST4 (as indicated by solid line F1 in the figure), and the process from step ST4 to step ST7 is repeated until the leakage amount is brought within the specified value.

After the leakage vibration adjustment is completed, each individual crystal oscillator is separated from the crystal wafer and sealed in a sealing member to complete the manufacturing of the crystal oscillator as a product. The steps that follow the leakage vibration adjustment are not directly relevant to the present invention, and therefore will not be described here.

If it is determined that the leakage amount is brought within the specified value for some of the crystal oscillator pieces formed on the same crystal wafer but that the leakage amount is greater than the specified value for the others, then the crystal oscillator pieces whose leakage amount has been brought within the specified value may be separated from the crystal wafer and sent to the next sealing step, and the crystal wafer with the other crystal oscillator pieces remaining thereon may be sent back to step ST4. By so doing, work efficiency can be enhanced because the number of measurements to be made in the leakage amount measuring step ST6 can be reduced.

The above has described an example in which the process from step ST4 to step ST7 is repeated until the leakage amount is brought within the specified value, but instead, provisions may be made to repeat the process from step ST5 to step ST7. In this case, the etching in the balance adjustment step ST5 is performed a plurality of times in small increments.

More specifically, the first etching is performed in the balance adjustment step ST5, and after carrying out the leakage amount measuring step ST6 and the determination step ST7, the process returns to the balance adjustment step ST5 (as indicated by dashed line F2 in the figure), and the second etching is performed. Of course, this loop may be repeated more than two times. By repeating the loop, the leakage amount is finally brought within the specified value. This serves to prevent overetching of the driving tines 11 and 12 in the balance adjustment step ST5.

Next, each process step will be described in further detail.

First, the crystal oscillator external shape forming step (step ST1) will be described in detail with reference to FIG. 9.

FIG. 9 is a cross-sectional view schematically showing cross sections of the vibrating tines of the crystal oscillator pieces formed on the crystal wafer. In FIG. 9, two crystal oscillator pieces, each identical to the crystal oscillator 10 shown in FIG. 7, are shown arranged side by side, as viewed from the distal ends of the driving tines 11 and 12 and detection tine 13, looking toward the base portion 14.

Figure 9A:
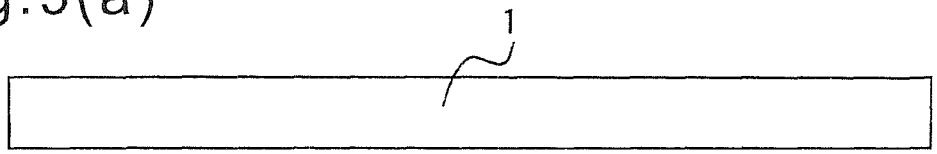
FIGS. 9(*a*) to 9(*e*) are cross-sectional views explaining an external shape forming step according to the first manufacturing method of the present invention.
Figure 9B:
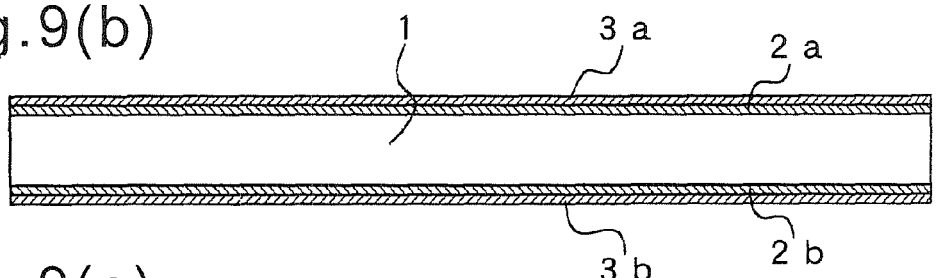

As shown in FIG. 9(b), corrosion resistant metal films 2a and 2b having resistance to crystal etchants and photoresist films 3a and 3b overlying the respective corrosion resistant metal films 2a and 2b are formed on the upper and lower surfaces of the crystal wafer 1 of FIG. 9(a), which is a single planar plate of crystal prepared to a prescribed thickness. In the example of FIG. 9(b), the corrosion resistant metal films 2a and 2b are each shown as a single-layer film for ease of illustration, but each may be formed as a multilayer film of gold (Au) and chromium (Cr), as earlier described. These metal films can be formed using known evaporation or sputtering techniques. The photoresist films 3a and 3b can be formed using known spin-coating techniques.

Figure 9C:
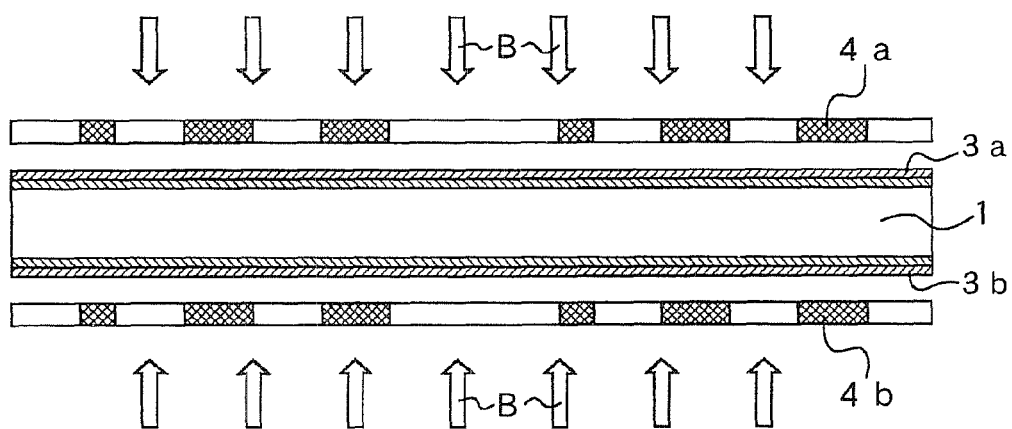

Next, as shown in FIG. 9(c), two photomasks 4a and 4b, on which oscillator patterns are written that, when placed facing each other, perfectly overlay each other except a finite amount of error, are placed over the upper and lower surfaces of the crystal wafer 1, and the photoresist films 3a and 3b are exposed by radiating light (indicated by arrows B) from above the respective photomasks 4a and 4b.

Figure 9D:
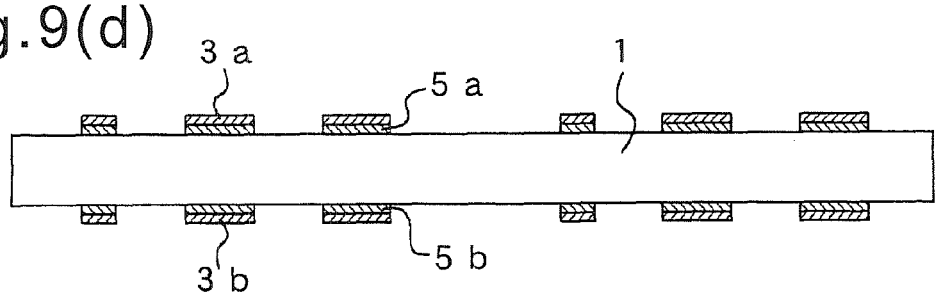
Figure 9E:
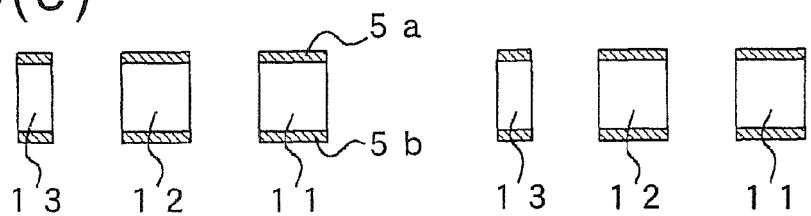

Next, as shown in FIG. 9(d), the photoresist films 3a and 3b are developed, and using the thus developed resist patterns as masks, the corrosion resistant metal films 2a and 2b are patterned, thereby forming etching masks 5a and 5b as etching resistant mask members. When the corrosion resistant metal films 2a and 2b are multilayer films of gold (Au) and chromium (Cr), these two metal layers are separately etched. For example, gold (Au) is etched using a solution prepared by mixing iodine and potassium iodide. After rinsing with water, chromium (Cr) is etched using a solution of cerium(IV) ammonium nitrate.

Next, the remaining photoresist films 3a and 3b are removed, and the crystal wafer 1 with the etching masks 5a and 5b formed on the upper and lower surfaces thereof is immersed in an etching solution of hydrofluoric acid which is a crystal etching solution. Thereupon, the portions of the crystal that are not covered with the etching masks 5a and 5b are dissolved from the upper and lower surfaces, as shown in FIG. 19(e). After that, the etching masks 5a and 5b are removed, thus forming the vibrating tines, i.e., the driving tines 11 and 12 and the detection tines 13 of the crystal oscillator pieces. The crystal etching solution can be prepared, for example, by mixing hydrofluoric acid and ammonium fluoride. In the example of FIG. 9, only the cross sections of the vibrating tines are shown, but actually, the external shape of the entire structure of the crystal oscillator 10 shown in FIG. 7 is formed in this external shape forming step (step ST1).

Figure 10:
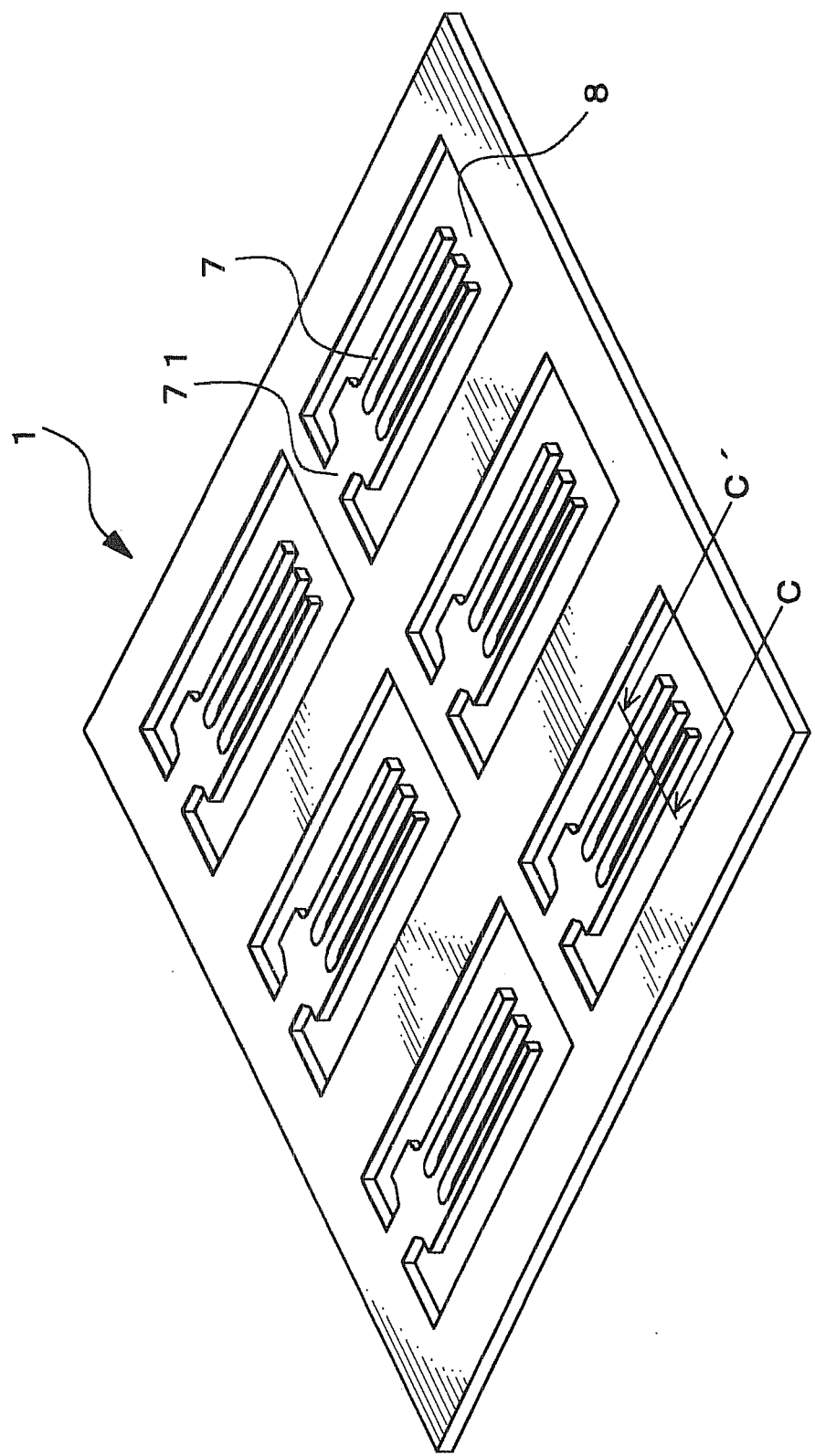
FIG. 10 is a perspective view showing a plurality of crystal oscillator pieces formed on a crystal wafer in the external shape forming step according to the first manufacturing method of the present invention.

FIG. 10 is a schematic perspective view for explaining the plurality of crystal oscillator pieces 7 formed on the crystal wafer 1 in the external shape forming step.

Each crystal oscillator piece 7 is formed as if it were cut out in a dissolved portion 8 dissolved away by etching, and each individual crystal oscillator piece 7 is connected to the crystal wafer 1 by a connecting portion 71. The connecting portion 71 is a so-called cutoff portion which is cut off after the balance adjustment is completed. When the connecting portion 71 is cut off, the crystal oscillator piece 7 is separated from the crystal wafer 1 and completed as the crystal oscillator 10 shown in FIG. 7.

FIG. 10 has shown an example in which six crystal oscillator pieces 7 are formed on the same crystal wafer 1, but the number is not limited to that shown in the example of FIG. 10. The size and shape of each crystal oscillator piece 7 are chosen according to the crystal oscillator performance and characteristics desired to be achieved, and the size of the crystal wafer 1 is determined accordingly. Of course, by increasing the number of crystal oscillator pieces 7 to be formed on the same crystal wafer 1, the manufacturing cost can be reduced correspondingly because a larger number of crystal oscillator pieces can then be manufactured in a collective manner.

Next, the electrode forming step (step ST2) will be described in detail with reference to FIG. 11.

FIG. 11 is a schematic cross-sectional view taken along line C-C' in FIG. 10, and shows the cross sections of the driving tines 11 and 12 and the detection tine 13.

Figure 11A:
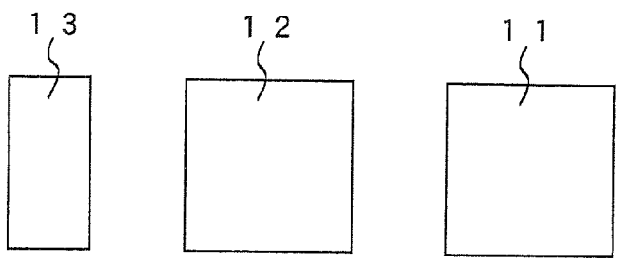
FIGS. 11(*a*) to 11(*d*) are cross-sectional views explaining an electrode forming step according to the first manufacturing method of the present invention.
Figure 11B:
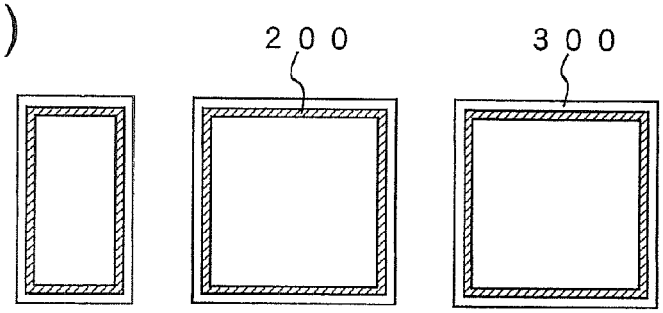

As shown in FIG. 11(b), a metal film 200 and a photoresist film 300 overlying the metal film 200 are formed on the surfaces of the driving tines 11 and 12 and detection tine 13 shown in FIG. 11(a).

In the example of FIG. 11(b), the metal film 200 is shown as a single-layer film for ease of illustration, but it may be formed as a multilayer film by depositing gold (Au) over a base layer of chromium (Cr). The metal film 200 can be formed using known evaporation or sputtering techniques. The photoresist film 300 can be formed using known spray coating or electrodeposition techniques.

Figure 11C:
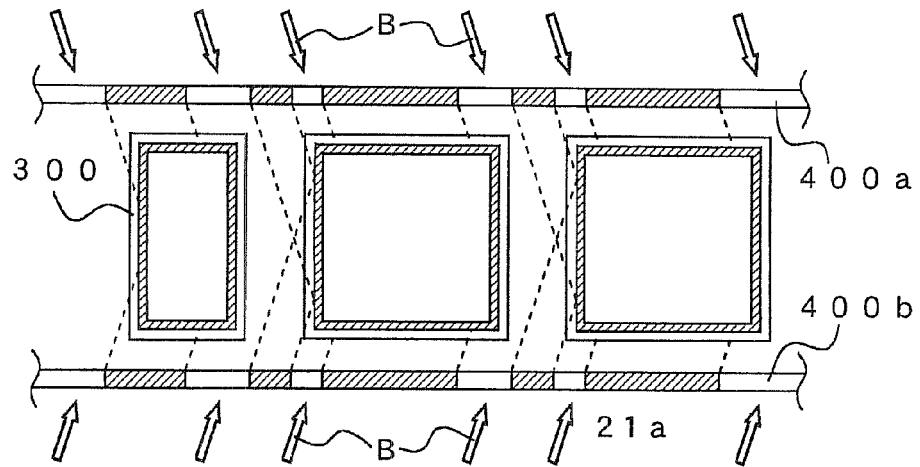

Next, as shown in FIG. 11(c), two photomasks 400a and 400b, on which the patterns of the electrodes to be formed on the driving tines 11 and 12 and detection tine 13 are written, are placed over the upper and lower surfaces of the crystal wafer 1, and the photoresist film 300 is exposed by radiating light (indicated by arrows B) from above the respective photomasks 400a and 400b. FIG. 11(c) shows an example of so-called oblique exposure in which light is directed obliquely.

Figure 11D:
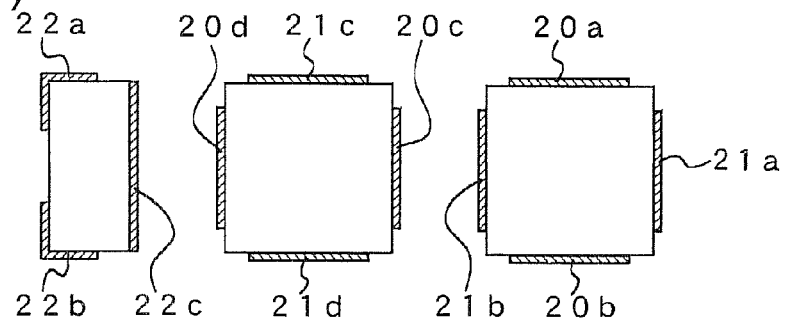

Next, as shown in FIG. 11(d), the photoresist film 300 is developed, and using the thus developed resist pattern as a mask, the metal film 200 is patterned, thereby forming driving electrodes 20a, 20b, 20c, 20d, 21a, 21b, 21c, and 21d, detection electrodes 22a and 22b, and a ground electrode 22c.

Next, a description will be given of an example of how the electrodes are connected.

Figure 12:
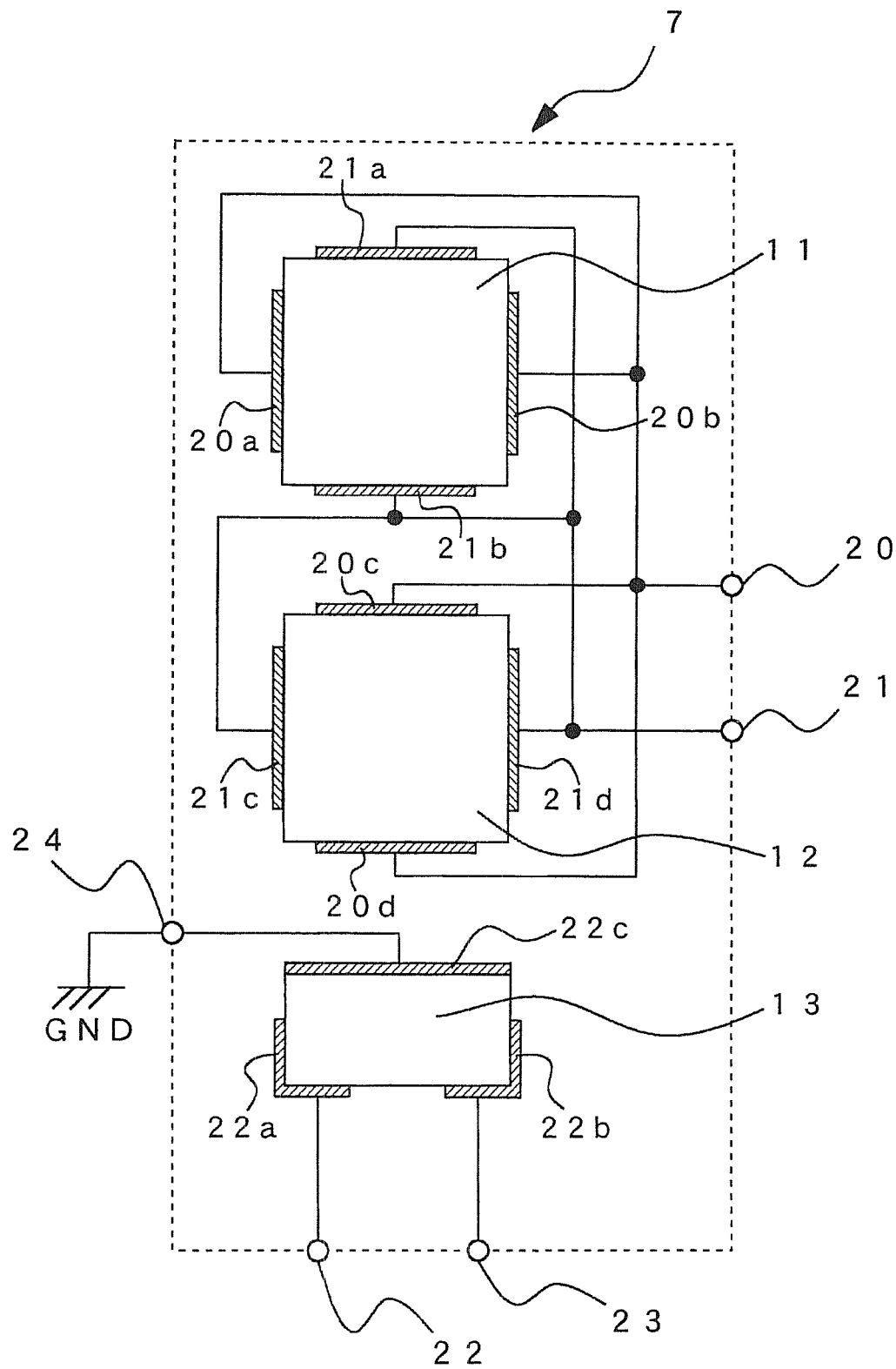
FIG. 12 is an enlarged cross-sectional view showing electrodes formed on the vibrating tines in the electrode forming step according to the first manufacturing method of the present invention.

FIG. 12 is a diagram showing one example of how the electrodes formed in the electrode forming step on the vibrating tines, i.e., the driving tines 11 and 12 and detection tine 13, are connected. The driving electrodes 20a and 20b are formed on the principal faces, i.e., one pair of opposite faces, of the driving tine 11, and the driving electrodes 21c and 21d are formed on the principal faces, i.e., one pair of opposite faces, of the driving tine 12. Similarly, the driving electrodes 21a and 21b are formed on the side faces, i.e., the other pair of opposite faces, of the driving tine 11, and the driving electrodes 20c and 20d are formed on the side faces, i.e., the other pair of opposite faces, of the driving tine 12.

These driving electrodes 20a, 20b, 20c, and 20d are electrically connected together and output via a driving electrode terminal 20. Similarly, the driving electrodes 21a, 21b, 21c, and 21d are electrically connected together and output via a driving electrode terminal 21.

On the other hand, the detection electrodes 22a and 22b as a pair of electrodes are respectively formed along two edges of the detection tine 13, and are output via detection electrode terminals 22 and 23, respectively. The ground electrode 22c formed on the face opposite the detection electrodes 22a and 22b is output via a ground electrode terminal 24 and connected to the ground (0 V) of a circuit not shown. Of course, the electrode structure or electrode connection structure shown in FIG. 12 is not limited to the illustrated example, but can be determined as appropriate according to the specification of the crystal oscillator.

The side faces of the driving tines 11 and 12 and detection tine 13 are not planar due to the formation of residues as earlier described, but in the examples shown in FIGS. 9, 10, 11, and 12 described above, the residues are not shown for ease of illustration.

Next, the leakage amount measuring step (step ST3) will be described with reference to FIG. 13.

Figure 13:
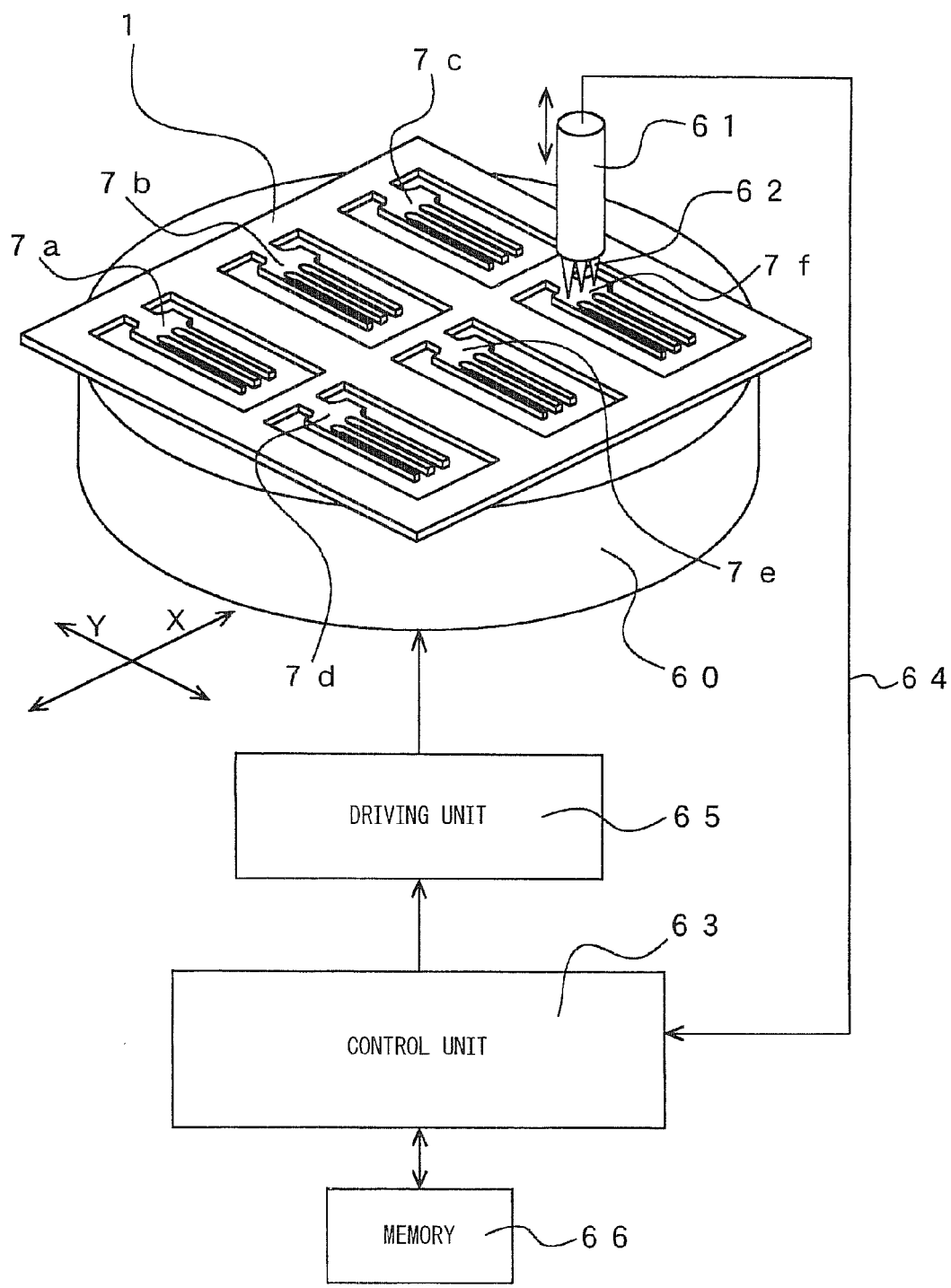
FIG. 13 is an explanatory diagram showing one example of a leakage amount measuring system for implementing a leakage amount measuring step according to the first manufacturing method of the present invention.

FIG. 13 shows one example of a leakage amount measuring system for implementing the leakage amount measuring step. In FIG. 13, 7a to 7f indicate the crystal oscillator pieces.

The crystal wafer 1 on which the crystal oscillator pieces 7a to 7f are formed is rigidly mounted on an XY stage 60. A probe 61 having a plurality of electrode terminals 62 is disposed above the XY stage 60. The electrode terminals 62 of the probe 61 are brought into electrical contact with the driving electrode terminals 20 and 21, detection electrode terminals 22 and 23 (see FIG. 12), and ground terminal 24 formed on each of the crystal oscillator pieces 7a to 7f manufactured on the crystal wafer 1.

A control unit 63 is connected to the probe 61 via a connecting cable 64, and controls the leakage amount measurement. A driving unit 65 drives the XY stage 60 in accordance with a control signal from the control unit 63, and thus moves the crystal wafer 1 in the X or Y direction so that the probe 61 can contact the electrodes of any one of the crystal oscillator pieces. Further, under the control of the control unit 63, leakage amount information of each individual crystal oscillator piece 7 manufactured on the crystal wafer 1 is stored in a memory 66 connected to the control unit 63, along with the position information of the crystal oscillator piece.

Next, the operation of the leakage amount measuring system will be described. In FIG. 13, the control unit 63 sends a control signal to the driving unit 65 to drive the XY stage 60 and move the crystal wafer 1 so that the electrodes of a designated one of the crystal oscillator pieces 7a to 7f are positioned directly below the probe 61. In the example shown in FIG. 13, the crystal oscillator piece 7f is positioned directly below the probe 61.

Then, the probe 61 is moved down by an up-and-down moving means not shown, and the electrode terminals 62 are brought into contact with the electrodes of the crystal oscillator piece 7f.

Next, the control unit 63 sends to the probe 61, via the connecting cable 64, a driving signal for causing the crystal oscillator piece 7f to oscillate and, with the driving signal supplied to the driving electrode terminals 20 and 21 of the crystal oscillator piece 7f, the crystal oscillator piece 7f starts to oscillate.

Next, the control unit 63 receives a detection signal from the detection electrode terminals 22 and 23 of the crystal oscillator piece 7f via the probe 61, detects a leakage signal component from the detection signal, and stores the detected leakage amount in the memory 66 along with the positional relationship information of the crystal oscillator piece 7f. That is, the measurement result of the leakage amount measuring step includes the leakage amount of the crystal oscillator piece measured and the positional relationship information of that crystal oscillator piece. The positional relationship information of the crystal oscillator piece is the position information measured as the X-axis position and Y-axis position from the predetermined origin of the XY stage 60. As a matter of course, the leakage amount measurement here is performed without applying angular velocity.

When the leakage amount measurement of one crystal oscillator piece is completed, the control unit 63 sends a control signal to the driving unit 65 to drive the XY stage 60 and move the crystal wafer 1 so that the electrodes of an adjacent one of the crystal oscillator pieces are positioned directly below the probe 61. For example, when the measurement of the crystal oscillator piece 7f is completed, the XY stage 60 is driven so that the crystal oscillator piece 7e adjacent to it is positioned directly below the probe 61.

Thereafter, the crystal oscillator pieces formed on the crystal wafer 1 are sequentially driven, and the leakage amount is measured; then, the leakage amount and the positional relationship information of each individual one of the crystal oscillator pieces 7a to 7f are stored in the memory 66. In this case, the leakage amount information for the six crystal oscillator pieces and the corresponding positional relationship information of the six crystal oscillator pieces are stored in the memory 66.

The leakage amount need not necessarily be measured on all the crystal oscillator pieces manufactured on the crystal wafer 1. For example, only the crystal oscillator piece 7a may be measured, and the leakage amount of each of the other crystal oscillator pieces 7b to 7f may be assumed to be the same as the measured leakage amount. Such assumption can be made based on the previously measured crystal wafer information or other crystal wafer information, such as the film thickness of the crystal wafer 1 and the etching conditions used in the external shape forming step (step ST1). In this case, the leakage amount information for one crystal oscillator piece and the positional relationship information of each of the six crystal oscillator pieces are stored in the memory 66.

Alternatively, the crystal oscillator pieces formed on the crystal wafer 1 may be clustered into groups, and the leakage measurement may be made for each group. For example, the crystal oscillator pieces 7a, 7b, and 7c located adjacent to one another are measured, and if the leakage amount measured is the same for all the crystal oscillator pieces 7a, 7b, and 7c, then it may be assumed that the leakage amount is also the same for the other crystal oscillator pieces 7d, 7e, and 7f; in this case, when the measurement of the crystal oscillator piece 7d is completed, the leakage amount of each of the oscillator pieces 7e and 7f may be assumed to be the same as the measured one. That is, the crystal oscillator pieces are clustered into two groups, one consisting of the crystal oscillator pieces 7a, 7b, and 7c and the other the crystal oscillator pieces 7d, 7e, and 7f. As in the earlier described example, such assumption and grouping can be made by analyzing the tendencies using the previously measured crystal wafer information or other crystal wafer information. In this case, information concerning the grouping of the crystal oscillator pieces and the leakage amount information and positional relationship information of the crystal oscillator pieces in each group are stored in the memory 66.

Further alternatively, the so-called sampling measurement may be made by selecting some of the crystal oscillator pieces formed on the crystal wafer 1. For example, the measurement may be made by randomly selecting one or a predetermined number of crystal oscillator pieces from among the crystal oscillator pieces formed on the crystal wafer 1, and their average value may be stored as a value representing the leakage amount of the crystal wafer 1. In this case, the leakage amount information for the selected number of crystal oscillator pieces and the positional relationship information of the six crystal oscillator pieces are stored in the memory 66.

Next, the electrode processing step (step ST4) will be described.

The electrode processing step is performed using an electrode processing system that removes a portion of each electrode by radiating laser light based on the leakage amount information and positional relationship information acquired in the above leakage amount measuring step for each individual one of the crystal oscillator pieces formed on the crystal wafer 1.

The electrode processing system as an example is basically the same as the leakage amount measuring system shown in FIG. 13, except that the probe 61 is replaced by a laser irradiator; therefore, the following description is given by referring to FIG. 13. In the electrode processing system, the control unit 63 controls the driving unit 65 to drive the XY stage 60, and the electrodes formed on the driving tines of each crystal oscillator piece 7 on the XY stage 60 are processed by the laser light from the laser irradiator (not shown). For example, a YAG laser may be used here.

Figure 14:
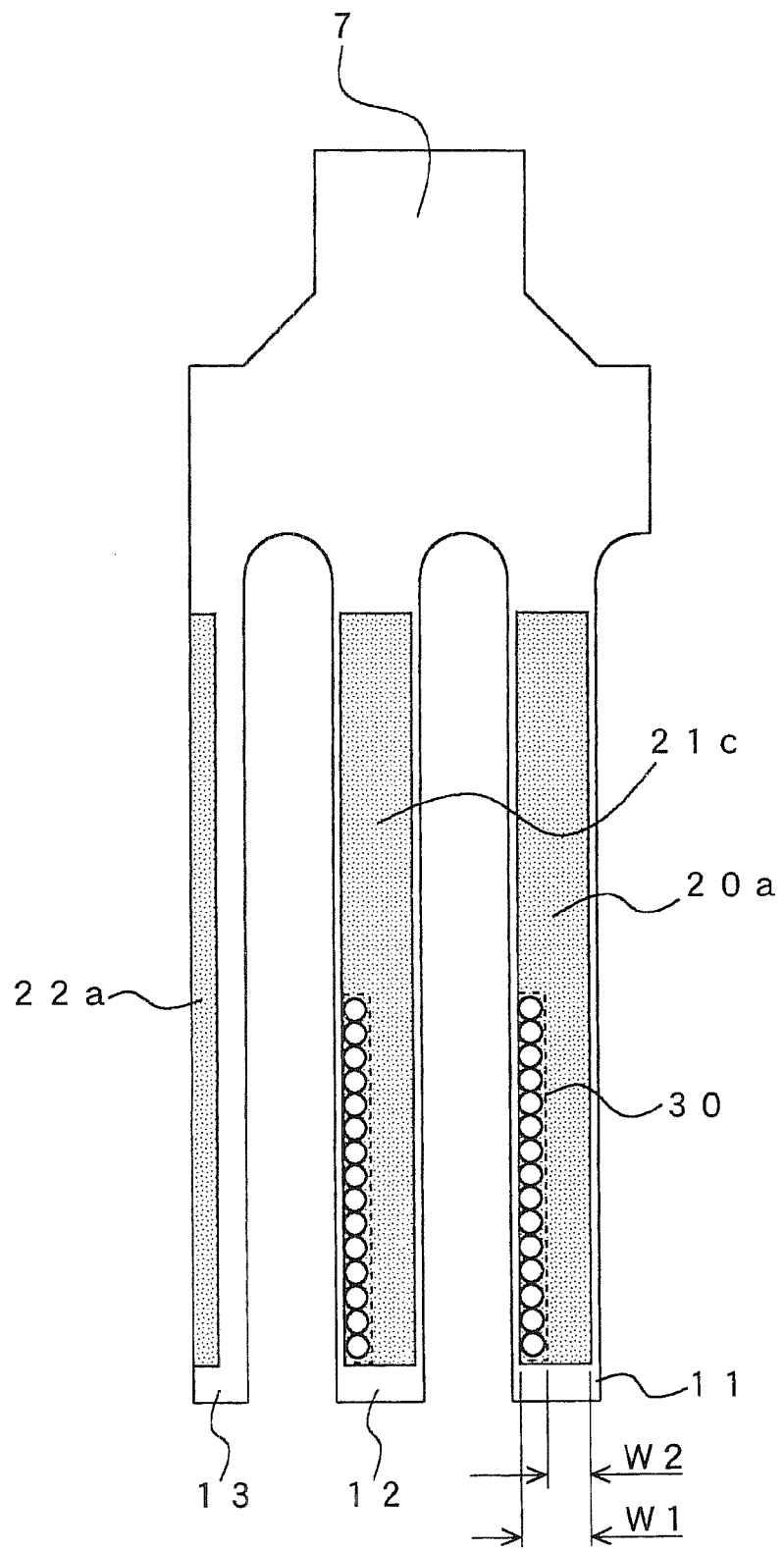
FIG. 14 is a top plan view showing one example of a crystal oscillator piece whose driving electrodes have been partially removed by irradiation with laser light in an electrode processing step according to the first manufacturing method of the present invention.

FIG. 14 is a top plan view of the crystal oscillator piece 7, showing one of the crystal oscillator pieces 7a to 7f depicted in FIG. 13. The crystal oscillator pieces will hereinafter be collectively referred to as the crystal oscillator piece 7. The figure shows one example in which designated portions of the driving electrodes are removed by irradiation with the laser light from the laser irradiator. In the example of FIG. 14, the laser light is applied in the form of circular spots.

The edge portions toward the distal ends of the driving electrodes 20a and 21c formed on the principal faces of the respective driving tines 11 and 12 are continuously irradiated with the spot-like laser light, thus continuously removing the longitudinally extending widthwise edge portions of the respective electrodes. In the thus removed portions of the electrodes, the crystal surface of the crystal oscillator piece 7 is exposed, forming substantially rectangular adjustment areas 30 (areas enclosed by dashed lines in FIG. 14). As shown, with the formation of the adjustment areas 30, the electrode width W2 in these portions becomes smaller than the electrode width W1 in the other portions where the adjustment areas 30 are not formed.

Then, in the adjustment areas 30 where the crystal surface is exposed, the surface is dissolved by re-etching in the subsequent balance adjustment step, and the cross-sectional shapes of the respective driving tines 11 and 12 are adjusted so as to suppress the generation of leakage vibration.

In the example of FIG. 14, the electrode portion (adjustment area 30) to be removed by irradiation with the laser light is provided in the left edge portion of each electrode as viewed from above the plane of the figure, but this is only one example. It will be noted, however, that the electrode portion to be removed by irradiation with the laser light must be displaced across the width of the driving tine 11, 12. For example, the substantially widthwise center of the electrode portion to be removed by irradiation with the laser light, as viewed from above the plane of the figure, is displaced from the substantially widthwise center of the driving tine 11, 12 in the widthwise direction of the driving tine. Further, if the shape of the electrode portion to be removed by irradiation with the laser light is rectangular when viewed from above the plane of the figure, then the portion may be provided so as to be located between the widthwise edge and the substantially widthwise center of the driving tine 11, 12, as shown in the example of FIG. 14.

That is, since the balance is adjusted by etching the crystal in the balance adjustment step ST5 using the electrodes processed in the electrode processing step as masks, the adjustment areas 30 must be provided in such portions that the balance of the crystal oscillator can be changed by etching the driving tines 11 and 12.

FIG. 15 is a diagram explaining how the adjustment areas 30 are formed in the electrode processing step.

The region near the base portion 14 of the crystal oscillator piece 7 is defined as a first region, and the region extending away from the first region toward the distal end of the vibrating tine is defined as a second region. When the adjustment area 30 is formed in the first region, the influence it exerts on the vibration of the driving tine 11, 12 is large since the region is near the base portion 14. On the other hand, when the adjustment area 30 is formed in the second region, the influence it exerts on the vibration of the driving tine 11, 12 is relatively small since the region is near the distal end of the driving tine 11, 12. In FIG. 15, the adjustment area 30 is shown as being rectangular in shape for simplicity, but when the laser light is continuously applied to the electrode in the form of circular spots, as shown in the example of FIG. 14, the area is formed from continuously removed circular portions.

Figure 15A:
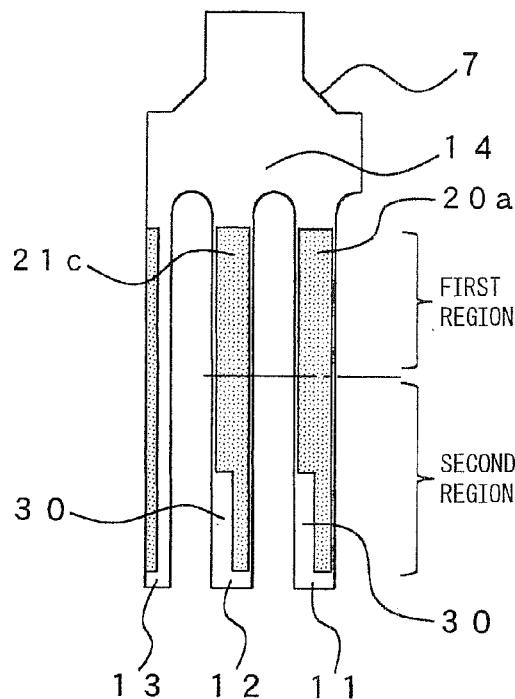
FIGS. 15(*a*) to 15(*d*) are explanatory diagrams showing one example of how the electrodes are processed in accordance with leakage amount in the electrode processing step according to the first manufacturing method of the present invention.

FIG. 15(a) shows the adjustment areas 30 formed when the leakage amount of the crystal oscillator piece 7 is small. That is, when the leakage amount of the crystal oscillator piece 7 is small, since the crystal oscillator piece 7 need to be adjusted only slightly, each adjustment area 30 is formed only in a portion of the second region on the principal face of the driving tine 11, 12, as shown, and the width of the driving electrode 20a, 21c is reduced in this portion. By thus forming each adjustment area 30 in the second region where its influence is relatively small, fine electrode processing can be performed to correct for a small amount of leakage, achieving highly precise adjustment of the leakage amount.

Figure 15B:
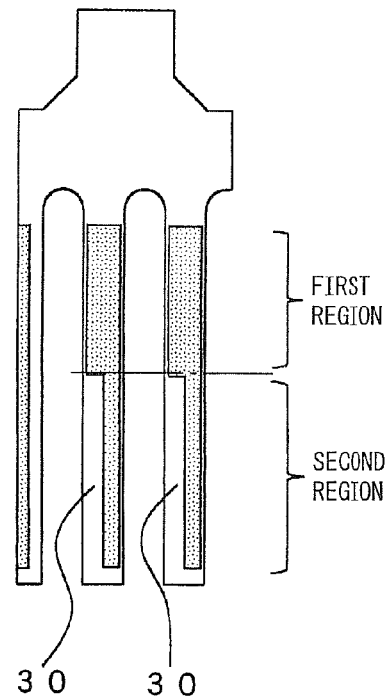

FIG. 15(b) shows the adjustment areas 30 formed when the leakage amount of the crystal oscillator piece 7 is moderate. In this case, since the crystal oscillator piece 7 needs to be adjusted by a moderate amount, each adjustment area 30 is formed substantially along the entire length of the second region on the principal face of the driving tine 11, 12, as shown, and the width of the driving electrode 20a, 21c is reduced in this portion. By thus adjusting a moderate amount of leakage, the leakage vibration can be suppressed.

Figure 15C:
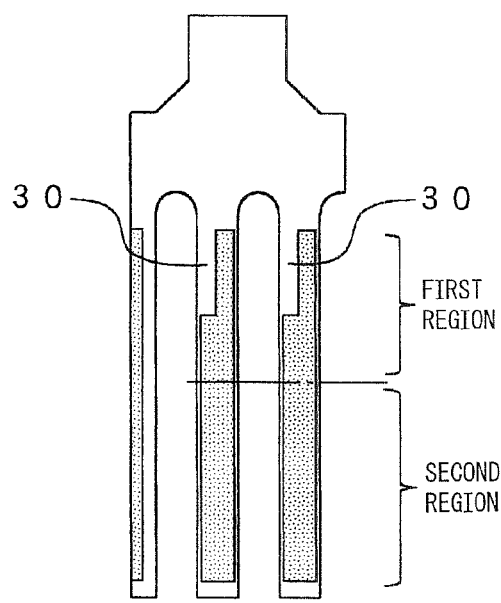

FIG. 15(c) shows the adjustment areas 30 formed when the leakage amount of the crystal oscillator piece 7 is relatively large. In this case, since the crystal oscillator piece 7 needs to be adjusted by a relatively large amount, each adjustment area 30 is formed only in a portion of the first region on the principal face of the driving tine 11, 12, as shown, and the width of the driving electrode 20a, 21c is reduced in this portion. By thus adjusting a relatively large amount of leakage, the leakage vibration can be suppressed.

Figure 15D:
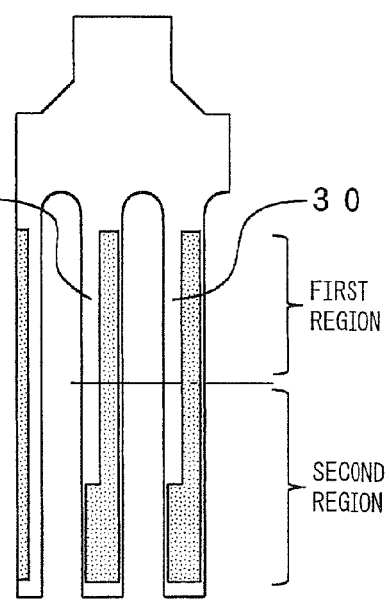

FIG. 15(d) shows the adjustment areas 30 formed when the leakage amount of the crystal oscillator piece 7 is substantially large. In this case, since the crystal oscillator piece 7 needs to be adjusted by a substantially large amount, each adjustment area 30 is formed in a portion extending between the first and second regions on the principal face of the driving tine 11, 12, as shown, and the width of the driving electrode 20a, 21c is reduced in this portion. By thus adjusting a substantially large amount of leakage, the leakage vibration can be suppressed.

In this way, in the electrode processing step, the regions for forming the adjustment areas 30 and the amount of processing are determined based on the leakage amount information and positional relationship information acquired for each crystal oscillator piece 7 in the leakage amount measuring step, and the electrodes formed on the driving tines 11 and 12 are processed by applying laser light.

In FIG. 15, the adjustment areas 30 are each shown as being formed in the region displaced nearer to the detection tine 13, but the adjustment areas of the driving electrodes 20b and 21d on the lower surface of the crystal oscillator piece 7 (see FIG. 12) are each formed in the region displaced away from the detection tine 13. The displacing direction of the adjustment areas 30 is determined according to the tilt direction of the principal axis, the details of which will be described later. Further, in the example of FIG. 15, adjustment area 30 has been shown as being formed along an edge portion of the driving tine in such a manner as to straddle between the principal face and side face of the crystal oscillator piece 7, the adjustment areas 30 may be formed only on the principal face(s).

When processing the lower surface of the crystal wafer 1 by laser light, the crystal wafer 1 is turned over on the XY stage 60 of the electrode processing system, or the XY stage 60 is constructed to be transparent to the laser light and the laser light is applied to the crystal wafer 1 from below the XY stage 60.

Next, the balance adjustment step (step ST5) will be described with reference to FIG. 16.

In the balance adjustment step, after the driving electrodes formed on the driving tines 11 and 12 have been processed into the prescribed shape in the electrode processing step, the crystal wafer 1 is re-etched in a collective manner by using the thus processed driving electrodes as masks, and the cross-sectional shapes of the driving tines 11 and 12 of the crystal oscillator piece 7 are corrected to adjust the balance of the vibration, thereby adjusting the leakage amount and suppressing the leakage vibration of the crystal oscillator piece 7.

Figure 16:
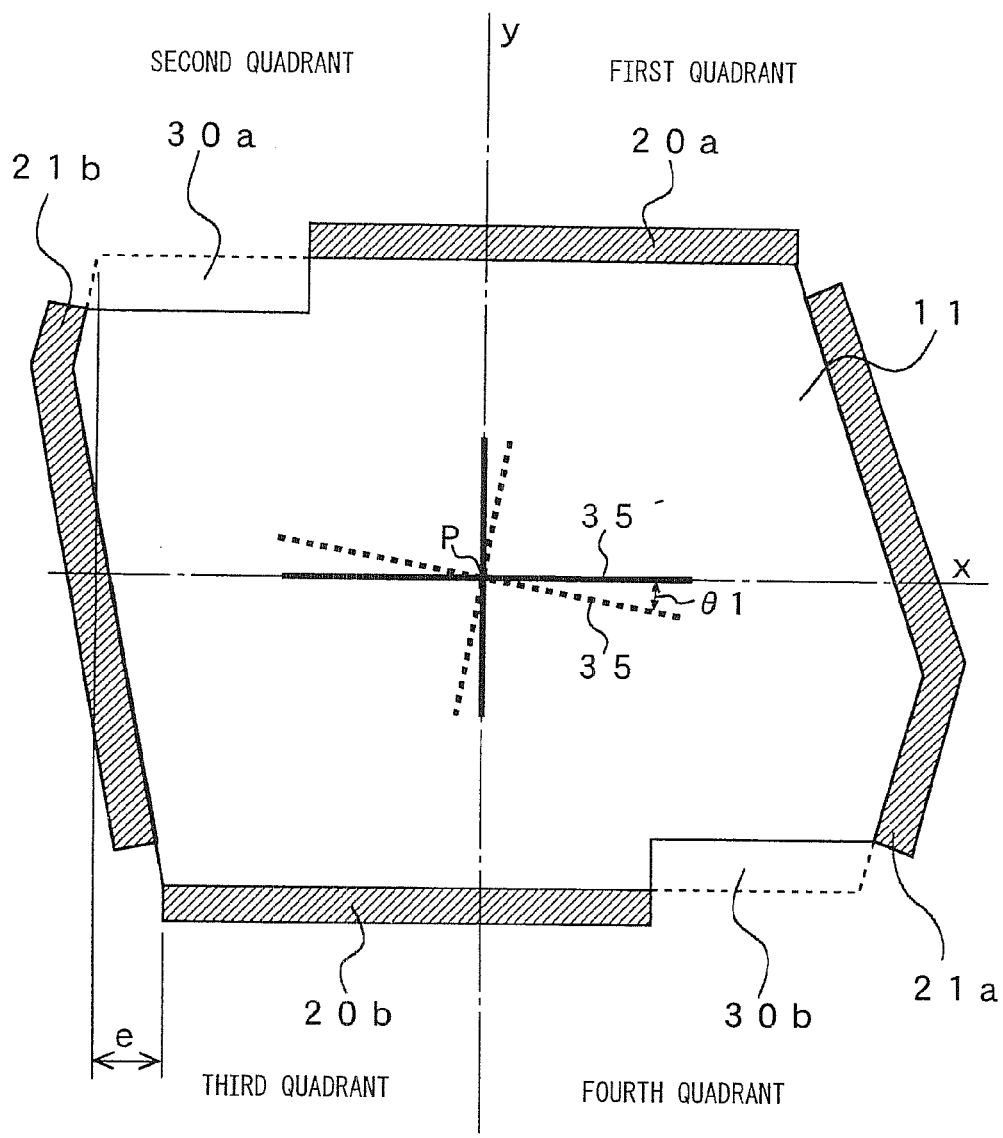
FIG. 16 is an enlarged cross-sectional view explaining how the second and fourth quadrants of the driving tine of the crystal oscillator piece are etched off in a balance adjustment step according to the first manufacturing method of the present invention.

FIG. 16 is a diagram showing one example of the cross section of the driving tine 11 of the crystal oscillator piece 7 formed on the crystal wafer 1, as viewed from the same direction as in FIG. 12.

Figure 4:
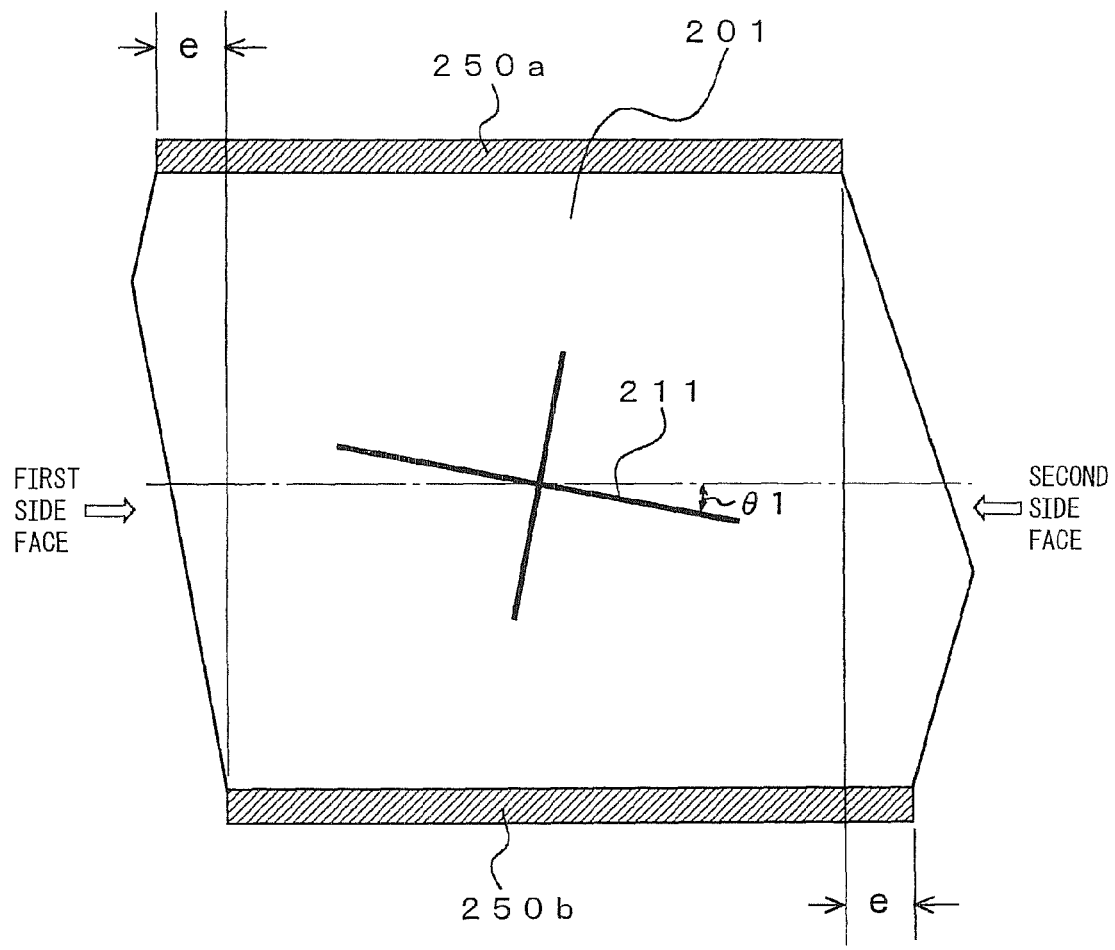
FIG. 4 is an enlarged cross-sectional view showing one example of the vibrating tine of the prior art crystal oscillator.

Suppose here that residue is formed on the vibrating tine of the crystal oscillator piece 7 formed by etching the crystal wafer 1, and that the lower and upper etching masks for cutting the crystal oscillator piece 7 out of the crystal wafer 1 are displaced relative to each other by an amount "e" (the lower mask is displaced to the right in the figure); then, the cross-sectional shape of the driving tine 11 becomes top-bottom asymmetrical as shown, and the principal axis 35 (indicated by dashed line) of the driving tine 11 is not parallel to the X axis, but is displaced by an angle θ1. (Such a cross-sectional shape of the driving tine is similar to the cross-sectional shape of the driving tine 201 of the crystal oscillator in the prior art example previously described with reference to FIG. 4.) As a result, oblique vibration occurs in the driving tine 11, resulting in the generation of leakage vibration.

In the earlier described leakage amount measuring step, the leakage amount is measured by detecting the leakage vibration, and in the electrode processing step, the adjustment areas 30a and 30b are formed by processing designated portions of the driving electrodes 20a and 20b formed on the upper and lower principal faces of the driving tine 11. In the balance adjustment step, the crystal wafer 1 is again immersed in an etching solution for collective re-etching, as a result of which the upper and lower surface portions of the crystal oscillator piece 7 exposed in the adjustment areas 30a and 30b are etched off (the portions indicated by dashed lines in FIG. 16), and the thickness of the driving tine 11 in the corresponding portions is slightly reduced. By etching off the crystal in the adjustment areas 30a and 30b, the top-bottom asymmetrical cross-sectional shape is corrected, and the principal axis 35 is corrected as indicated by the principal axis 35' (solid line) to suppress the generation of leakage vibration.

The adjustment area 30a of the driving electrode 20a formed on the upper principal face of the driving tine 11 is formed displaced leftward of the driving electrode 20a in the figure, and the adjustment area 30b of the driving electrode 20b formed on the lower principal face of the driving tine 11 is formed displaced rightward of the driving electrode 20b in the figure.

The reason that the adjustment areas 30a and 30b are formed on the upper and lower principal faces of the driving tine 11 is to utilize the property of the crystal that the crystal oscillator piece 7 is etched at a specifically faster rate along the Z' direction. Because of this property, in the adjustment areas 30a and 30b formed on the respective principal faces, etching proceeds quickly in the Z' direction, and the cross-sectional shape is thus corrected by the re-etching in the balance adjustment step.

FIG. 16 has shown an example in which the adjustment areas 30a and 30b are each formed along an edge portion of the driving tine 11 in such a manner as to straddle between the principal face and side face of the driving tine, but it will be appreciated that the adjustment areas 30a and 30b may be formed only on the respective principal faces.

To summarize the positional relationship between the etch-off portions of the adjustment areas, when the center of the vibrating axis of the driving tine 11 in FIG. 16 is taken as the origin P, and the first to fourth quadrants are defined by two mutually perpendicular axes x and y passing through the origin P, the adjustment areas 30a and 30b are processed and formed so that the etch-off portions are located in a pair of quadrants diametrically opposed across the origin P. In this arrangement, the adjustment areas 30a and 30b are processed so that the amount of etching becomes the same between any two quadrants diametrically opposed across the origin P but differs between any two adjacent quadrants.

In the example of FIG. 16, the adjustment areas 30a and 30b are formed in the second and fourth quadrants, because the upper mask is formed by being displaced leftward relative to the lower mask; i.e., the tilting of the principal axis 35 can be corrected by forming the adjustment areas 30a and 30b in the second and fourth quadrants so as to cancel out the crystal portions formed in a displaced manner.

Figure 17:
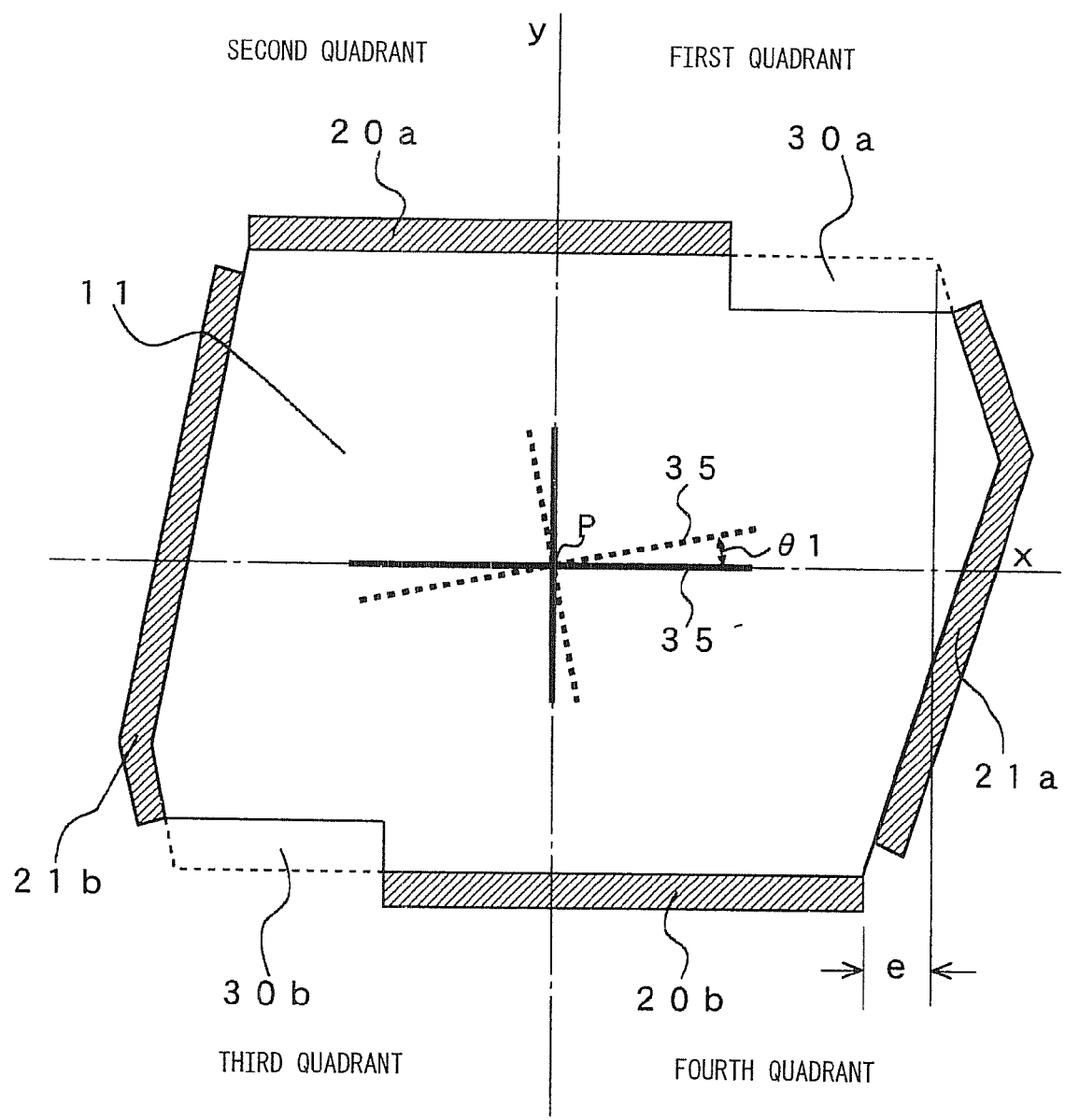
FIG. 17 is an enlarged cross-sectional view explaining how the first and third quadrants of the driving tine of the crystal oscillator piece are etched off in the balance adjustment step according to the first manufacturing method of the present invention.

FIG. 17 is a cross-sectional view showing the driving tine 11 of the crystal oscillator piece 7 for the case where the etching mask is displaced in the opposite direction to that shown in FIG. 16, i.e., the lower mask is displaced leftward in the figure by an amount "e".

In this case, the adjustment areas 30a and 30b should be formed in the first and third quadrants so as to cancel out the crystal portions formed in a displaced manner, as shown. That is, by etching off the crystal in the adjustment areas 30a and 30b formed in the first and third quadrants, the top-bottom asymmetrical cross-sectional shape is corrected, though the cross-sectional shape is still top-bottom asymmetrical, and the principal axis 35 is corrected as indicated by the principal axis 35' (solid line) to suppress the generation of leakage vibration.

In the examples so far described, the leakage vibration has been adjusted by changing the region and size of the adjustment areas according to the magnitude of the leakage amount, but the adjustment method is not limited to this particular method; for example, the region and size of the adjustment areas may be fixed, and the amount of etching of the vibrating tine may be determined by converting the amount of etching to an equivalent processing time according to the magnitude of the leakage amount.

Figure 18:
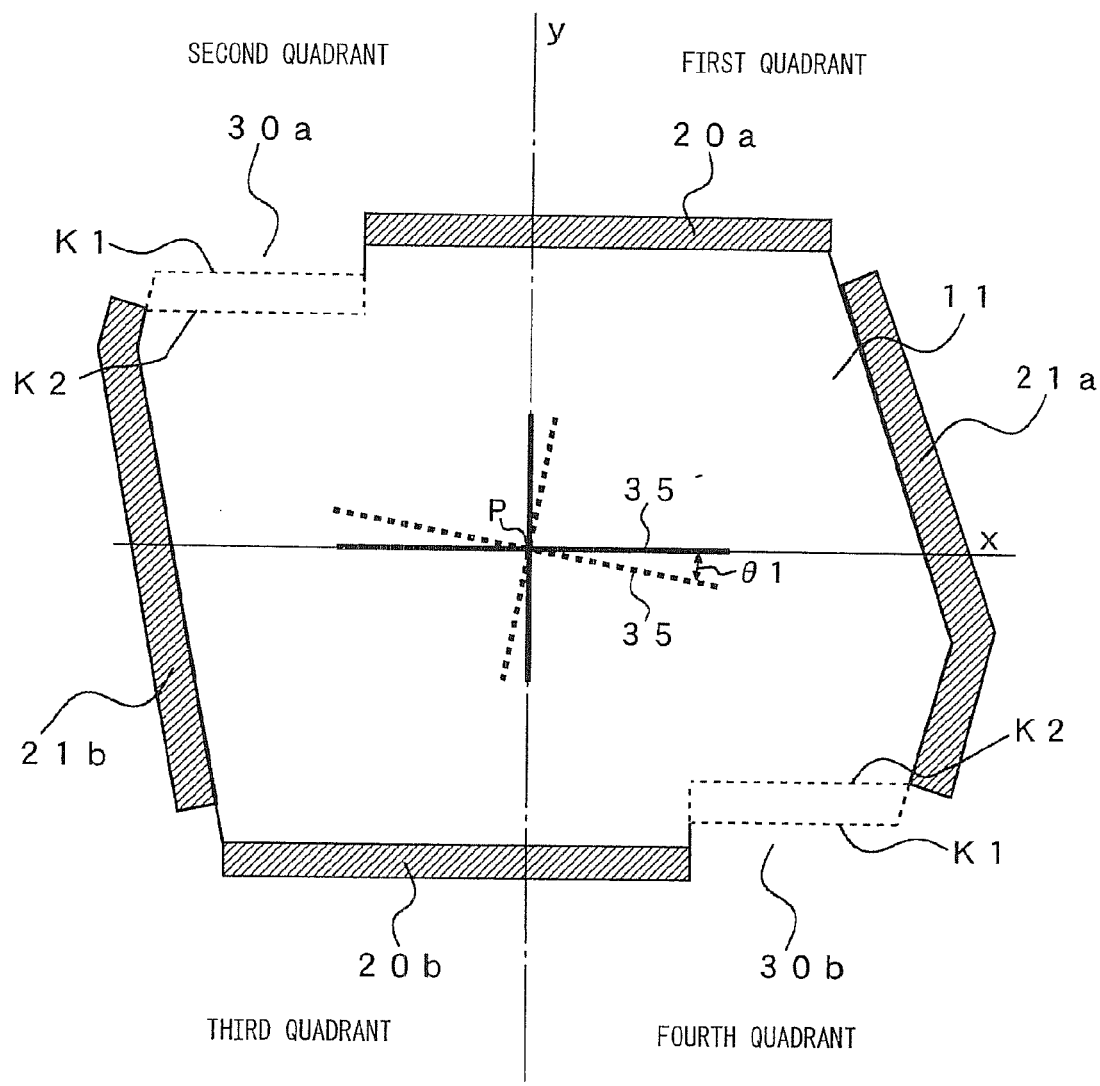
FIG. 18 is an enlarged cross-sectional view explaining an adjustment method which performs an adjustment by converting the amount of etching to an equivalent processing time in the balance adjustment step according to the first manufacturing method of the present invention.

FIG. 18 is a diagram explaining one example of an adjustment method that performs the adjustment by converting the amount of etching to an equivalent processing time.

In FIG. 18, etching depths K1 and K2 indicated by dashed lines in the adjustment areas 30a and 30b show how the depth of the adjustment areas 30a and 30b can be changed by changing the etch processing time. The etching depth K1 shows the depth when the re-etch processing time is short, and the etching depth K2 shows the depth when the re-etch processing time is long.

That is, if the measurement result of the leakage amount measuring step shows that the leakage amount is small, the re-etch processing time is set short so that the adjustment areas are etched to the depth K1, and if the leakage amount is large, the re-etch processing time is set long so that the adjustment areas are etched to the depth K2. In this way, the amount of etching can be adjusted according to the leakage amount, and the tilting of the principal axis 35 can be corrected as indicated by the principal axis 35' (solid line) to suppress the generation of leakage vibration. The leakage vibration may be adjusted based on the leakage amount by combining the method that changes the area and size of the adjustment areas with the method that converts the amount of etching into the processing time.

Next, a description will be given for the case where the first manufacturing method described above is applied to a crystal oscillator piece having grooved driving tines.

FIG. 19 is a cross-sectional view showing another example of the driving tine 11 of the crystal oscillator piece 7 formed on the crystal wafer 1, in which a plurality of grooves 15 are formed in the upper and lower principal faces of the driving tine 11 along the longitudinal direction of the crystal oscillator piece 7.

Crystal oscillator pieces having such grooves 15 are known in the art, but by forming the grooves 15 in such a manner that an electrode 15a formed inside each groove 15 faces a portion of the driving electrode 21a or 21b formed on a side face, the electric field applied to the crystal oscillator increases, which serves to increase the driving capability of the crystal oscillator. In the example of FIG. 19, more than one groove 15 is provided, but only one groove may be provided.

Figure 19A:
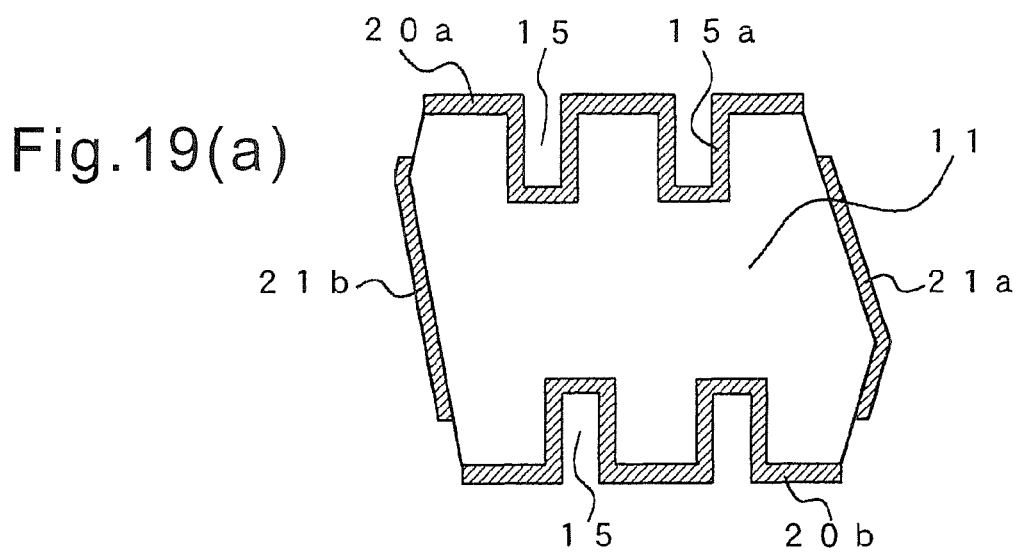
FIGS. 19(*a*) to 19(*c*) are cross-sectional views explaining one example of how a leakage adjustment is applied to a grooved crystal oscillator manufactured according to the first manufacturing method of the present invention.
Figure 19B:
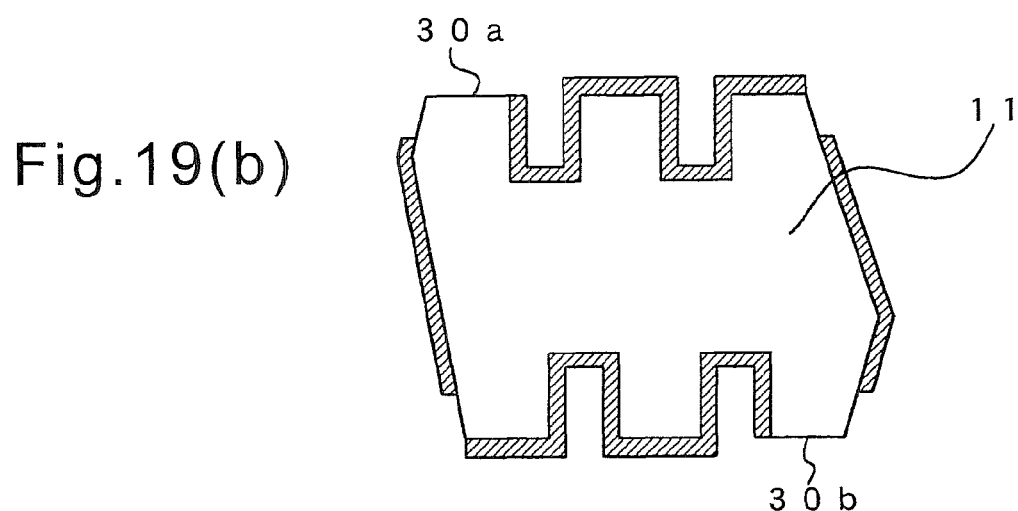

First, as shown in FIG. 19(b), designated portions of the driving electrodes 20a and 20b are removed by processing in the electrode processing step, thus forming the adjustment areas 30a and 30b on the upper and lower principal faces of the driving tine 11 having the grooves 15 shown in FIG. 19(a).

Figure 19C:
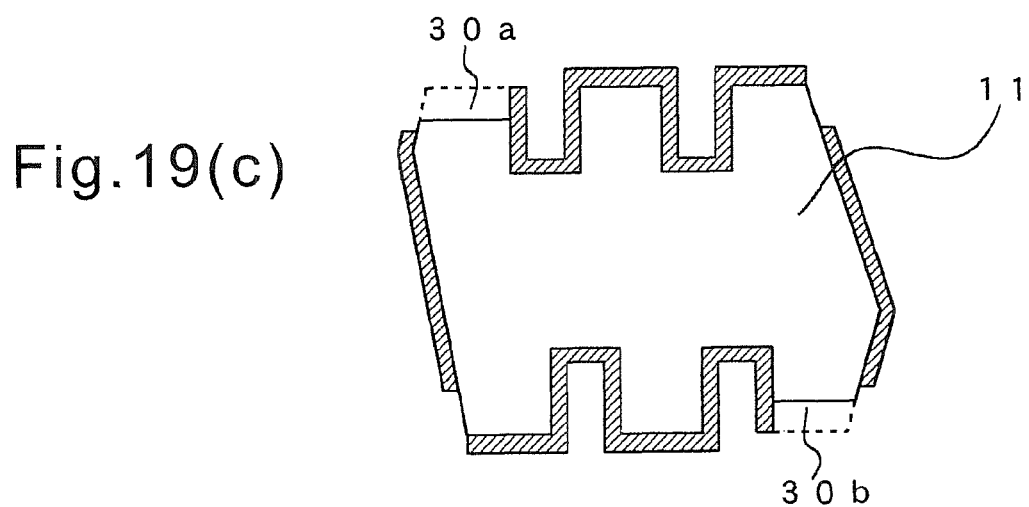

Next, as shown in FIG. 19(c), in the balance adjustment step, the crystal wafer 1 is again immersed in an etching solution for collective re-etching, to etch off the upper and lower surface portions of the driving tine 11 exposed in the adjustment areas 30a and 30b (the portions indicated by dashed lines), thus slightly reducing the thickness of the driving tine 11 in the corresponding portions. By etching off the crystal in the adjustment areas 30a and 30b, the top-bottom asymmetrical cross-sectional shape is corrected, and the leakage vibration is suppressed.

It is preferable that the adjustment areas 30a and 30b are each formed in a region extending from the groove 15 to the edge (corner) of the driving tine 11 as shown, but if the width dimension is limited, the adjustments areas may each be formed by also using a portion extending toward the center. Further, the positions of the adjustment areas 30a and 30b are determined in accordance with the tilting of the principal axis, as shown in FIGS. 16 and 17, in such a manner as to cancel out the crystal portions formed in a displaced manner.

FIG. 20 is a diagram showing an example in which the adjustment areas are formed in other portions of the driving tine 11 formed with the plurality of grooves 15.

Figure 20A:
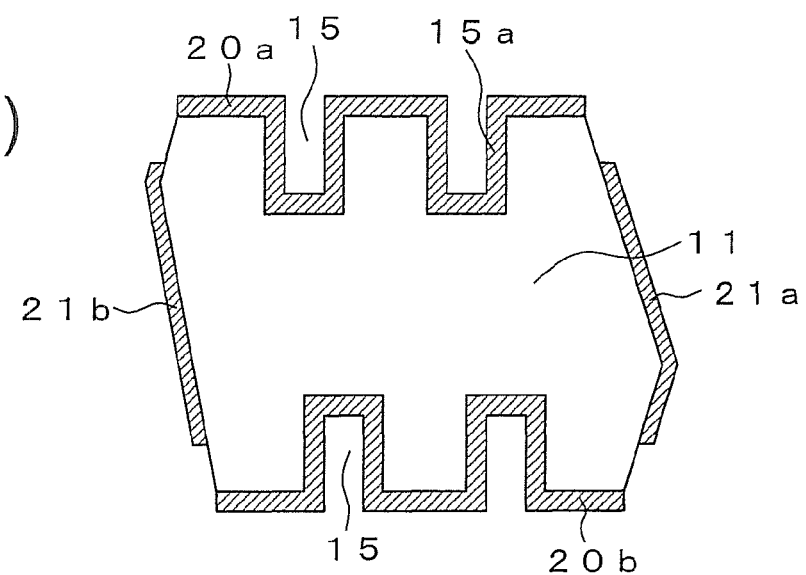
FIGS. 20(*a*) to 20(*c*) are cross-sectional views explaining another example of how a leakage adjustment is applied to the grooved crystal oscillator.
Figure 20B:
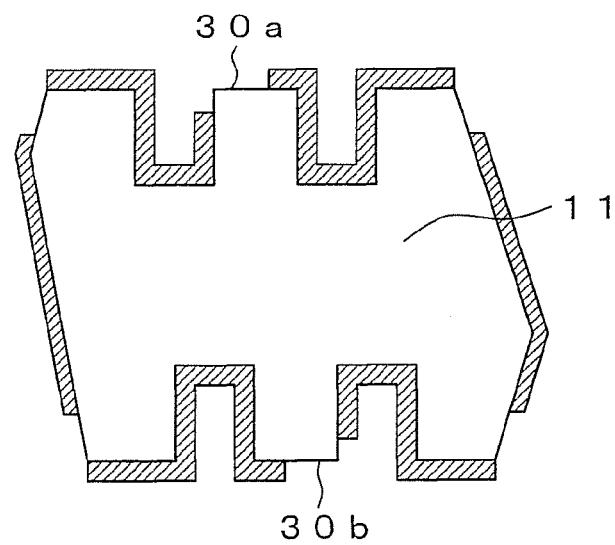

First, as shown in FIG. 20(b), designated portions of the driving electrodes 20a and 20b formed inside the grooves 15 are removed by processing in the electrode processing step, thus forming the adjustment areas 30a and 30b on the upper and lower principal faces of the driving tine 11 having the grooves 15 shown in FIG. 20(a).

Figure 20C:
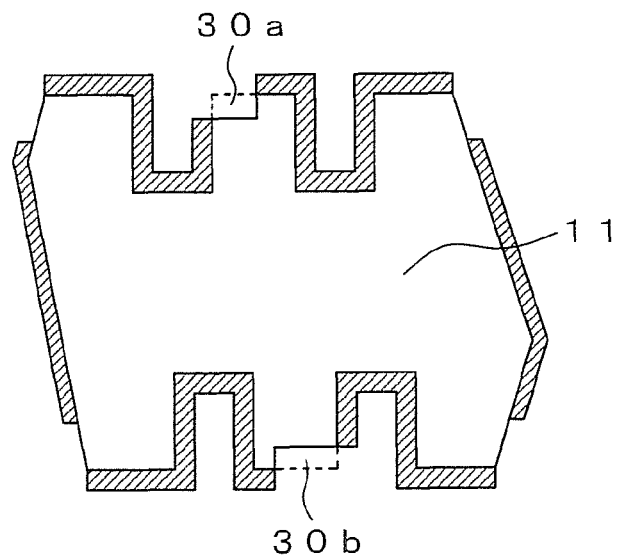

Next, as shown in FIG. 20(c), in the balance adjustment step, the crystal wafer 1 is again immersed in an etching solution for collective re-etching, to etch off the upper and lower surface portions of the driving tine 11 exposed in the adjustment areas 30a and 30b (the portions indicated by dashed lines), thus slightly reducing the thickness of the driving tine 11 in the corresponding portions. By etching off the crystal in the adjustment areas 30a and 30b, the top-bottom asymmetrical cross-sectional shape is corrected, and the leakage vibration is suppressed.

The adjustment areas 30a and 30b formed by removing the designated portions of the driving electrodes 20a and 20b formed inside the grooves 15, as shown in FIG. 20, are suitable when making a fine adjustment, because the amount of effective adjustment is small. Further, in addition to the adjustment areas formed inside the grooves 15 as shown in FIG. 20, additional adjustment areas may be formed outside the grooves 15 as shown in FIG. 19.

In the crystal oscillator manufacturing method illustrated in FIG. 8, a designated sequence of steps has to be repeated as long as the leakage amount measured in step ST6 is greater than the specified value. In view of this, the following describes a manufacturing method in which the process from step ST3 to step ST7 in FIG. 8 is implemented in a predetermined sequence of steps.

Figure 21:
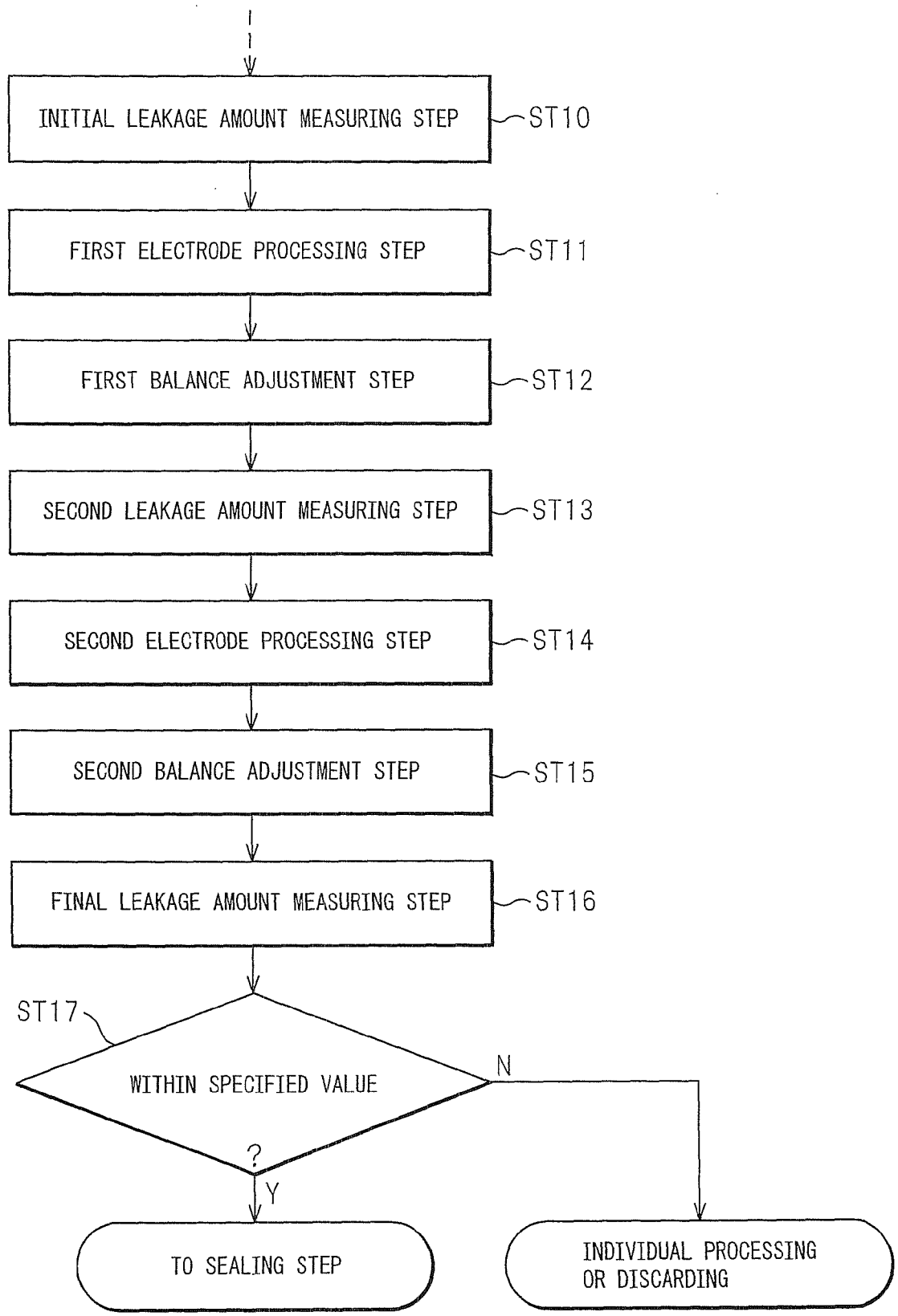
FIG. 21 is a flowchart illustrating the crystal oscillator manufacturing method in which steps ST3 to ST7 shown in FIG. 8 are replaced by alternative steps.

FIG. 21 is a flowchart illustrating the crystal oscillator manufacturing method in which the steps ST3 to ST7 shown in FIG. 8 are replaced by alternative steps.

Following the step ST2 of FIG. 8, an initial leakage amount measuring step (step ST10) is carried at for measuring the initial amount of leakage vibration by driving each individual crystal oscillator piece formed on the crystal wafer. As in step ST3 of FIG. 8, this leakage amount measuring step is implemented using the leakage amount measuring system shown in FIG. 13.

Next, based on the measurement result obtained from the initial leakage amount measuring step, a first electrode processing step (step ST11) is performed to process the electrodes of each individual crystal oscillator piece into a prescribed shape to form the adjustment areas 30 such that the leakage amount measured will become zero when the subsequence first and second balance adjustment steps are both completed. If the etching time is set the same for both the first and second balance adjustment steps, the target value of the leakage amount to be achieved at the completion of the first balance adjustment step is one half of the initial leakage amount. The first electrode processing step is performed in the same manner as the step ST4 of FIG. 8, except that the target value is different.

Next, the first balance adjustment step (step ST12) is performed that etches the crystal wafer in a collective manner by using as masks the electrodes processed into the prescribed shape in the first electrode processing step. The first balance adjustment step is performed in the same manner as the step ST5 of FIG. 8.

Next, a second leakage amount measuring step (step ST13) is performed that measures the amount of leakage vibration for the second time by driving each individual crystal oscillator piece formed on the crystal wafer. As in step ST3 of FIG. 8, this leakage amount measuring step is implemented using the leakage amount measuring system shown in FIG. 13.

Next, based on the measurement result obtained from the second leakage amount measuring step, a second electrode processing step (step ST14) is carried at to process the electrodes of each individual crystal oscillator piece into a prescribed shape to form the adjustment areas 30 aiming to reduce the leakage amount to zero. The second electrode processing step is performed in the same manner as the step ST4 of FIG. 8, except that the target value is different.

Next, the second balance adjustment step (step ST15) is performed that etches the crystal wafer in a collective manner by using as masks the electrodes processed into the prescribed shape in the second electrode processing step. The second balance adjustment step is performed in the same manner as the step ST5 of FIG. 8.

After the balance has been adjusted in the second balance adjustment step, a final leakage amount measuring step (step ST16) is performed that measures the amount of leakage vibration by driving each individual crystal oscillator piece formed on the crystal wafer.

Next, based on the measurement result obtained from the final leakage amount measuring step ST16, it is determined whether the amount of leakage vibration is brought within the specified value (step ST17). If the determination is affirmative (the leakage amount is brought within the specified value), the leakage vibration adjustment is terminated because the leakage vibration of the crystal oscillator has been suppressed to a negligible level. On the other hand, if the determination is negative (the leakage amount is greater than the specified value), the crystal oscillator is sent to individual processing or discarded.

Figure 22:
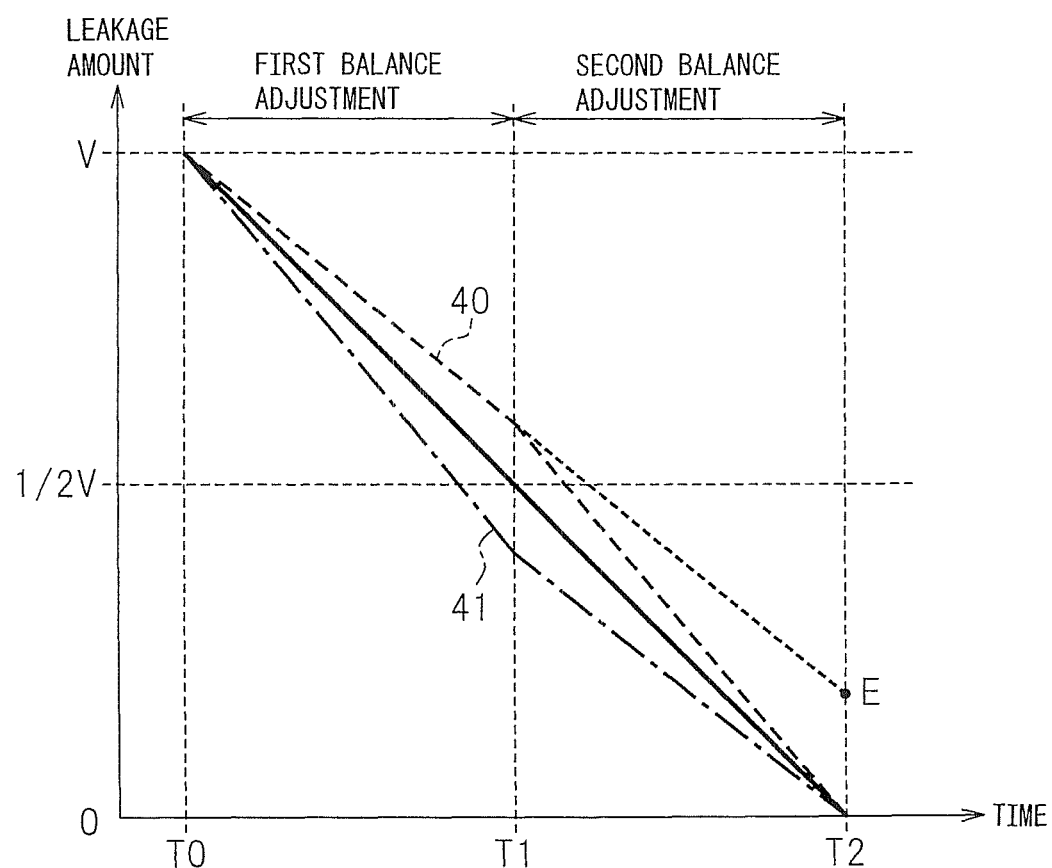
FIG. 22 is a diagram showing one example for explaining the process of how the flowchart of FIG. 21 is implemented.

FIG. 22 is a diagram showing one example for explaining the process of how the flowchart of FIG. 21 is implemented.

When the initial leakage amount measured in step ST10 is V (mV), the target leakage amount to be achieved in the first balance adjustment step is set to V/2, and etching is performed for a period from time T0 to time T1. In the case of FIG. 22, the target leakage amount is V/2 because the ratio of the period from time T0 to time T1 to the period from time T1 to time T2 is set to 1:1. Next, in step ST13 (time T1), the second leakage amount is measured.

In FIG. 22, a broken line 40 (dashed line) indicates the case where the second leakage amount measured at time T1 was larger than V/2 because of an error. This means that the leakage adjustment speed was slow; therefore, in this case, an adjustment is made in the second electrode processing step (ST14) by processing the electrodes in the same direction as in the first electrode processing step so as to increase the effectiveness of the leakage amount adjustment to be made in the second balance adjustment step so that the leakage amount can be finally reduced to zero. On the other hand, in FIG. 22, a broken line 41 (semi-dashed line) indicates the case where the second leakage amount measured at time T1 was smaller than V/2 because of an error. This means that the leakage adjustment speed was fast; therefore, in this case, an adjustment is made in the second electrode processing step (ST14) by processing the electrodes in the opposite direction to that in the first electrode processing step so as to reduce the effectiveness of the leakage amount adjustment to be made in the second balance adjustment step so that the leakage amount can be finally reduced to zero.

Next, in step ST16 (time T2), the final leakage amount measurement is performed, and the final leakage amount measured is checked to determine whether the error has been reduced to within the specified value.

In this way, according to the manufacturing method illustrated in FIGS. 21 and 22, since the leakage amount is adjusted in two steps, the final leakage amount can be adjusted to within the specified value in an easy and simple manner. In the examples shown in FIGS. 21 and 22, the etching time has been set the same for both the first and second balance adjustment steps (the period from time T0 to time T1 and the period from time T1 to time T2 have been set equal to each other), but the etching time may be set different between the two steps.

Figure 23:
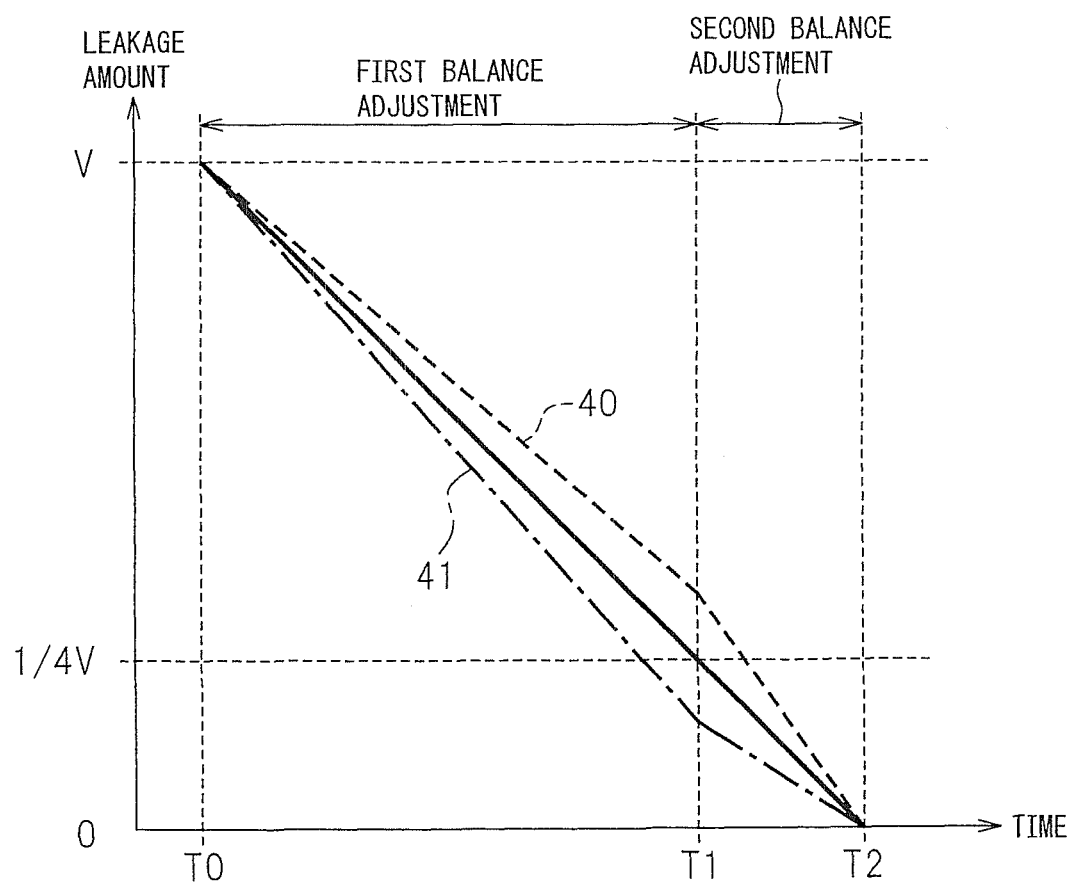
FIG. 23 is a diagram showing another example for explaining the process of how the flowchart of FIG. 21 is implemented.

FIG. 23 is a diagram showing another example for explaining the process of how the flowchart of FIG. 21 is implemented.

When the initial leakage amount measured in step ST10 is V (mV), the first electrode processing step is performed by setting the target leakage amount to be achieved in the first balance adjustment step to V/4, and etching is performed for a period from time T0 to time T1 in the first balance adjustment step. In the case of FIG. 23, the ratio of the period from time T0 to time T1 to the period from time T1 to time T2 is set to 3:1. Next, in step ST13 (time T1), the second leakage amount is measured.

In FIG. 23, a broken line 40 (dashed line) indicates the case where the second leakage amount measured at time T1 was larger than V/4 because of an error. This means that the leakage adjustment speed was slow; therefore, in this case, an adjustment is made in the second electrode processing step by processing the electrodes in the same direction as in the first electrode processing step so as to increase the effectiveness of the leakage amount adjustment to be made in the second balance adjustment step so that the leakage amount can be finally reduced to zero. On the other hand, in FIG. 23, a broken line 41 (semi-dashed line) indicates the case where the second leakage amount measured at time T1 was smaller than V/4 because of an error. This means that the leakage adjustment speed was fast; therefore, in this case, an adjustment is made in the second electrode processing step by processing the electrodes in the opposite direction to that in the first electrode processing step so as to reduce the effectiveness of the leakage amount adjustment to be made in the second balance adjustment step so that the leakage amount can be finally reduced to zero.

Next, in step ST16 (time T2), the final leakage amount measurement is performed, and the final leakage amount measured is checked to determine whether the error has been reduced to within the specified value.

In the case of FIG. 23, the adjustment is stopped ¾ of the way in the first electrode processing and balance adjustment steps, and the remaining one quarter of the adjustment is performed in the second electrode processing and balance adjustment steps. If many experimental data have already been accumulated, and the error (dashed line 40 or semi-dashed line 41) after the first balance adjustment is not large, there is no need to make a substantial readjustment after the first three quarters of the adjustment has been completed (time T1); accordingly, by making the setting as shown in FIG. 23, the final leakage amount can be adjusted more easily and more accurately to within the specified value. This is because the error in the second balance adjustment step becomes larger as the duration of the second balance adjustment step increases. If it is estimated that the error at time T1 is much smaller, T1 may be set much closer to T2 rather than setting it at ¾ of the way.

FIG. 24 is a diagram showing specific adjustment examples.

Figure 25:
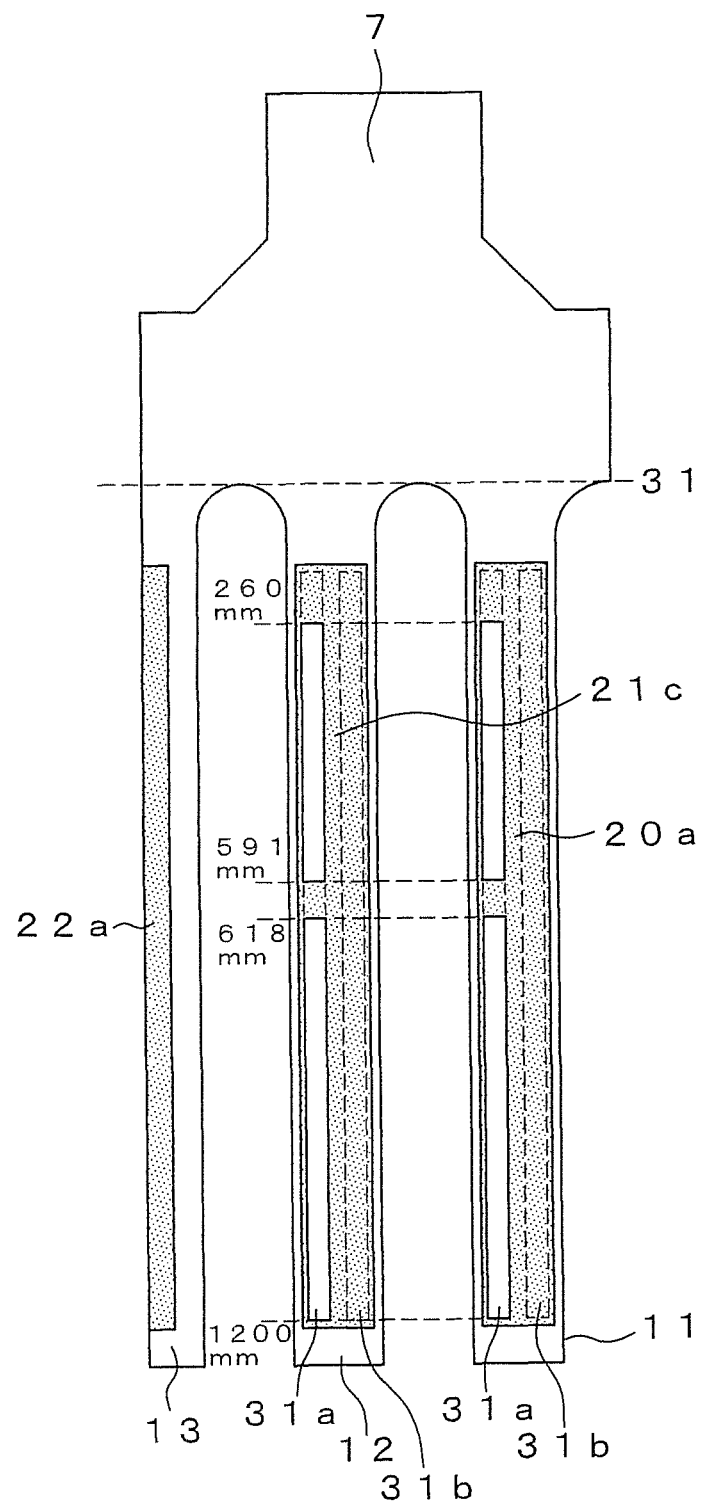
FIG. 25 is a diagram explaining portions where the crystal oscillator piece is trimmed off.

Specific adjustment examples will be described below by using the crystal oscillator piece 7 shown in FIG. 25. In the six examples shown in FIG. 24, the etching time ratio between the first and second balance adjustment steps was set to 1:1 (see FIG. 22).

For example, the crystal oscillator piece of device number 3 was measured to have an initial leakage amount of 1500 mV in the initial leakage amount measuring step (ST10). Therefore, in the first electrode processing step (ST11), the portion located from 260 µm to 591 µm from the base position (indicated at 31 in FIG. 25) was trimmed off the adjustment area (indicated at 31a in FIG. 25) extending along the left edge of each of the vibrating tines 11 and 12, and etching was performed accordingly (ST12).

In the second leakage amount measuring step (ST14), the second leakage amount was measured to be 1200 mV. Considering the fact that the etching time ratio between the first and second balance adjustment steps was set to 1:1, if the next etching were performed with this setting, the final leakage amount would become 900 mV (see E40 in FIG. 22) (the target value at ½ was 750 mV). In view of this, in the second electrode processing step (ST14), in order that the error of 900 mV would be corrected in the second balance adjustment step (that is, in order to increase the amount of leakage adjustment to 1200 mV), the portion located from 618 µm to 1200 µm from the base position (indicated at 31 in FIG. 25) was trimmed off the adjustment area (indicated at 31a in FIG. 25) extending along the left edge of each of the vibrating tines 11 and 12, and etching was performed accordingly (ST15).

As a result, the final leakage amount was 85 mV and thus brought within the specified value. The specified value was set, for example, to ±150 mV, the range that does not affect the characteristics of the gyro.

Figure 26:
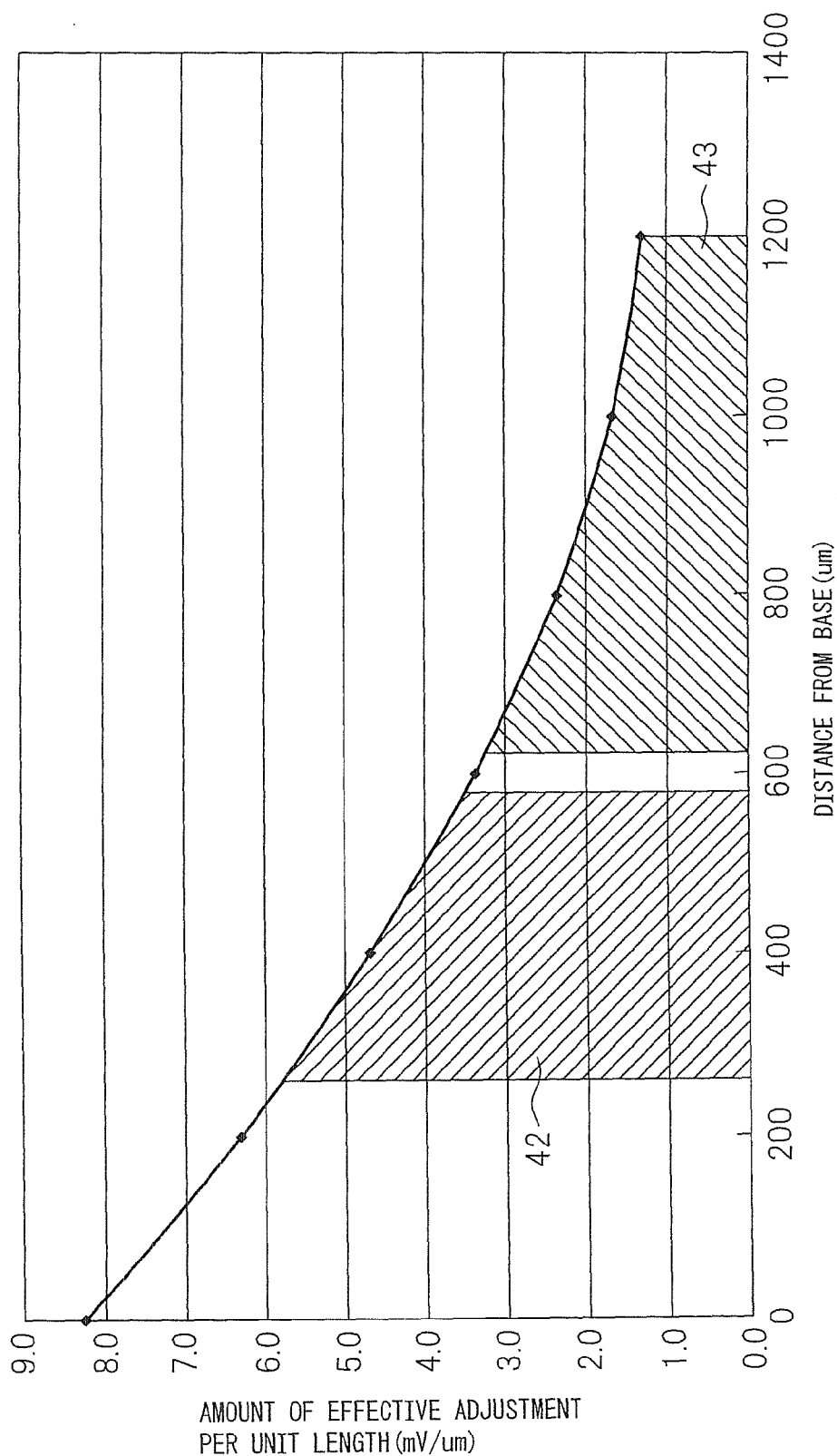
FIG. 26 is a diagram showing the relationship between the amount of effective adjustment per unit length (mV/μm) and the distance (μm) from the base position.

FIG. 26 is a diagram showing the relationship between the amount of effective adjustment per unit length (mV/µm) and the distance (µm) from the base position.

In FIG. 26, in the adjustment area (31a in FIG. 25) extending along the left edge, the amount of effective adjustment per unit length at a position located 600 µm from the base position is 3.4 (mV/µm). In the illustrated example, this means that if trimming is done by applying a 1-µm diameter beam spot to the position located 600 µm from the base position, and prescribed etching is performed (in FIGS. 22 and 23, the etching from T0 to T1), then the leakage amount will be improved by an amount equal to +3.4 mV. The relationship graph of FIG. 26 was obtained through experiment for the crystal oscillator piece shown in FIG. 25.

The trimming position in the first electrode processing step (ST11) is set so that the definite integral of the relationship graph shown in FIG. 26 coincides with the initial leakage amount. In the case of the earlier described crystal oscillator piece of device number 3, the hatched area 42 in FIG. 26 corresponds to the initial leakage amount of 1500 mV. The error of 900 mV to be corrected in the second balance adjustment step has to be processed during the period from T1 to T2; when converted to the period from T0 to T2, this means that electrode processing equivalent to 1800 mV has to be done in the second electrode processing step. The hatched area 43 corresponds to the adjustment error of 1800 mV.

The trimming position in the first electrode processing step (ST11) and the trimming position in the second electrode processing step (ST14) can be determined as described above.

Figure 27:
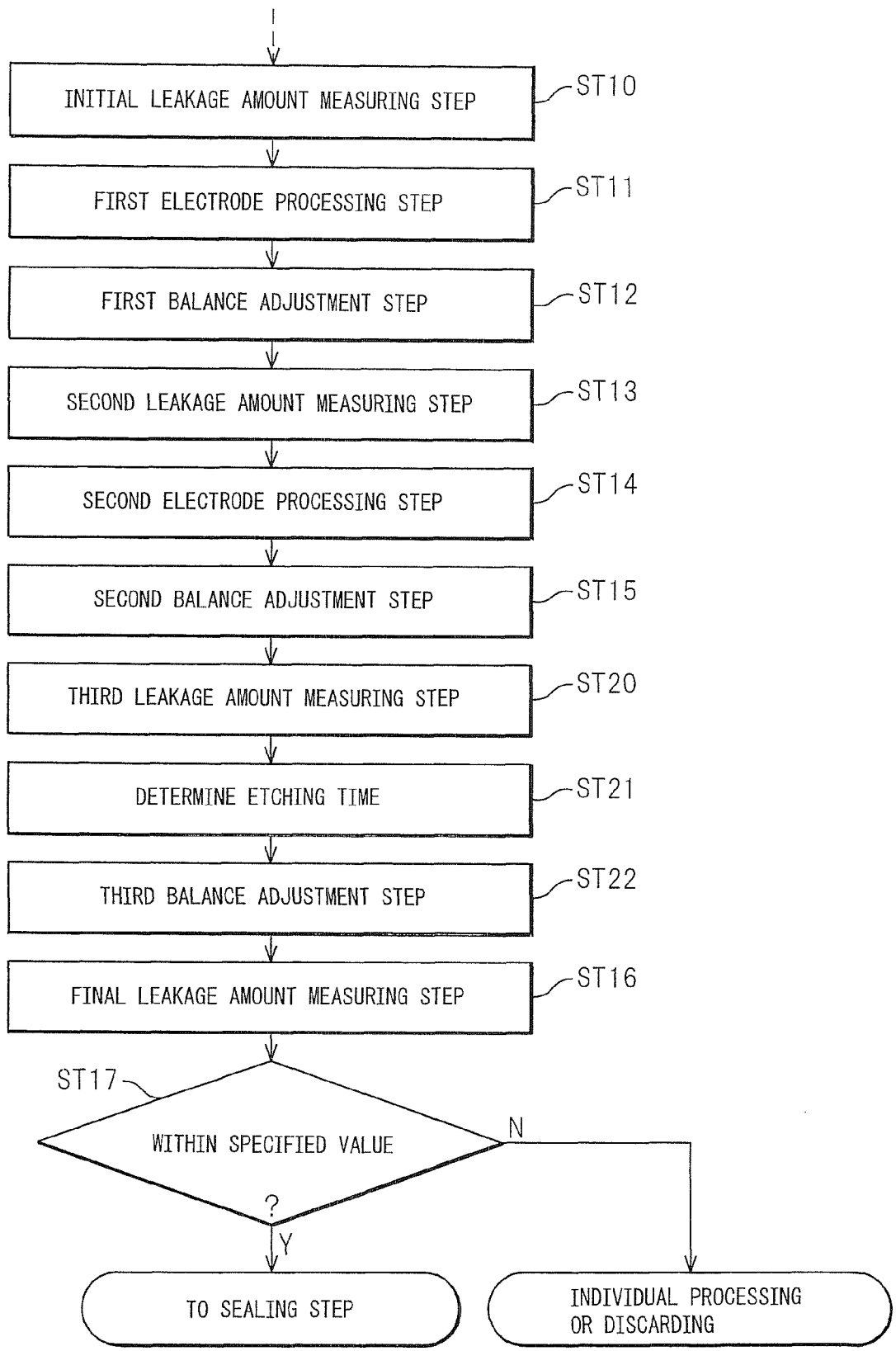
FIG. 27 is a flowchart illustrating another crystal oscillator manufacturing method in which steps ST3 to ST7 shown in FIG. 8 are replaced by alternative steps.

FIG. 27 is a flowchart illustrating another crystal oscillator manufacturing method in which the steps ST3 to ST7 shown in FIG. 8 are replaced by alternative steps.

Following the step ST2 of FIG. 8, an initial leakage amount measuring step (step ST10) is performed that measures the initial amount of leakage vibration by driving each individual crystal oscillator piece formed on the crystal wafer. As in step ST3 of FIG. 8, this leakage amount measuring step is implemented using the leakage amount measuring system shown in FIG. 13.

ST11 to ST15, ST16, and ST17 in FIG. 27 are the same as the corresponding steps in the flowchart of FIG. 21, and therefore, the description of these steps will not be repeated here. In the flowchart of FIG. 21, the final leakage amount was measured at time T2 (ST16), and a determination was made as to whether the amount of leakage vibration was brought within the specified value (ST17).

In contrast, in the manufacturing method illustrated in FIG. 27, a third leakage amount measuring step (step ST20) is performed to measure the amount of leakage vibration for the third time by driving each individual crystal oscillator piece formed on the crystal wafer. As in step ST3 of FIG. 8, this leakage amount measuring step is implemented using the leakage amount measuring system shown in FIG. 13.

The amount of trimming in the first electrode processing step, the etching time in the first balance adjustment step, and the amount of trimming in the second electrode processing step are the same as those in FIG. 21, but in the example of FIG. 27, in order to perform the third leakage amount measuring step (step ST20), the etching time in the second balance adjustment step is set shorter than the example shown in the flowchart of FIG. 21.

Next, the etching time in a third balance adjustment step is determined (ST21) based on the measurement result obtained from the third leakage amount measuring step. The etching time is determined by considering how far the etching needs to be performed in order to eliminate the leakage amount. In the case of wafer processing, the etching time is determined by considering how far the etching needs to be performed in order to maximize the number of devices having a reduced leakage amount that can be obtained from the wafer. This is done in order to reduce the effects of the error arising in the second balance adjusting process.

Next, trimming such as carried out in the first electrode processing step (ST11) or second electrode processing step (ST14) is not performed, but the third balance adjustment step (ST22) is performed to etch the crystal wafer in a collective manner by using the earlier processed electrodes as masks.

Figure 28:
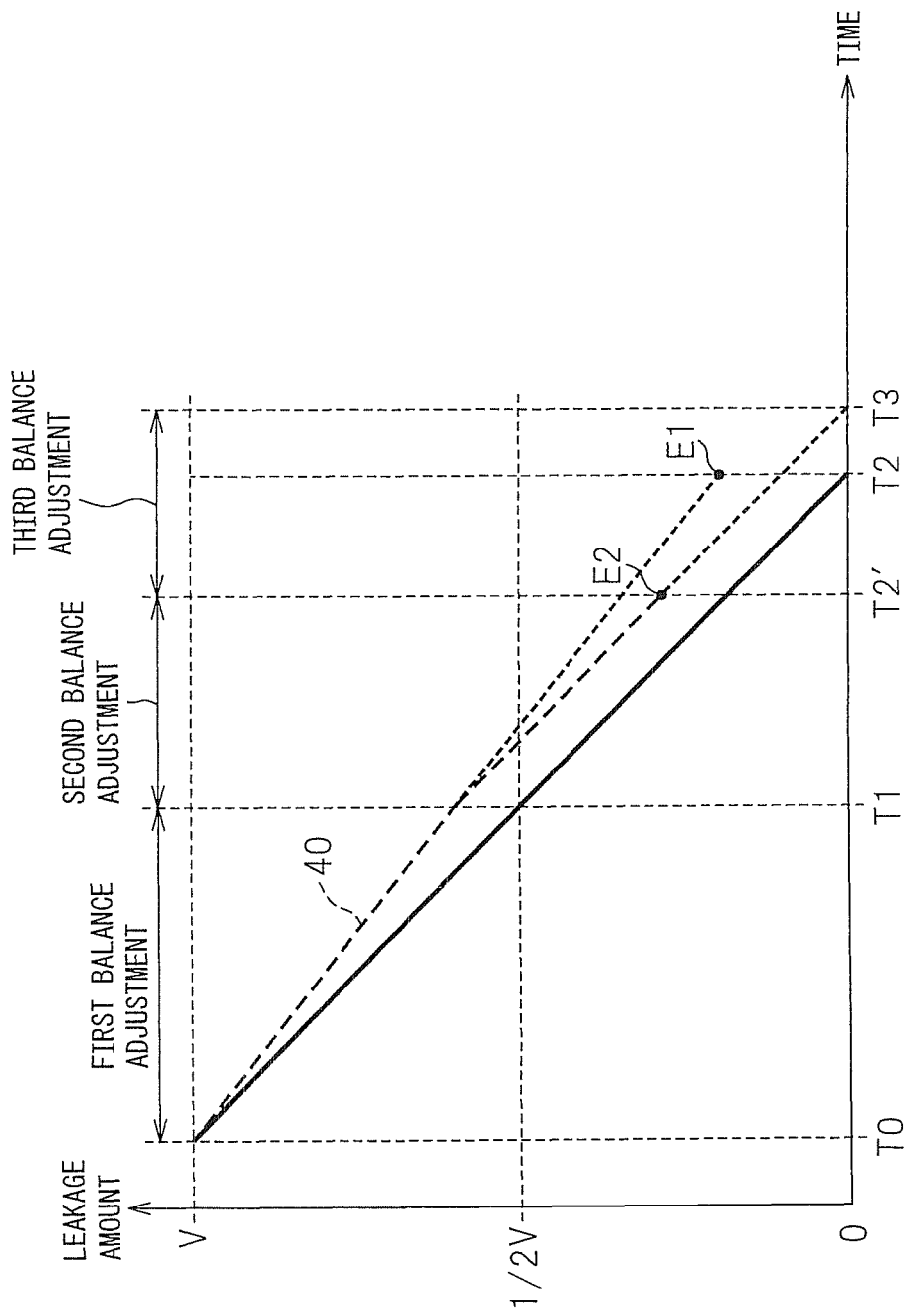
FIG. 28 is a diagram showing one example for explaining the process of how the flowchart of FIG. 27 is implemented.

FIG. 28 is a diagram showing one example for explaining the process of how the flowchart of FIG. 27 is implemented.

When the initial leakage amount measured in step ST10 is V (mV), the target leakage amount to be achieved in the first electrode processing step and first balance adjustment step is set to V/2, since, in the case of FIG. 28, the ratio of the period from time T0 to time T1 to the period from time T1 to time T2 is set to 1:1, and etching is performed for the period from time T0 to time T1.

Next, in step ST13 (time T1), the second leakage amount is measured, and an adjustment error is calculated by predicting the final leakage amount (E1) to be achieved at T2; then, based on the predicted error, the second electrode processing step (ST14) and the second balance adjustment step (ST15) are performed. Here, the second balance adjustment step is performed for a period from T1 to T2' (T2'<T2).

Next, in step S20 (time T2'), the third leakage amount (E2) is measured, and the etching time (T3-T2') is determined (ST21) that is required to reduce the leakage amount to zero if the etching is performed with the current setting.

Next, in step ST16 (time T3), the final leakage amount is measured, and the final leakage amount measured thus measured is checked to determine whether the error has been reduced to within the specified value. In the case of wafer processing, the third balance adjustment is performed to find T3 that maximizes the number of devices having a reduced leakage amount.

In this way, according to the manufacturing method illustrated in FIGS. 27 and 28, since the leakage amount is adjusted in three steps, the final leakage amount can be adjusted to within the specified value in an easy and simple manner. In the examples shown in FIGS. 27 and 28, the etching time has been set the same for both the first and second balance adjustment steps (the period from time T0 to time T1 and the period from time T1 to time T2 have been set equal to each other), but the etching time may be set different between the two steps.

According to the first manufacturing method of the present invention, the etch-off portions of the adjustment areas are formed in such a manner as to be displaced in the cross section of the driving tine according to the tilting of the principal axis; since this works to correct the tilting of the principal axis of the driving tine, the leakage vibration can be suppressed effectively. While the above description has dealt with the driving tine 11, the same description applies to the driving tine 12.

In the first manufacturing method of the present invention, if the leakage amount is large, for example, the balance adjustment step (step ST5) is repeated until the leakage amount is brought within the specified value, as shown in the flowchart of FIG. 8; if a large leakage amount is detected in the first leakage amount measuring step (step ST3), then in the first electrode processing step (step ST4) it is recommended to form the adjustment area by processing the first region of the electrode where the influence on the vibration of the driving tine is large. Since this serves to increase the amount of adjustment in the first balance adjustment step, the number of repetitions of the balance adjustment step can be reduced, achieving a reduction in the number of manufacturing steps.

In the first manufacturing method of the present invention, the adjustment area is formed on each surface of the vibrating tine 11, i.e., the adjustment area 30a on the upper surface and the adjustment area 30b on the lower surface, but alternatively, the adjustment area may be formed on either one of the upper and lower surfaces, if the leakage amount is small. In this case, the leakage amount can be adjusted at an even finer level.

In the first manufacturing method of the present invention, the electrode processing step (step ST4) and the balance adjustment step (step ST5) are performed based on the result obtained from the leakage amount measuring step (step ST3), but provisions may be made to repeat the electrode processing step and the balance adjustment step a certain number of times by reducing the amount of processing of the adjustment areas and the amount of balance adjustment (etching) compared with the measured leakage amount. The reason is that once the balance adjustment is overdone compared with the measured leakage amount, the overdone adjustment cannot be undone.

As described above, according to the first manufacturing method of the present invention, after forming the external shape of the crystal oscillator, the vibrating tines are processed by re-etching and the leakage amount can thus be adjusted to suppress the generation of leakage vibration. Since the leakage vibration can be adjusted without applying an unnecessary external force to the crystal oscillator, the invention can provide a crystal oscillator manufacturing method that can adjust the leakage vibration stably and accurately without degrading the manufacturing yield, reliability, etc., of the crystal oscillator.

Further, according to the first manufacturing method of the present invention, since the etch-off portions of the adjustment areas are formed by processing the electrodes based on the result of the measurement of the leakage amount, and re-etching is performed by using the thus processed electrodes as masks, the leakage vibration can be adjusted at a highly precise, fine level, and the method thus offers a great advantage for the manufacturing of high-performance crystal oscillator pieces.

Furthermore, according to the first manufacturing method of the present invention, since the plurality of crystal oscillator pieces formed on the crystal wafer are collectively re-etched to adjust the leakage vibration, not only can the number of adjustment steps be drastically reduced, but crystal oscillator pieces having uniform performance and stable characteristics free from large variations can be manufactured efficiently.

Figure 29:
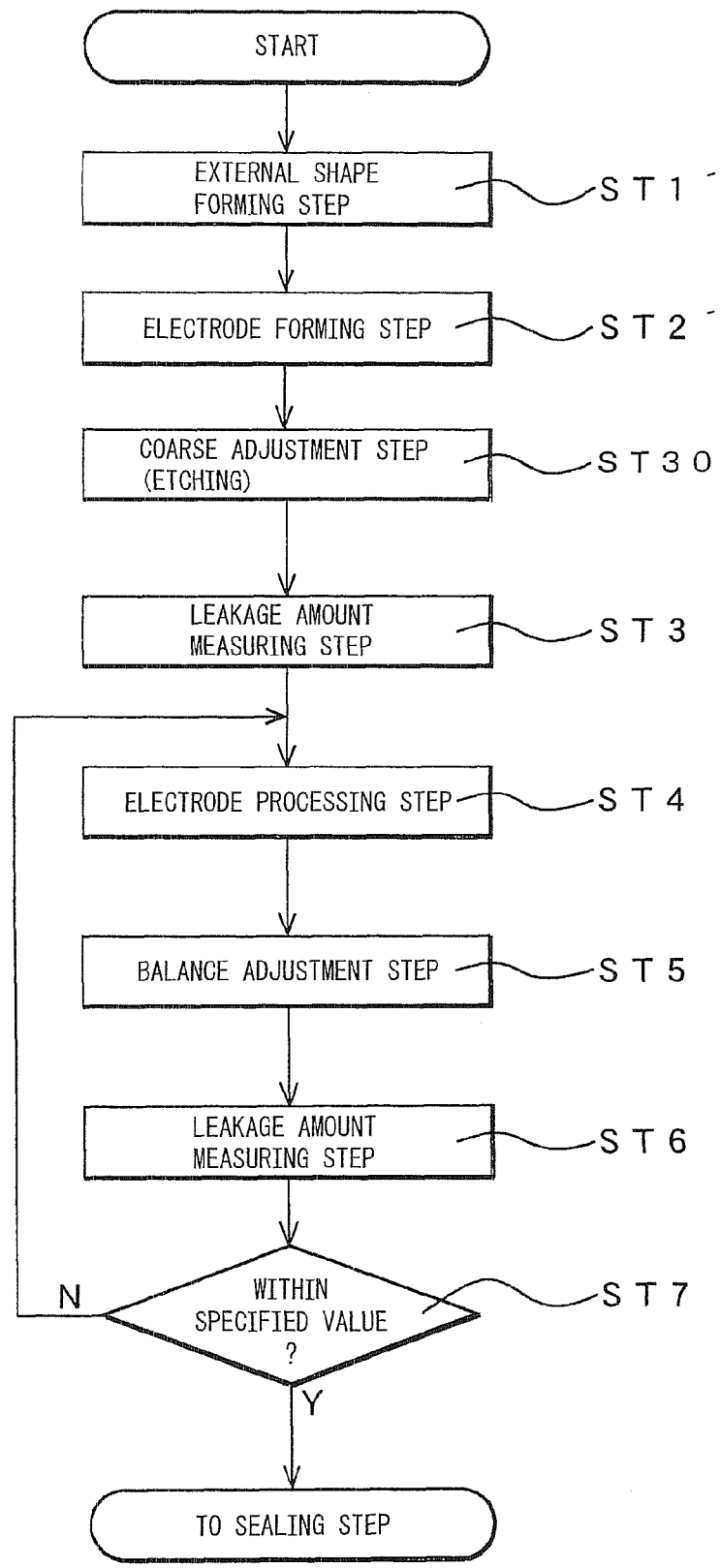
FIG. 29 is a flowchart illustrating the sequence of process steps according to a second crystal oscillator manufacturing method of the present invention.

FIG. 29 is a flowchart illustrating the sequence of process steps in the second crystal oscillator manufacturing method according to the present invention.

The feature of the second manufacturing method illustrated in FIG. 29 is to characterize in advance the electrodes to be formed on each vibrating tine by estimating the leakage vibration of the crystal oscillator in advance and to make a coarse adjustment of the leakage vibration by re-etching. Since the second manufacturing method illustrated in FIG. 29 is essentially the same as the earlier described manufacturing method except for some differences, the same elements as those in the earlier described method are designated by the same reference numerals, and the description already given will not be repeated.

The steps ST3 to ST7 shown in FIG. 29 are the same as the corresponding steps shown in FIG. 8, and therefore, the description of these steps will not be repeated here. In the second manufacturing method illustrated in FIG. 29, the process proceeds in the order of the external shape forming step (step ST1'), the electrode forming step (step ST2'), the coarse adjustment step (step ST30), and the leakage amount measuring step (step ST3); the leakage amount measuring step (step ST3) and the subsequent steps are the same as the corresponding steps shown in FIG. 8.

Figure 5:
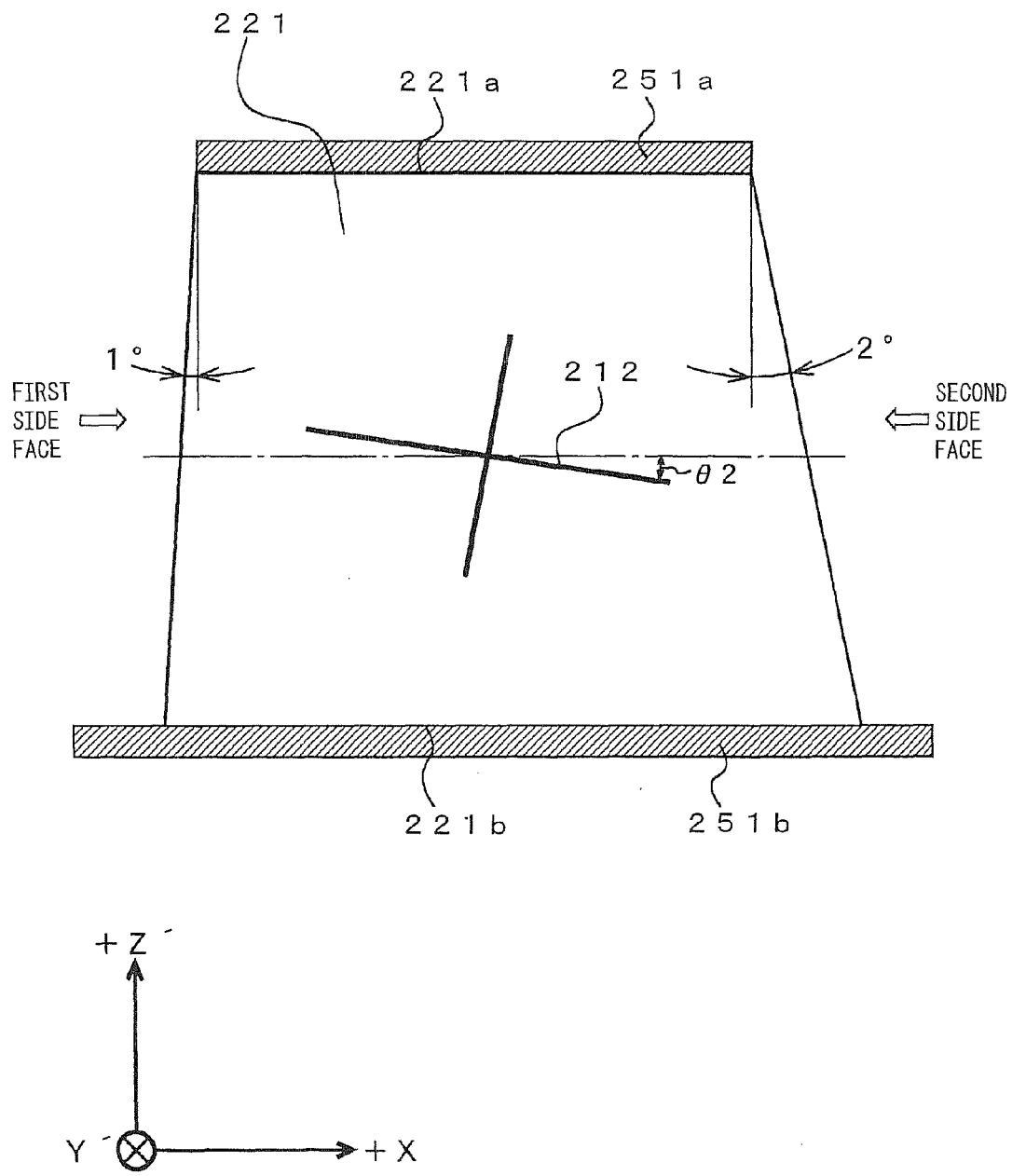
FIG. 5 is a cross-sectional view showing one example of the vibrating tine of the prior art crystal oscillator manufactured by using a single-sided mask.
Figure 6:
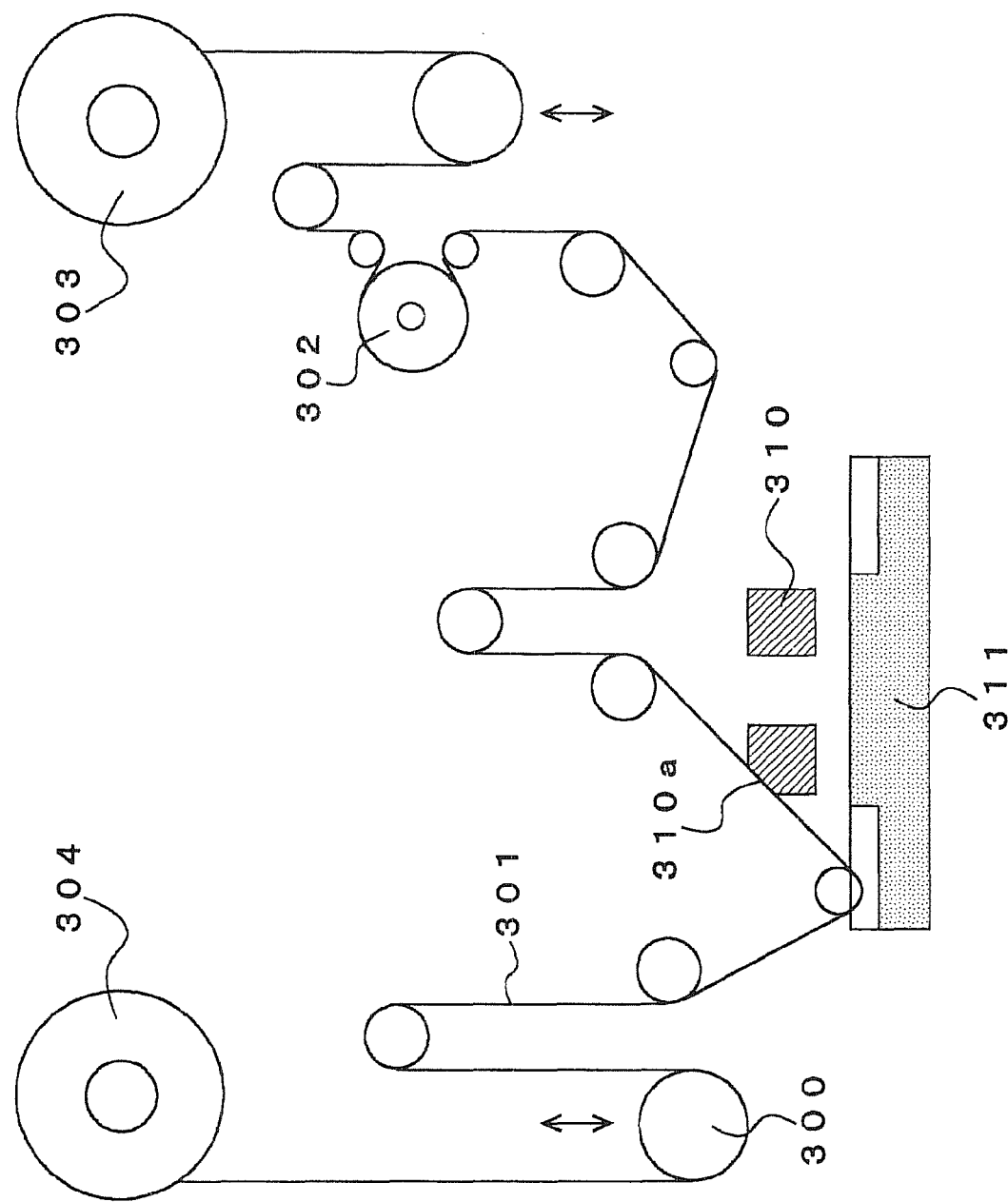
FIG. 6 is a schematic diagram for explaining a prior art crystal oscillator characteristic adjusting method.

The external shape forming step (step ST1') shown in FIG. 29 is basically the same as the external shape forming step (step ST1) shown in FIG. 8, the only difference being that the etching resistant mask member to be used for manufacturing the plurality of crystal oscillator pieces 7 from the crystal wafer comprises a single mask formed only on one surface, or two masks, one mask being used as a reference pattern and the other mask being formed wider than the one mask, as previously illustrated in FIG. 5. In this external shape forming step, since the crystal wafer is dissolved only from the surface where the mask as the reference pattern is formed, the external shape of each crystal oscillator piece can be formed without being affected by a positional displacement between the upper and lower masks.

As described earlier with reference to FIG. 5, due to the etching anisotropy of the crystal, the first side face of the vibrating tine is formed forming an angle of about 1° with the Z' axis, and the second side face is formed forming an angle of about 2° with the Z' axis; as a result, the cross-sectional shape is top-bottom asymmetrical, and the principal axis 112 is not parallel to the X axis, resulting in the generation of leakage vibration.

However, according to this method, since the external shape formation is not affected by the positional displacement of the etching mask, the tilting of the principal axis 112 can be estimated in advance from the residues formed due to the etching anisotropy, and hence the direction of the leakage vibration can also be estimated. In this way, the second manufacturing method illustrated in FIG. 29 can be advantageously employed when the tilting of the principal axis can be estimated from the etching anisotropy, etc.

Figure 30:
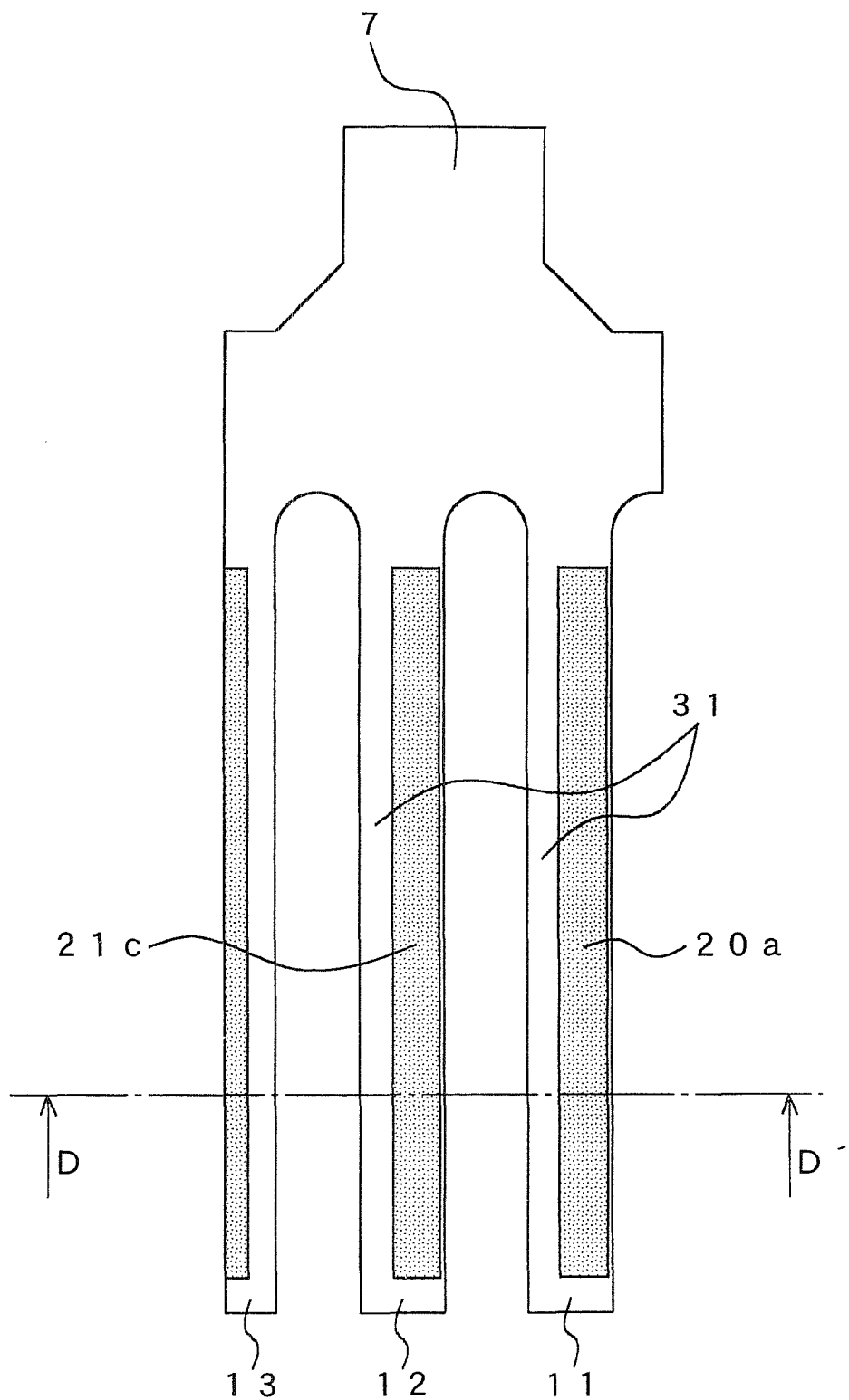
FIG. 30 is top plan view showing electrodes formed on the vibrating tines in an electrode forming step according to the second crystal oscillator manufacturing method of the present invention.

FIG. 30 is a diagram for explaining the electrode forming step (step ST2').

As described above, in the crystal oscillator piece 7 formed in the external shape forming step (step ST1'), the principal axis is tilted due to the etching anisotropy of the crystal, and the direction of the leakage vibration can be estimated in advance. In view of this, as shown in FIG. 30, the driving electrodes 20a and 21c are formed on the respective driving tines 11 and 12 in such a manner that the widthwise centers of the respective driving electrodes 20a and 21c on the respective vibrating tines are displaced by a predetermined amount from the widthwise centers of the respective driving tines 11 and 12.

By thus forming the driving electrodes 20a and 21c, the driving electrodes 20a and 21c are displaced toward the widthwise edges of the respective driving tines 11 and 12. This results in the formation of a long narrow area exposing the surface of the crystal oscillator piece 7 along each of the driving electrodes 20a and 21c. This area is the coarse adjustment area 31 used for the coarse adjustment of the leakage vibration.

FIG. 31 is a diagram for explaining the coarse adjustment step (step ST30) shown in FIG. 29.

In the coarse adjustment step, after the coarse adjustment areas 31 have been formed on the driving tines 11 and 12 by forming the driving electrodes 20 and 21 in displaced fashion in the preceding electrode forming step (step ST2'), the balance of the crystal oscillator piece 7 is coarsely adjusted by collectively re-etching the crystal wafer 1 using the driving electrodes 20 and 21 as masks.

FIG. 31 is a cross-sectional view schematically showing the cross section of the crystal oscillator piece 7 taken along line D-D' in FIG. 30; only the driving tine 11 is shown here. The cross-sectional shape shown here is similar to that of the driving tine 101 of the crystal oscillator previously shown in FIG. 5 as a prior art example. That is, the cross section of the driving tine 11 is top-bottom asymmetrical due to the etching anisotropy of the crystal, and the principal axis 36 (dashed line) is tilted by an angle θ2 relative to the X axis, resulting in the generation of leakage vibration.

In the example shown in FIG. 31, the driving electrodes 20a and 20b are formed on the principal faces of the driving tine 11 in such a manner that the substantial center of the driving electrodes 20a and 20b is displaced from the substantial center of the principal faces of the driving tine 11. This results in the formation of a coarse adjustment area 32a on the upper surface of the driving tine 11 at a position displaced leftward in the figure and a coarse adjustment area 32b on the lower surface of the driving tine 11 at a position displaced rightward in the figure.

Then, the surface portions of the crystal oscillator piece exposed in the coarse adjustment areas 32a and 32b are etched off by collectively re-etching in the coarse adjustment step, and the thickness of the driving tine 11 in the corresponding portions is slightly reduced (the portions indicated by dashed lines in FIG. 31). By etching off the coarse adjustment areas 32a and 32b in this manner, the top-bottom asymmetrical cross-sectional shape of the driving tine 11 is corrected, though the cross-sectional shape is still top-bottom asymmetrical, and the principal axis 36 is corrected as indicated by the principal axis 36' (solid line) to suppress the generation of leakage vibration.

When the center of the vibrating axis of the driving tine 11 is taken as the origin P, and the first to fourth quadrants are defined by two mutually perpendicular axes x and y passing through the origin P, the coarse adjustment areas 32a and 32b are processed so that the etch-off portions of the coarse adjustment areas 32a and 32b are located in a pair of quadrants diametrically opposed across the origin P, as shown in FIG. 31. In this arrangement, the coarse adjustment areas 32a and 32b are processed so that the amount of etching becomes the same between any two quadrants diametrically opposed across the origin P but differs between any two adjacent quadrants.

In the example of FIG. 31, the coarse adjustment areas 32a and 32b are formed in the second and fourth quadrants, because the residue formed at the lower right of the figure is larger than the residue formed at the lower left of the figure, providing the cross-sectional shape such that the balance can be adjusted by etching off the crystal in the fourth quadrant and the crystal in the second quadrant that has an equivalent effect. In such cases as when the positions are reversed right and left, the tilting of the principal axis of the driving tine 11 can be corrected by forming the coarse adjustment areas 32*a* and 32*b* in the first and third quadrants, respectively, though not shown here.

FIG. 31 has shown an example in which the coarse adjustment areas 32*a* and 32*b* are each formed in such a manner as to straddle between the principal face and side face of the driving tine 11 by etching off an edge portion of the driving tine, but the etch-off portions may be formed only on the respective principal faces.

In FIG. 31, the electrode forming step (step ST2') is immediately followed by the coarse adjustment step (step ST30), but instead, the leakage amount measuring step may be inserted between the electrode forming step (step ST2') and the coarse adjustment step (step ST30), and the amount of etching in the coarse adjustment step (step ST30) may be adjusted in accordance with the leakage amount measured in the leakage amount measuring step.

Since the etching time and the temperature and concentration of the etching solution are important parameters that determine the amount of etching in the balance adjustment step, these parameters must be managed properly. Further, in the balance adjustment step, the amount of etching is not just converted into an equivalent processing time, but the temperature may be changed by converting the amount of etching into the temperature of the etching solution, or the concentration of the etching solution may be changed by converting the amount of etching into the concentration of the etching solution.

After completing the coarse adjustment step, the process proceeds to the leakage amount measuring step (step ST3), as shown in FIG. 29; then, as in the previously described first manufacturing method, the adjustment areas 30 are formed based on the leakage amount information obtained from the leakage amount measurement, and in the balance adjustment step (step ST5), the leakage amount is further adjusted by re-etching. In the second embodiment, steps ST3 to ST7 are implemented as leakage amount fine adjustment steps.

A determination step may be added that terminates the leakage amount adjustment without proceeding to the next electrode processing step (step ST4) if the result of the measurement of the leakage amount in the leakage amount measuring step (ST3) shows that the leakage amount lies within the specified value. This serves to reduce the number of manufacturing steps, because there is no need for further adjustment if the leakage amount has been reduced sufficiently by the coarse adjustment step alone. If it is known in advance that the leakage amount can be reliably adjusted by the coarse adjustment alone, the leakage amount measuring step (ST3) may be omitted.

As described above, according to the second manufacturing method of the present invention, if the leakage vibration of the crystal oscillator can be estimated with a certain degree of accuracy, the electrode patterns can be characterized by displacing them off center, and the coarse adjustment of the leakage vibration can be accomplished by performing re-etching using the thus characterized electrodes as masks. Since most of the leakage vibration can thus be adjusted on the crystal wafer in a collective manner without having to measure the leakage amount, the subsequent fine adjustment steps can be simplified, achieving a crystal oscillator manufacturing method with a reduced number of adjustment steps.

As a result, it is possible to provide a crystal oscillator whose leakage vibration has been adjusted highly precisely and at a low cost.

Figure 32:
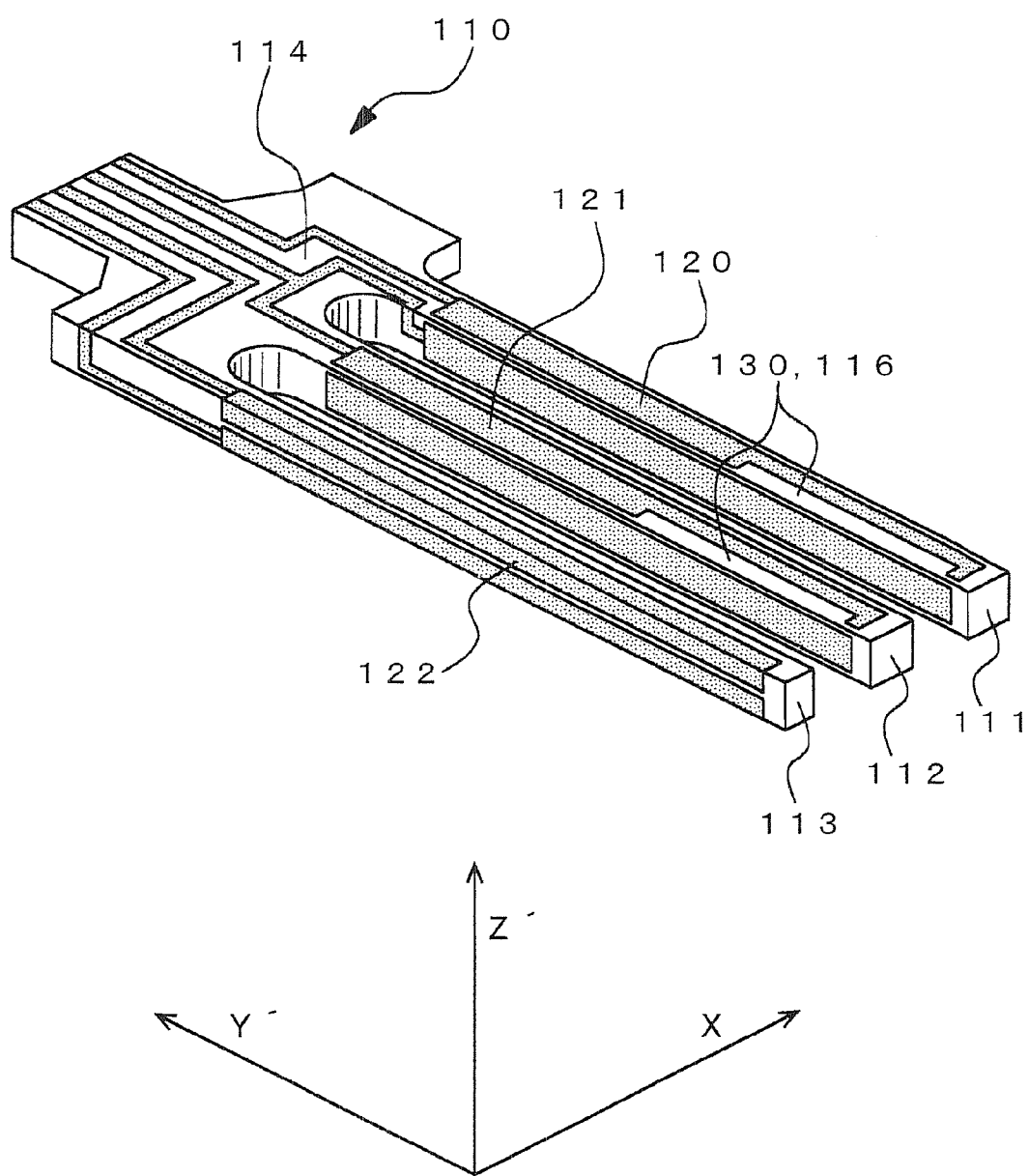
FIG. 32 is a perspective view showing one example of a crystal oscillator manufactured according to a third crystal oscillator manufacturing method of the present invention.

FIG. 32 is a diagram showing one example of a crystal oscillator manufactured according to a third manufacturing method of the present invention.

FIG. 32 is a perspective view schematically showing the crystal oscillator 110, and portions not relevant to the explanation, for example, fixing portions where an electrically conductive adhesive is applied when sealing the crystal oscillator in a sealing member such as a package, are not shown here.

As in the previously described example, the crystal oscillator 110 is formed by cutting it from a crystal wafer by etching. The crystal oscillator 110 shown here is an oscillator used as a vibrating gyro sensor, and more particularly, a three-pronged tuning fork oscillator having two driving tines 111 and 112 and one detection tine 113 as vibrating tines. However, the crystal oscillator 110 need not be limited to a three-pronged tuning fork, but may be, for example, a two-pronged tuning fork, a T-type tuning fork, an H-type tuning fork, or the like. Further, the crystal oscillator 110 can be used in other applications than the vibrating gyro sensor.

The driving tines 111 and 112 and the detection tine 113 are formed so as to extend from a base portion 114. Driving electrodes 120 and 121 are formed on the principal and side faces of the driving tines 111 and 112, and a detection electrode 122 is formed on the principal and side faces of the detection tine 113. Adjustment areas 116 are areas used to adjust the leakage vibration of the crystal oscillator 110. In the adjustment areas 116, designated portions of the driving electrodes 120 and 121 are removed by laser and, using the thus processed driving electrodes as masks, the driving tines 111 and 112 are re-etched in a balance adjustment step.

A major feature of the third manufacturing method of the present invention is to suppress the generation of leakage vibration by re-etching the crystal in the adjustment areas 116 of the driving electrodes 120 and 121 and thereby adjusting the thicknesses of the driving tines 111 and 112 in these areas. The crystal oscillator 110 is formed so that its widthwise direction coincides with the X axis direction, its longitudinal direction coincides with the Y' axis direction, and its thickness direction coincides with the Z° axis direction. This crystal oscillator 110 is common to all the crystal oscillator pieces to be manufactured by the third to sixth manufacturing methods described hereinafter.

Figure 33:
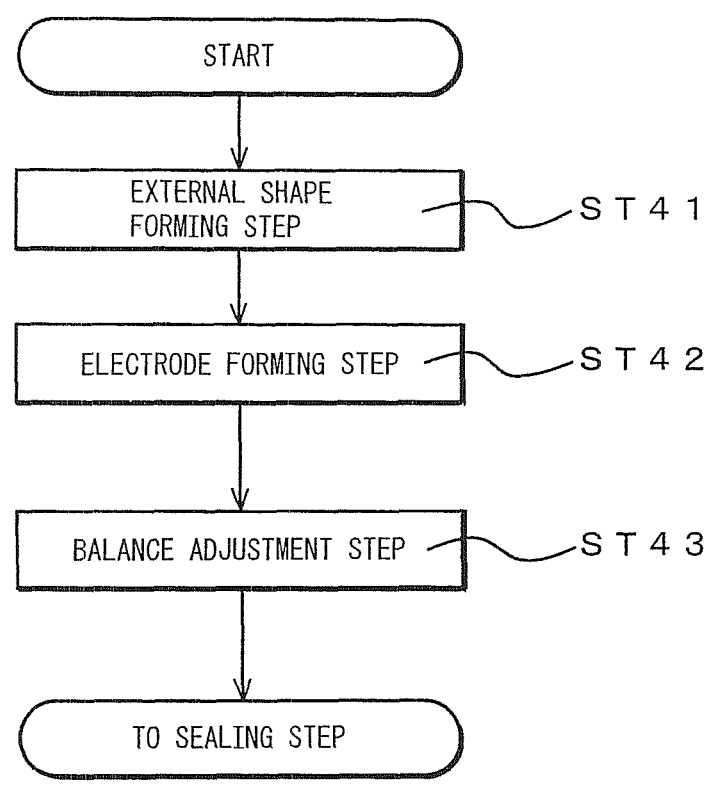
FIG. 33 is a flowchart illustrating the sequence of process steps according to the third manufacturing method of the present invention.

FIG. 33 is a flowchart for explaining an overview of the third manufacturing method according to the present invention.

The crystal oscillator manufacturing method described here assumes by way of example a manufacturing method that forms a plurality of crystal oscillator pieces on the same crystal wafer and that manufactures an array of such crystal oscillator pieces in a collective manner. Of course, the present invention is not limited to the method for manufacturing an array of crystal oscillator pieces in a collective manner, but can also be applied to a manufacturing method that manufactures one crystal oscillator on one crystal wafer or crystal plate.

The feature of the third manufacturing method is to characterize the external shape of the crystal oscillator and to suppress the generation of leakage vibration without measuring the leakage amount but by performing re-etching using as masks the electrodes provided with cut-outs formed based on the fact that the direction of the leakage vibration of the crystal oscillator can be estimated in advance.

Characterizing the external shape of the crystal oscillator means designing the shape of the driving tines of the crystal oscillator in such an external shape that one can identify the direction of the leakage vibration of the crystal oscillator. For example, the driving tines are processed into a prescribed shape by considering the results of previously conducted experiments and the etching anisotropy of the crystal. When the crystal is processed by wet etching, residues are invariably formed because the etch rate is different in different directions of the crystal. If the shape of such residues can be correctly known in advance, then the direction of the leakage vibration of the crystal oscillator can be determined.

In FIG. 33, the manufacturing process starts with an external shape forming step (step ST41) that forms an etching resistant mask member on a crystal wafer or a single plate of crystal, and then forms the external shapes of a plurality of crystal oscillator pieces. The etching resistant mask member may be formed using, for example, gold (Au). In this case, chromium (Cr) may be deposited to form a base layer underlying the gold. That is, the etching resistant mask member may be formed in a multilayered structure. The base layer of chromium (Cr) serves to enhance the adhesion between the crystal and gold (Au). Using the thus formed etching resistant mask member as a mask, the crystal wafer is etched with a prescribed etching solution, to form the external shapes of the respective crystal oscillator pieces.

Next, an electrode forming step (step ST42) is performed to form electrodes on the principal or side faces of the vibrating tines of each of the crystal oscillator pieces. In the example shown in FIG. 32, the electrodes formed in this step are the driving electrodes 120 and 121 and the detection electrode 122. A cut-out 130 is formed in each of the driving electrodes 120 and 121.

Next, a balance adjustment step (step ST43) is performed that etches the crystal wafer in a collective manner by a predetermined amount by using the electrodes formed in the electrode processing step as masks. In the example shown in FIG. 32, etching is performed on the crystal exposed in the adjustment areas 116 of the respective driving tines 111 and 112. In the balance adjustment step, the amount of etching is determined by estimating the formation of residues based on the result of the experiment conducted by the present inventor, the external shape, etc., by estimating the direction of the leakage vibration and the magnitude of the leakage amount, and by converting the amount of etching into an equivalent processing time, as earlier described. Since the amount of etching of the cut-outs can be determined in this way without having to measure the leakage amount, etc., a simplified crystal oscillator manufacturing method with a reduced number of manufacturing steps can be achieved.

After the leakage vibration adjustment is completed, each individual crystal oscillator is separated from the crystal wafer and sealed in a sealing member to complete the manufacturing of the crystal oscillator as a product. The steps that follow the leakage vibration adjustment are not directly relevant to the present invention, and therefore will not be described here.

FIG. 34 is a diagram for explaining the details of the crystal oscillator external shape forming step (step ST41).

FIG. 34 is a cross-sectional view schematically showing cross sections of the vibrating tines of the crystal oscillator pieces formed on the crystal wafer. In FIG. 34, two crystal oscillator pieces, each identical to the crystal oscillator 110 shown in FIG. 32, are shown arranged side by side, as viewed from the distal ends of the driving tines 111 and 112 and detection tine 113 (see FIG. 34(e)), looking toward the base portion 114.

Figure 34A:
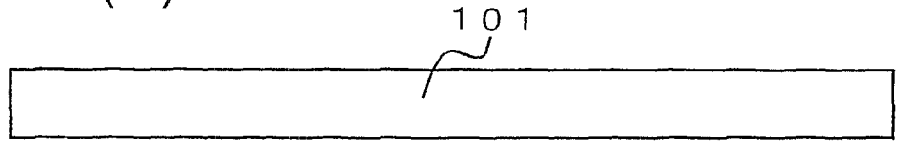
FIGS. 34(*a*) to 34(*e*) are cross-sectional views explaining an external shape forming step according to the third manufacturing method of the present invention.
Figure 34B:
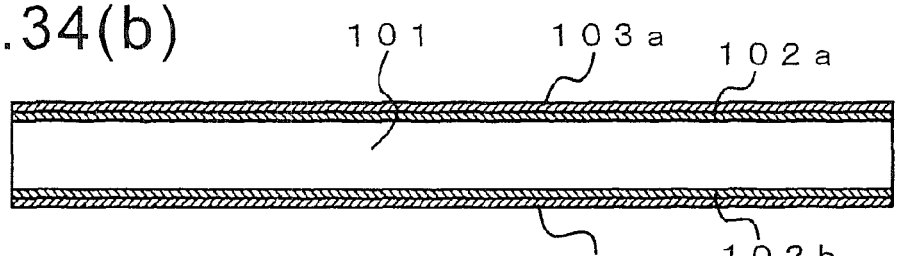

As shown in FIG. 34(b), corrosion resistant metal films 102a and 102b having resistance to crystal etchants and photoresist films 103a and 103b overlying the respective corrosion resistant metal films 102a and 102b are formed on the upper and lower surfaces of the crystal wafer 110 of FIG. 34(a), which is a single planar plate of crystal prepared to a prescribed thickness. In the example of FIG. 34(b), the corrosion resistant metal films 102a and 102b are each shown as a single-layer film for ease of illustration, but each may be formed as a multilayer film of gold (Au) and chromium (Cr), as earlier described. These metal films can be formed using known evaporation or sputtering techniques. The photoresist films 103a and 103b can be formed using known spin-coating techniques.

Figure 34C:
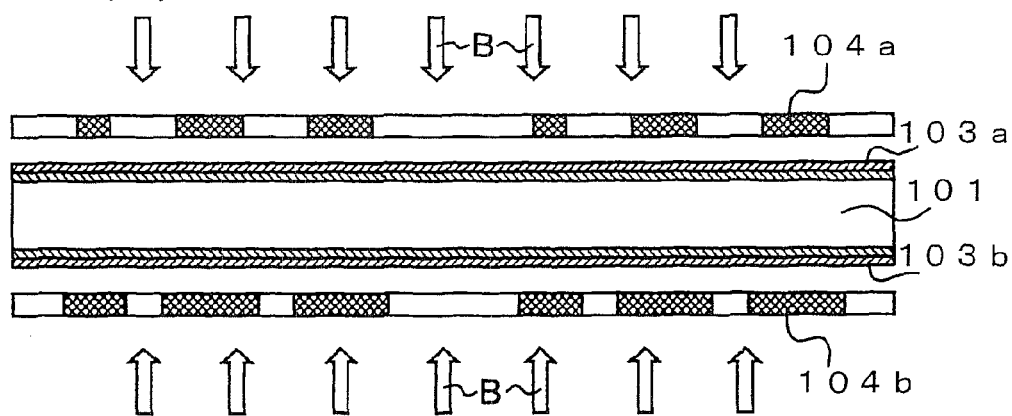

Next, as shown in FIG. 34(c), two photomasks 104a and 104b, on which oscillator patterns are written, are placed over the upper and lower surfaces of the crystal wafer 101, and the photoresist films 103a and 103b are exposed by radiating light (indicated by arrows B) from above the respective photomasks 104a and 104b. One photomask 104a is a photomask on which the oscillator pattern scaled to the exact size is written, while the other photomask 104b is a photomask on which the oscillator pattern is written by enlarging the size by a predetermined amount in the widthwise direction of the vibrating tines, compared with the pattern written on the one photomask 104a.

Figure 34D:
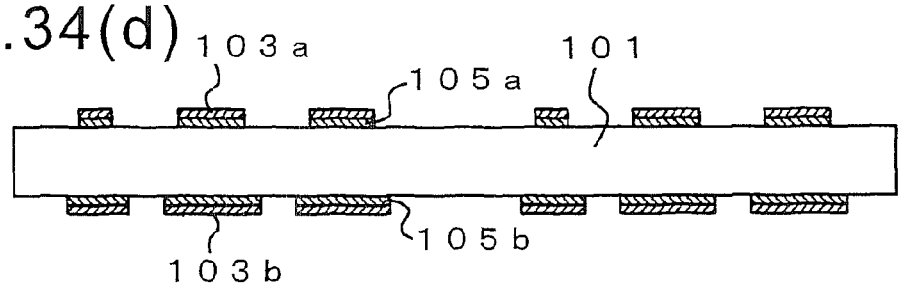

Next, as shown in FIG. 34(d), the photoresist films 103a and 103b are developed, and using the thus developed resist patterns as masks, the corrosion resistant metal films 102a and 102b are patterned, thereby forming etching masks 105a and 105b as the etching resistant mask members.

When the corrosion resistant metal films 102a and 102b are multilayer films of gold (Au) and chromium (Cr), these two metal layers are separately etched. For example, gold (Au) is etched using a solution prepared by mixing iodine and potassium iodide. After rinsing with water, chromium (Cr) is etched using a solution of cerium(IV) ammonium nitrate.

As described above, the oscillator pattern written on the photomask 104b is larger (wider in the example of FIG. 34) by a predetermined amount than the pattern written on the photomask 104a; therefore, while the oscillator pattern written as the reference pattern is exactly transferred as a mask to form an etching mask 105a on the upper surface of the crystal wafer 101, the mask formed as an etching mask 105b on the lower surface is larger than the etching mask 105a by a predetermined amount in the widthwise direction of the vibrating tines, as shown. Conversely, the reference pattern may be formed on the lower surface as the etching mask 105b, and the larger mask may be formed on the upper surface as the etching mask 105a.

Figure 34E:
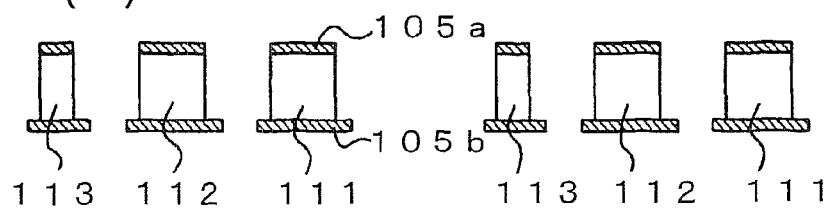

Next, after removing the remaining photoresist films 103a and 103b, the crystal wafer 101 with the etching masks 105a and 105b formed on the upper and lower surfaces thereof is immersed in an etching solution of hydrofluoric acid which is a crystal etching solution; thereupon, the portions not covered with the etching masks 105a and 105b are dissolved from the upper and lower surfaces, as shown in FIG. 34(e). After that, the etching masks 105a and 105b are removed, thus forming the vibrating tines, i.e., the driving tines 111 and 112 and the detection tines 113 of the crystal oscillator pieces. The crystal etching solution can be prepared, for example, by mixing hydrofluoric acid and ammonium fluoride.

The crystal wafer 101 is etched from both the upper and lower surfaces thereof using the etching masks 105a and 105b; here, since the mask pattern of the etching mask 105b is larger than that of the etching mask 105a, as described above, the external shape of each crystal oscillator piece is defined around the etching mask 105*a*, and is little affected by the etching mask 105*b*. As a result, if the positional relationship between the etching masks 105*a* and 105*b* becomes somewhat displaced due to manufacturing errors, the external shape of the crystal oscillator piece is essentially unaffected.

Forming the crystal oscillator by the above manufacturing method is equivalent to forming its external shape by single-sided etching. Here, the lower etching mask 105*b* may be formed as a blanket mask that covers the entire lower surface of the crystal wafer 101, but the reason that the oscillator pattern larger than that for the etching mask 105*a* is written to form the etching mask 105*b* and that the etching is performed from both the upper and lower surfaces is to prevent stagnation of the etching solution and to ensure quick and precise etching.

Figure 1:
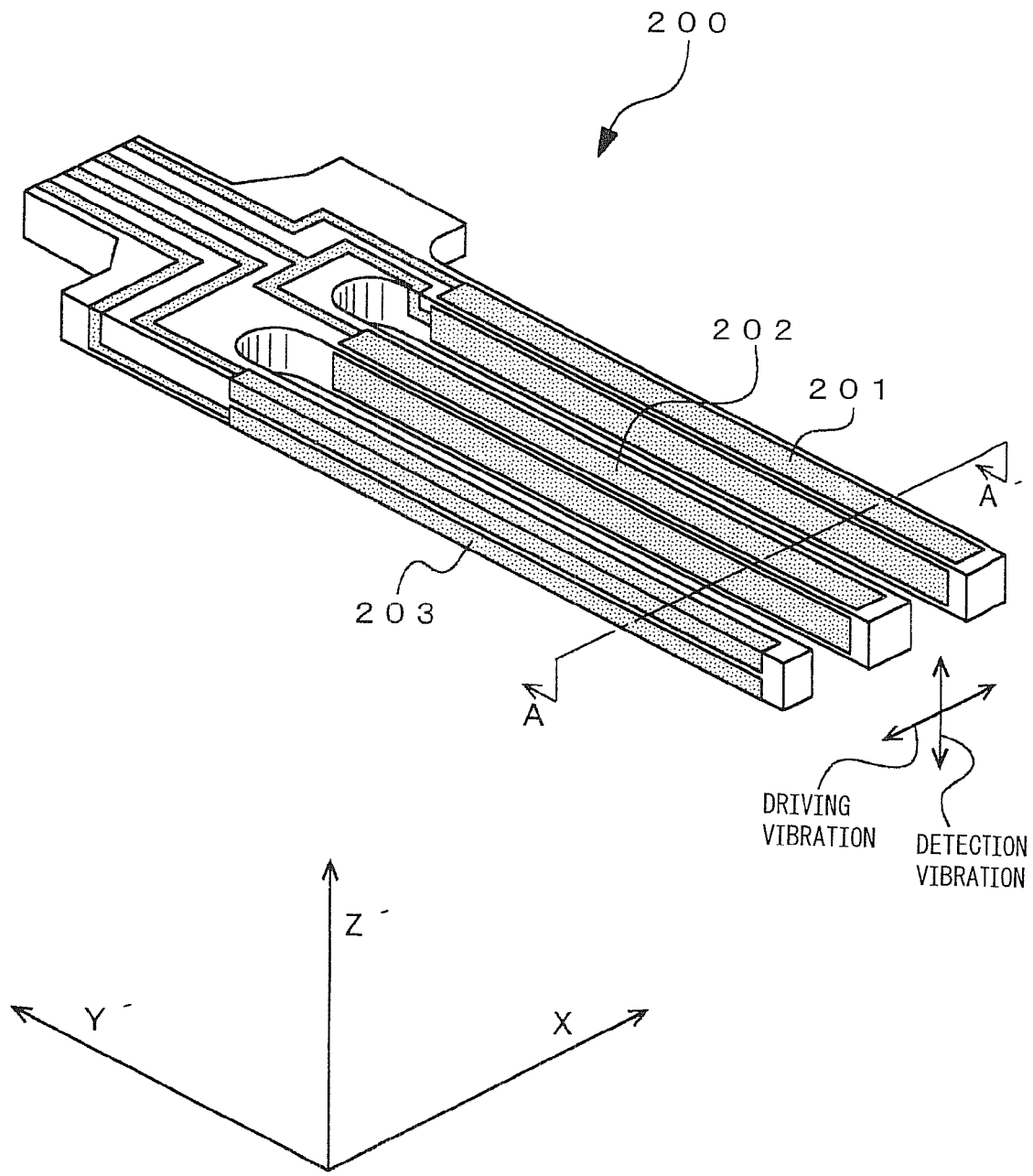
FIG. 1 is a perspective view showing one example of a prior art crystal oscillator.
Figure 3A:
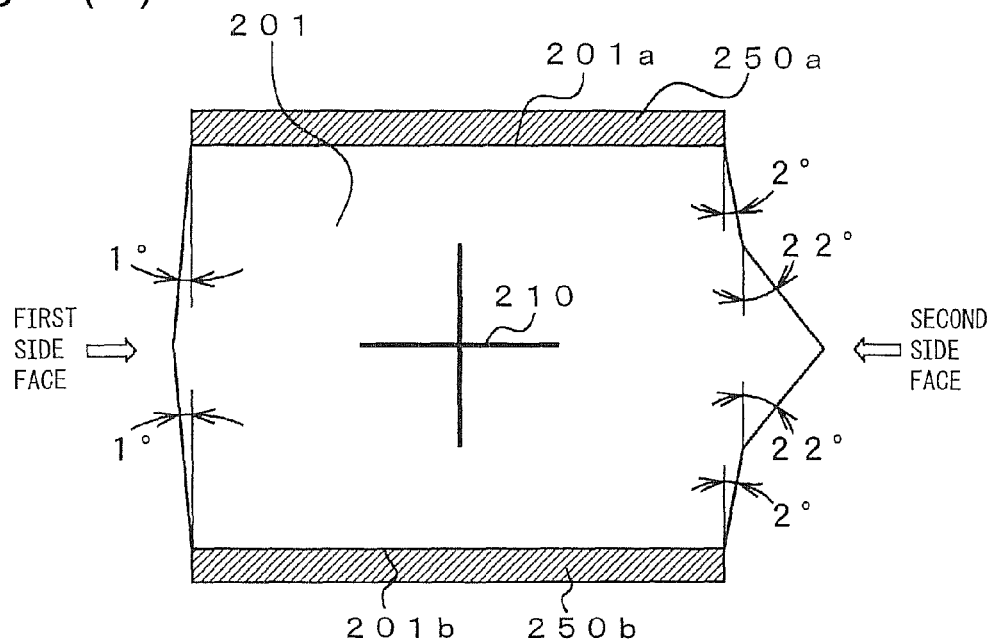
FIGS. 3(a) and 3(b) are enlarged cross-sectional views for explaining how residues are formed on the vibrating tine of the prior art crystal oscillator.
Figure 3B:
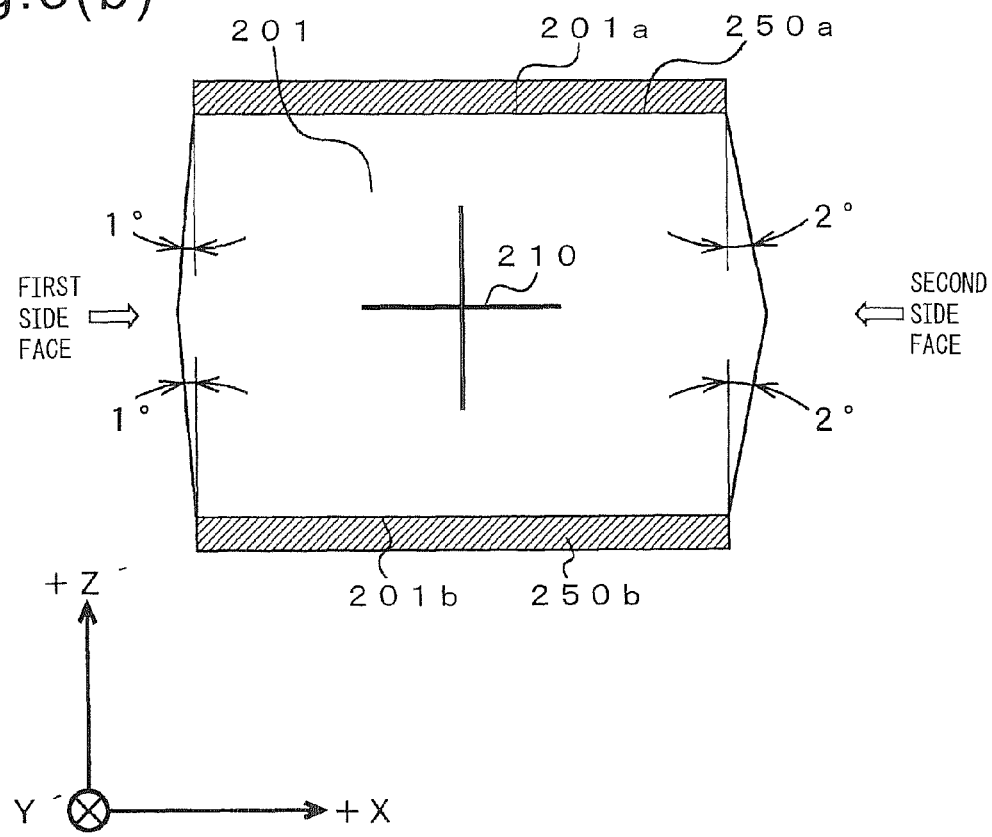

In FIG. 34, the driving tines 111 and 112 and the detection tine 113 are shown as having no residues for ease of illustration, but actually residues are formed thereon. That is, the cross section of the crystal oscillator formed by the external shape forming step equivalent to single-sided etching becomes top-bottom and left-right asymmetrical due to the etching anisotropy of the crystal, as in the case of the driving tine of the prior art shown in FIG. 3, resulting in the generation of leakage vibration. However, since this leakage vibration is not due to the etching mask displacement, but due to the etching anisotropy of the crystal (the property that the etch rate is different in different directions of the crystal), the cross-sectional shape of the vibrating tine after the etching can be estimated in advance. In the example of FIG. 34, only the cross sections of the vibrating tines are shown, but actually, the external shape of the entire structure of the crystal oscillator 110 shown in FIG. 32 is formed in this external shape forming step (step ST41).

Next, a description will be give of how the etching masks 105*a* and 105*b* arranged on the upper and lower surfaces of the crystal wafer 101 are set different in size.

Figure 35A:
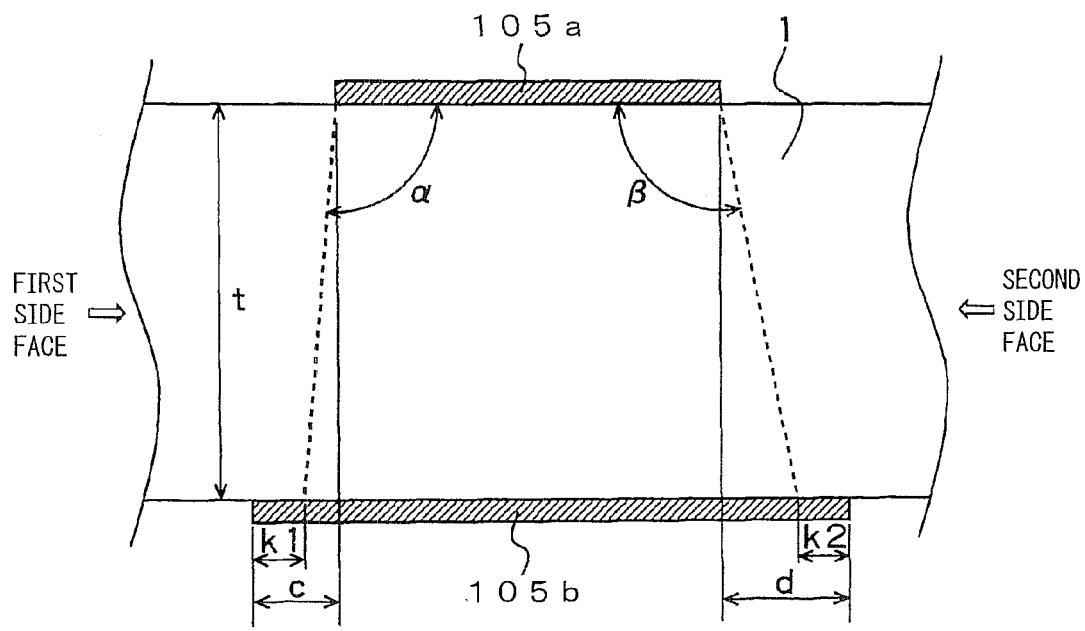
FIGS. 35(*a*) and 35(*b*) are enlarged cross-sectional views showing the driving tine of the crystal oscillator whose external shape is formed according to the third manufacturing method of the present invention by using an upper etching mask and a lower etching mask which is larger by a predetermined amount than the upper etching mask.
Figure 35B:
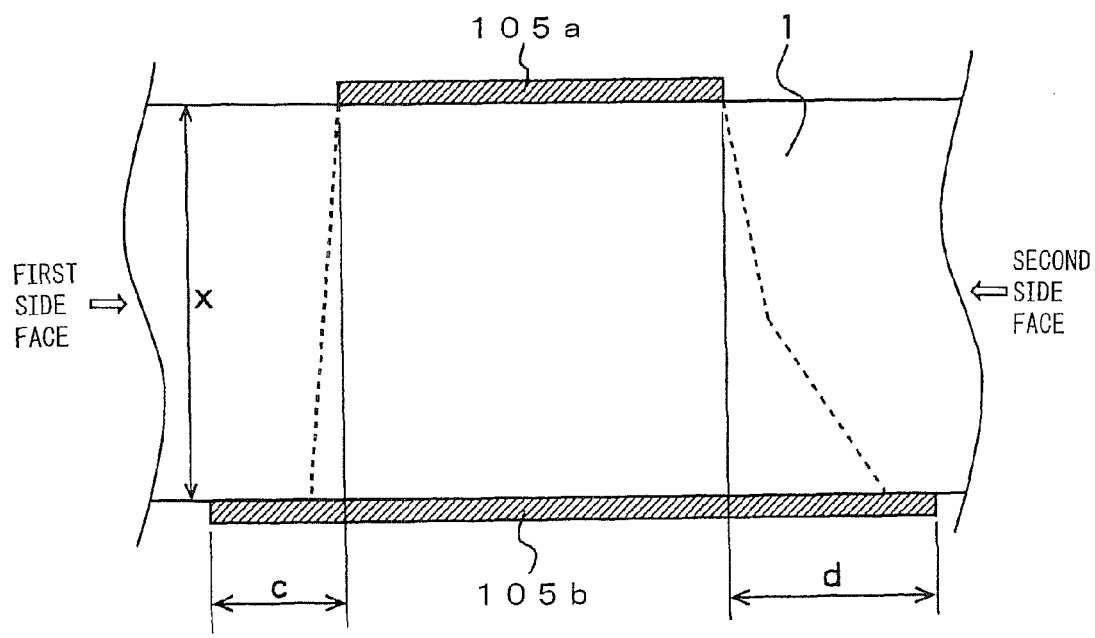

FIG. 35 is an enlarged cross-sectional view showing one example of the driving tine of the crystal oscillator whose external shape is formed using the upper etching mask 105*a* and the lower etching mask 105*b* that has a mask pattern larger by a predetermined amount than that of the upper etching mask 105*a*.

The difference between FIG. 35(*a*) and FIG. 35(*b*) lies in the shape of the residue formed on the second side face. In the example of FIG. 35(*a*), a single sloping face is formed by the residue on the second side face, while in the example of FIG. 35(*b*), two sloping faces are formed.

Here, let the accuracy of registration between the etching masks 105*a* and 105*b* by ±p, the amount of offset at the first side face by k1, the amount of offset at the second side face by k2, the etching angle at the first side face by α, the etching angle at the second side face by β, and the thickness of the crystal wafer 101 by t; then, it is preferable that the length "c" of a first protruding portion and the length "d" of a second protruding portion of the etching mask 105*b* relative to the etching mask 105*a* satisfy the following relations.

$$c = t \times \tan(\alpha - 90°) + k1$$

$$d = t \times \tan(\beta - 90°) + k2$$

where k1>p and k2>p

According to the above configuration, since the amounts of side face offset, k1 and k2, are each set to a value larger than the mask registration accuracy p, even when a positional displacement occurs between the upper and lower etching masks 105*a* and 105*b* due to an alignment error of the apparatus, a single sloping face etched from the upper surface is formed on the first side face, and thus a residue of a prescribed shape is always formed on the first side face. Similarly, a single sloping face etched from the upper surface is formed on the second side face, and thus a residue of a prescribed shape is always formed on the second side face. Accordingly, the resulting external shape is always the same and is unaffected by the mask displacement.

By setting the etching masks in this way, the cross section of the driving tine of the crystal oscillator can be formed into a prescribed shape. However, as shown in FIG. 35(*b*), the residue on the second side face may be formed so as to have two sloping faces. Such a shape can be achieved, for example, by changing the etching time. Changing the etching time here means shortening the etching time. As an example, the etching time is shortened by 20 to 30% compared with the etching time used to achieve the shape of FIG. 35(*a*).

As is known, on the second side face of the crystal the residue is formed in two steps, first at an angle of about 2° relative to the Z' axis and then at an angle of about 22°. The residue forming an angle of about 22° will eventually be etched away as the etching proceeds. Accordingly, when the etching time is long, the shape shown in FIG. 35(*a*) results, but when the etching time is short, the shape shown in FIG. 35(*b*) results.

Several techniques are known that can form the cross section of the driving tine of the crystal oscillator into a prescribed shape, but what is important is to process the crystal oscillator so that the cross-sectional shape of the driving tine can be estimated in advance. If the shape of the residue can be correctly known in advance (that is, if it is properly managed), the direction of the leakage vibration of the crystal oscillator can be determined.

Figure 36:
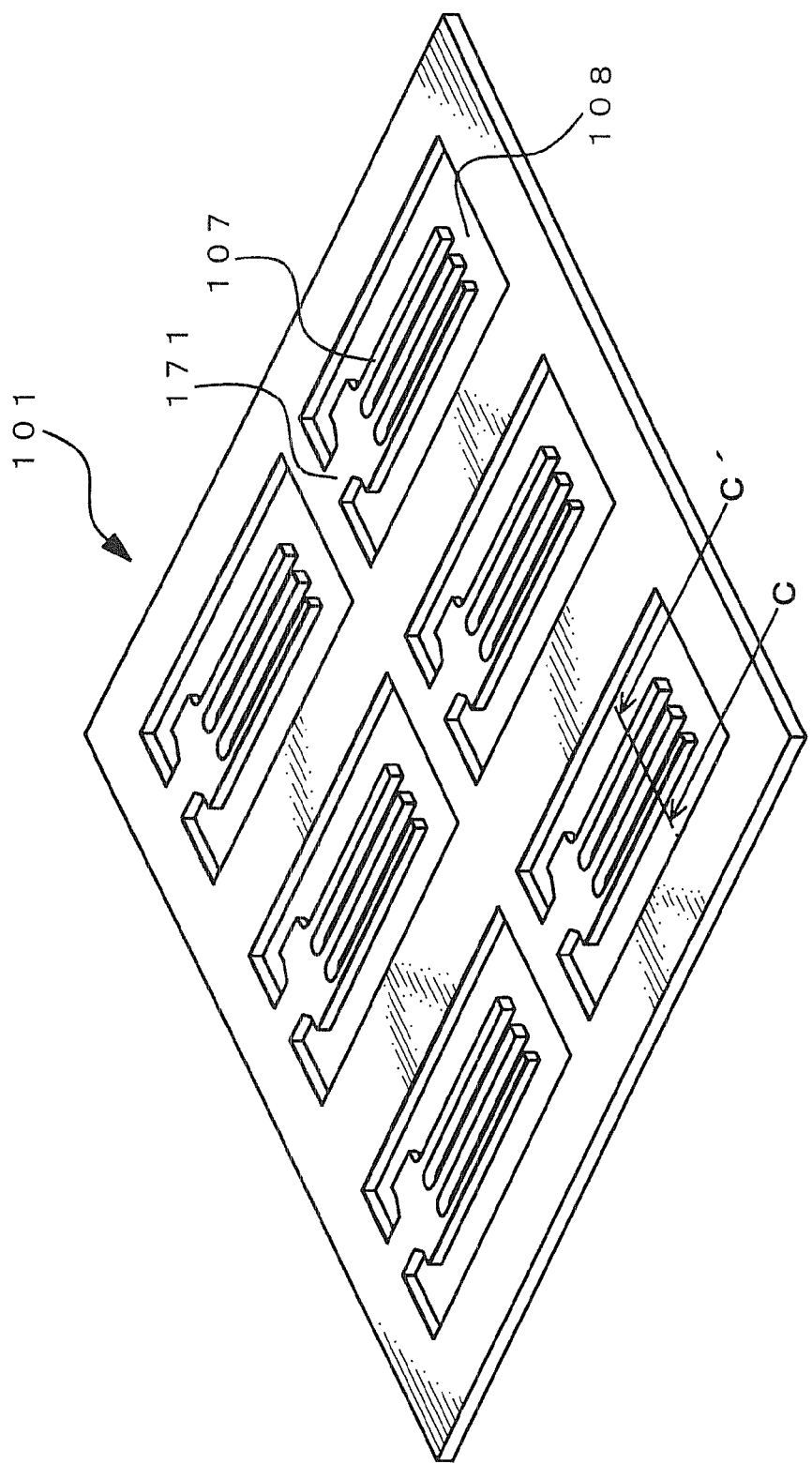
FIG. 36 is a perspective view showing a plurality of crystal oscillator pieces formed on a crystal wafer in the external shape forming step according to the third manufacturing method of the present invention.

FIG. 36 is a schematic perspective view for explaining the plurality of crystal oscillator pieces 107 formed on the crystal wafer 101 in the external shape forming step.

Each crystal oscillator piece 107 is formed as if it were cut out in a dissolved portion 108 dissolved away by etching, and each individual crystal oscillator piece 107 is connected to the crystal wafer 101 by a connecting portion 171. The connecting portion 171 is a so-called cutoff portion which is cut off after the balance adjustment is completed. When the connecting portion 171 is cut off in a subsequent step, the crystal oscillator piece 107 is separated from the crystal wafer 101 and completed as the crystal oscillator 110 shown in FIG. 32.

FIG. 36 has shown an example in which six crystal oscillator pieces 107 are formed on the same crystal wafer 101, but the number is not limited to that shown in the example of FIG. 36. The size and shape of each crystal oscillator piece 107 are chosen according to the crystal oscillator performance and characteristics desired to be achieved, and the size of the crystal wafer 101 is determined accordingly. However, by increasing the number of crystal oscillator pieces 107 to be formed on the same crystal wafer 101, the manufacturing cost can be reduced correspondingly because a larger number of crystal oscillator pieces can then be manufactured in a collective manner.

FIG. 37 is a diagram for explaining the details of the electrode forming step (step ST42).

FIG. 37 is a schematic cross-sectional view taken along line C-C' in FIG. 36, and shows the cross sections of the driving tines 111 and 112 and the detection tine 113. The residues are not shown in FIGS. 37 to 39 for ease of illustration.

The cross-sectional shape of each of the driving tines 111 and 112 becomes top-bottom and left-right asymmetrical due to the etching anisotropy of the crystal because the etching mask on one side is larger, as previously described with reference to FIG. 5. The top-bottom and left-right asymmetry arising from the etching anisotropy is such that the side face on the +X side forms an angle of about 2° with the Z' axis and the side face on the −X side forms an angle of about 1° with the Z' axis; by thus characterizing the external shape of the crystal oscillator to be formed, the direction of the leakage vibration can be estimated in advance. That is, since the direction of the leakage vibration expected to occur from the shape of the driving tines 111 and 112 can be predicted, the cut-out is provided based on the prediction. The manufacturing process will be described in detail below.

Figure 37A:
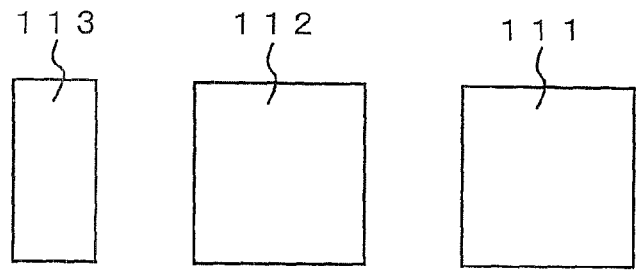
FIGS. 37(*a*) to 37(*d*) are cross-sectional views explaining an electrode forming step according to the third manufacturing method of the present invention.
Figure 37B:
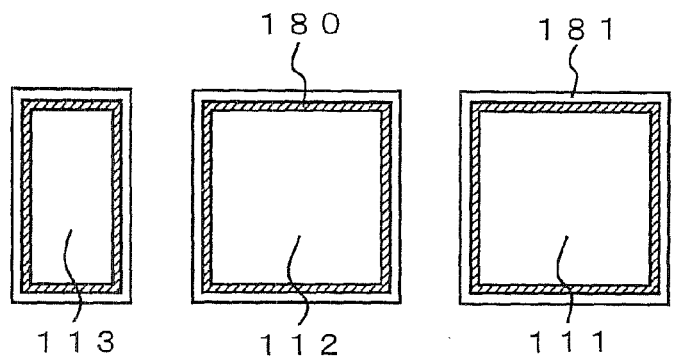

As shown in FIG. 37(b), a metal film 180 and a photoresist film 181 overlying the metal film 180 are formed on the surfaces of the driving tines 111 and 112 and detection tine 113 shown in FIG. 37(a).

In the example of FIG. 37(b), the metal film 180 is shown as a single-layer film for ease of illustration, but it may be formed as a multilayer film by depositing gold (Au) over a base layer of chromium (Cr). The metal film 180 can be formed using known evaporation or sputtering techniques. The photoresist film 181 can be formed using known spray coating or electrodeposition techniques.

Figure 37C:
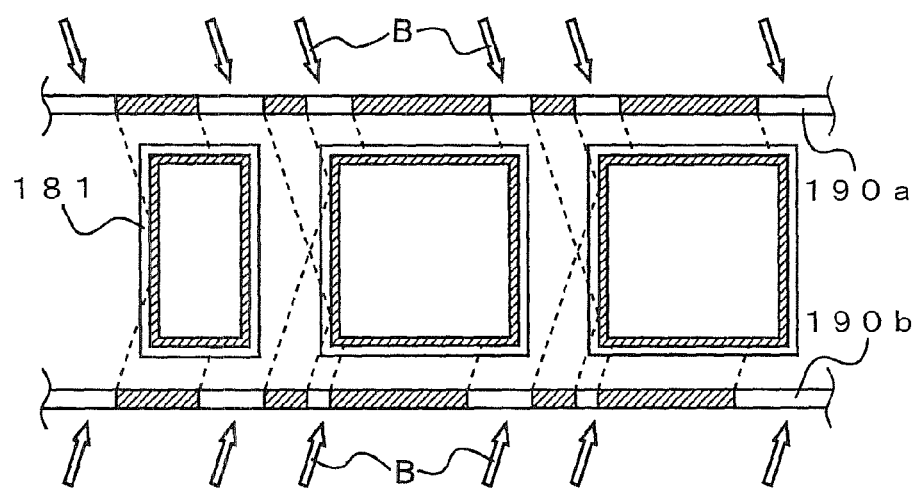

Next, as shown in FIG. 37(c), two photomasks 190a and 190b, on which the patterns of the electrodes to be formed on the driving tines 111 and 112 and detection tine 113 are written, are placed over the upper and lower surfaces of the crystal wafer 101, and the photoresist film 181 is exposed by radiating light (indicated by arrows B) from above the respective photomasks 190a and 190b. FIG. 37(c) shows an example of so-called oblique exposure in which light is directed obliquely.

Figure 37D:
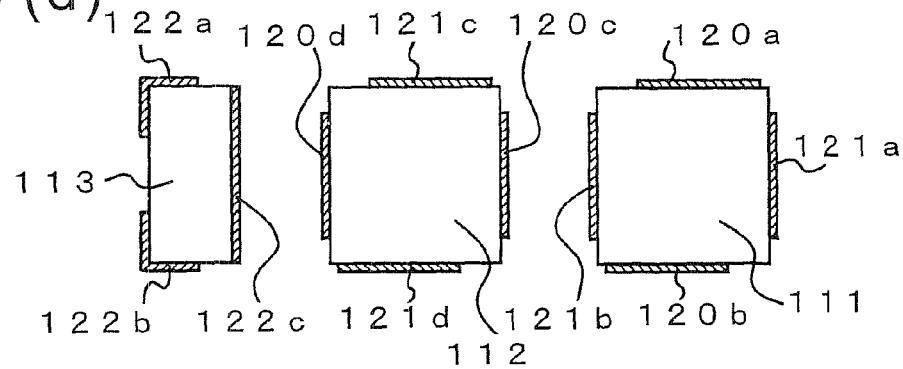

Next, as shown in FIG. 37(d), the photoresist film 181 is developed, and using the thus developed resist pattern as a mask, the metal film 180 is patterned, thereby forming driving electrodes 120a, 120b, 120c, 120d, 121a, 121b, 121c, and 121d, detection electrodes 122a and 122b, and a ground electrode 122c.

Figure 38:
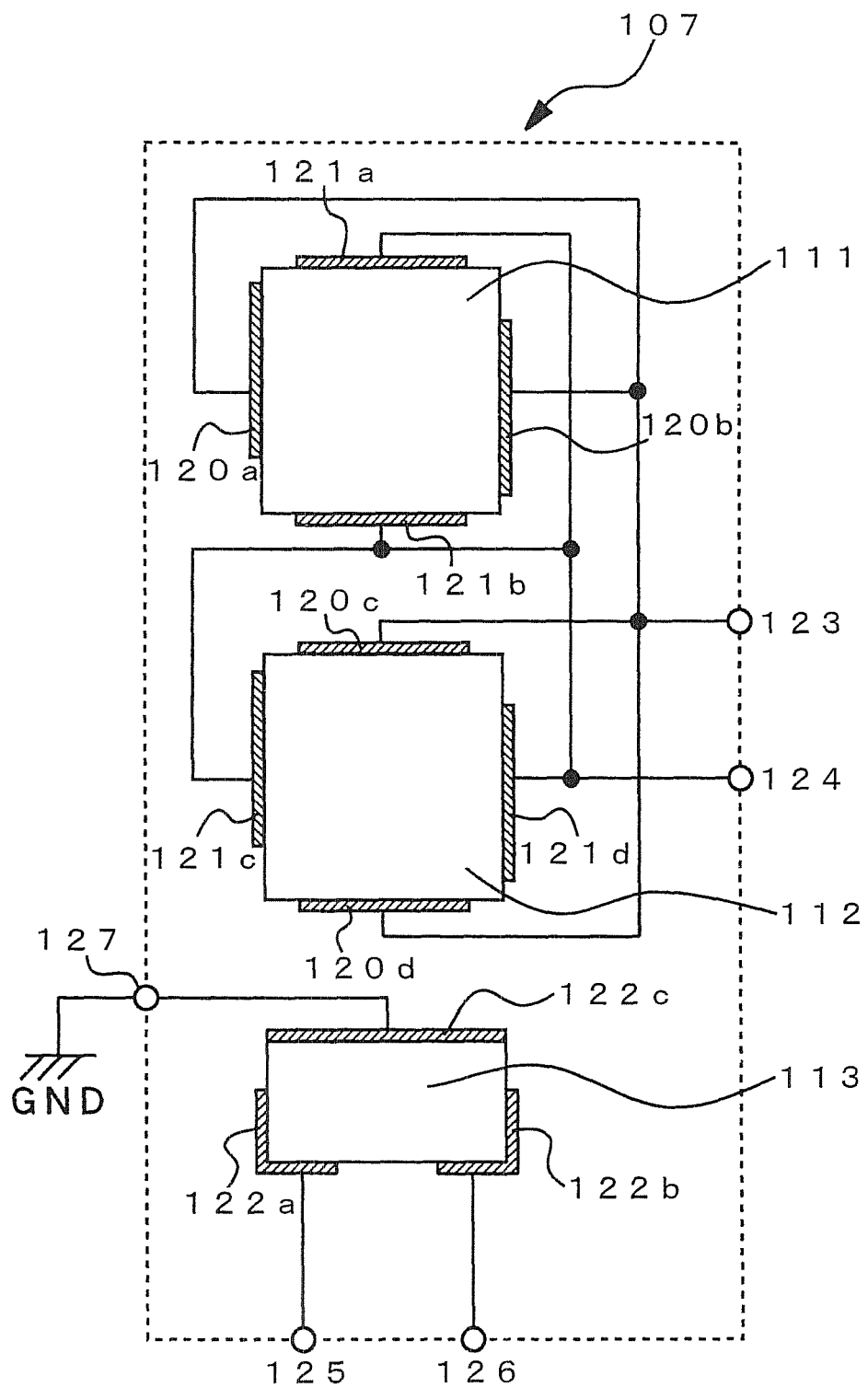
FIG. 38 is an enlarged cross-sectional view showing one example of how electrodes formed on the vibrating tines in the electrode forming step according to the third manufacturing method of the present invention are connected.

FIG. 38 is a diagram showing one example of how the electrodes formed in the electrode forming step on the vibrating tines, i.e., the driving tines 111 and 112 and detection tine 113, are connected.

The driving electrodes 120a and 120b are formed on the principal faces, i.e., one pair of opposite faces, of the driving tine 111, and the driving electrodes 121c and 121d are formed on the principal faces, i.e., one pair of opposite faces, of the driving tine 112. Similarly, the driving electrodes 121a and 121b are formed on the side faces, i.e., the other pair of opposite faces, of the driving tine 111, and the driving electrodes 120c and 120d are formed on the side faces, i.e., the other pair of opposite faces, of the driving tine 112.

These driving electrodes 120a, 120b, 120c, and 120d are electrically connected together and output via a driving electrode terminal 123. Similarly, the driving electrodes 121a, 121b, 121c, and 121d are electrically connected together and output via a driving electrode terminal 124.

On the other hand, the detection electrodes 122a and 122b as a pair of electrodes are respectively formed along two edges of the detection tine 113, and are output via detection electrode terminals 125 and 126, respectively. The ground electrode 122c formed on the face opposite the detection electrodes 122a and 122b is output via a ground electrode terminal 127 and connected to the ground (0 V) of a circuit not shown. However, the electrode structure or electrode connection structure shown in FIG. 38 is not limited to the illustrated example, but can be determined as appropriate according to the specification of the crystal oscillator.

FIG. 39 is a top plan view of one of the crystal oscillator pieces 107 formed on the crystal wafer 101 in FIG. 36, showing one example of the cut-out 130.

In FIG. 39, the driving electrodes 120a and 121c are formed on the upper principal faces of the respective driving tines 111 and 112 of the crystal oscillator piece 107, and each of the driving electrodes 120a and 121c is provided with the cut-out 130 for forming the adjustment area 116 used for balance adjustment. In the example shown in FIG. 39, the cut-out 130 is formed as a long narrow region extending longitudinally along one entire side of each of the driving electrode 120a and 121c. More specifically, the cut-out 130 is formed with its substantially widthwise center C2 displaced from the substantially widthwise center C1 of the driving tine 111, 112 in the widthwise direction of the driving tine 111, 112. In the adjustment area 116, the driving electrode 120a, 121c is not formed but the crystal surface is exposed.

In the adjustment area 116 where the crystal surface is exposed, the crystal surface is dissolved by re-etching in the subsequent balance adjustment step, and the cross-sectional shape of the driving tine 111, 112 is adjusted so as to suppress the generation of leakage vibration. In the example of FIG. 39, the cut-out 130 is provided along one edge of the driving tine 111, 112, i.e., the edge in the −X axis direction (the left-side edge of the driving tine 111, 112 in the figure), based on the direction of the leakage vibration, but this is only one example, and the cut-out 130 may be provided along the opposite side edge, i.e., the edge in the +X axis direction, based on the direction of the leakage vibration.

In either case, the substantial center C2 of the cut-out 130 must be displaced relative to the substantially widthwise center C1 of the driving tine 111, 112.

That is, since the balance is adjusted by etching the crystal in the balance adjustment step ST4 using the electrode processed in the electrode processing step as a mask, the cut-out 30 must be provided in such a portion that the balance of the crystal oscillator can be changed by etching the driving tine 111, 112. In FIG. 39, the cut-out 130 is formed along one entire side of each of the driving electrode 120a and 121c, which serves to increase the amount of etching of the driving tine 111, 112, and hence, the structure is suitable when adjusting the crystal oscillator whose leakage vibration is relatively large.

In the example shown in FIG. 39, the cut-out 130 is formed along one side edge of the driving electrode 120a, 121c, but its shape may be further expanded rightward in the figure. By thus increasing the area of the cut-out 130, the range of the leakage amount adjustment can be further expanded. It should be noted, however, that if the cut-out 130 is expanded rightward beyond the centerline C1 of the vibrating tine, the adjustment range becomes narrower because of the effect that works to adjust the balance in the opposite direction.

FIG. 40 is a top plan view of a portion of the crystal oscillator piece 107, showing another example of the cut-out 130 provided in each electrode.

Figure 40A:
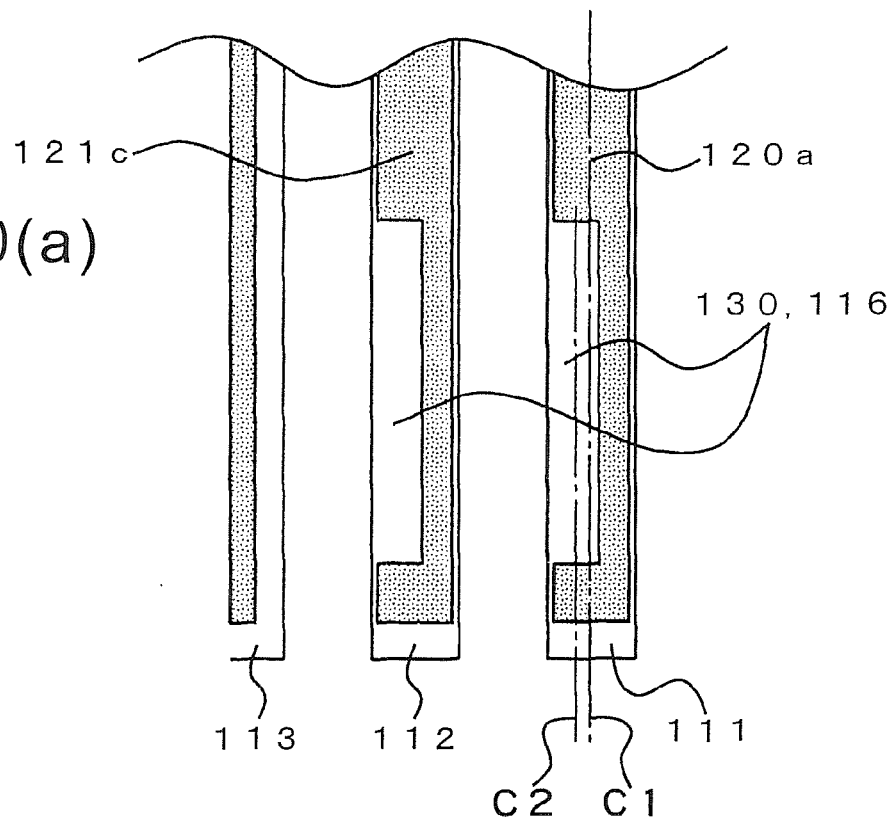
FIGS. 40(*a*) and 40(*b*) are top plan views showing alternative examples of the electrodes formed in the electrode forming step according to the third manufacturing method of the present invention are connected.
Figure 40B:
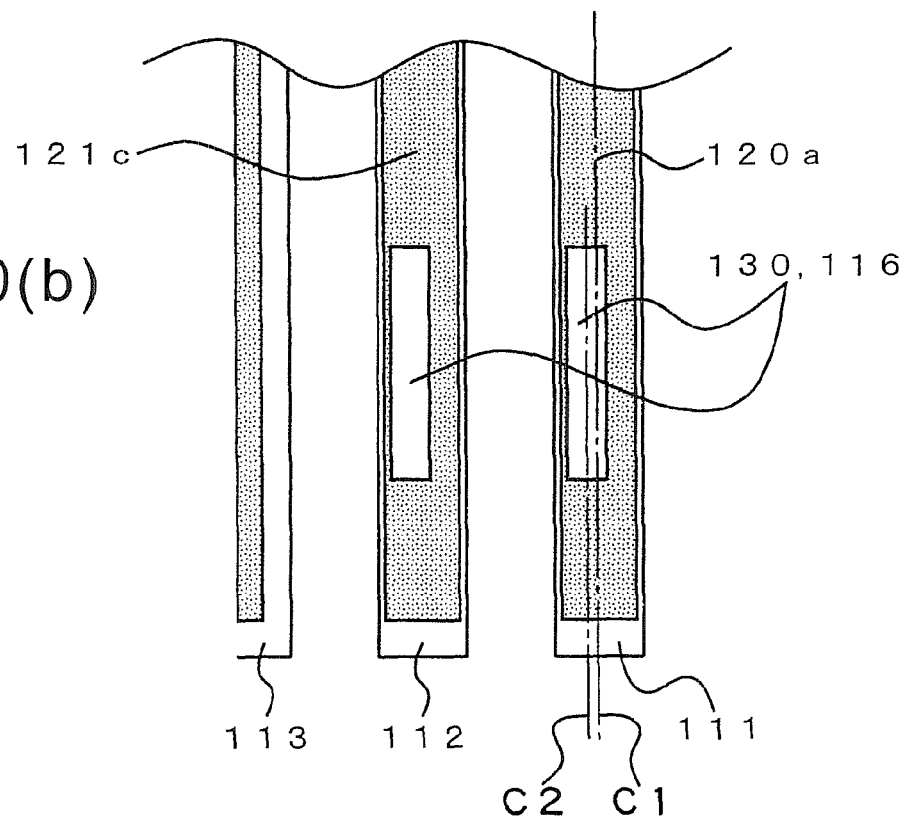

In FIG. 40(a), the cut-out 130 is formed in a portion of the driving electrode 120a, 121c, and in FIG. 40(b), the cut-out 130 is formed in such a manner as to partially hollow out the driving electrode 120a, 121c. As in FIG. 39, the cut-out 130 is formed with its substantially widthwise center C2 displaced from the substantially widthwise center C1 of the driving tine 111, 112 in the widthwise direction of the driving tine 111, 112.

The cut-out 130 shown in FIG. 40 is substantially rectangular in shape, but it is not limited to this particular shape; for example, the cut-out 130 may be formed in a circular or elliptical shape, or a plurality of such cut-outs may be provided in each electrode. In FIGS. 40(a) and 40(b), since the cut-out 130 is formed only in a portion of the driving electrode 120a, 121c, the amount of etching of the driving tine 111, 112 is small, and the structure is therefore advantageous when adjusting the crystal oscillator whose leakage vibration is relatively small.

When the cut-out 130 is formed in a portion of the driving electrode 120a, 121c as shown in FIG. 40, if the area of the cut-out 130 is the same the amount of adjustment becomes smaller as the cut-out 130 is located nearer to the distal end of the driving tine 111, 112, and becomes larger as the cut-out 130 is located nearer to the base of the driving tine 111, 112. In this way, by changing the position of the cut-out 130, the amount of adjustment can be changed.

Figure 41:
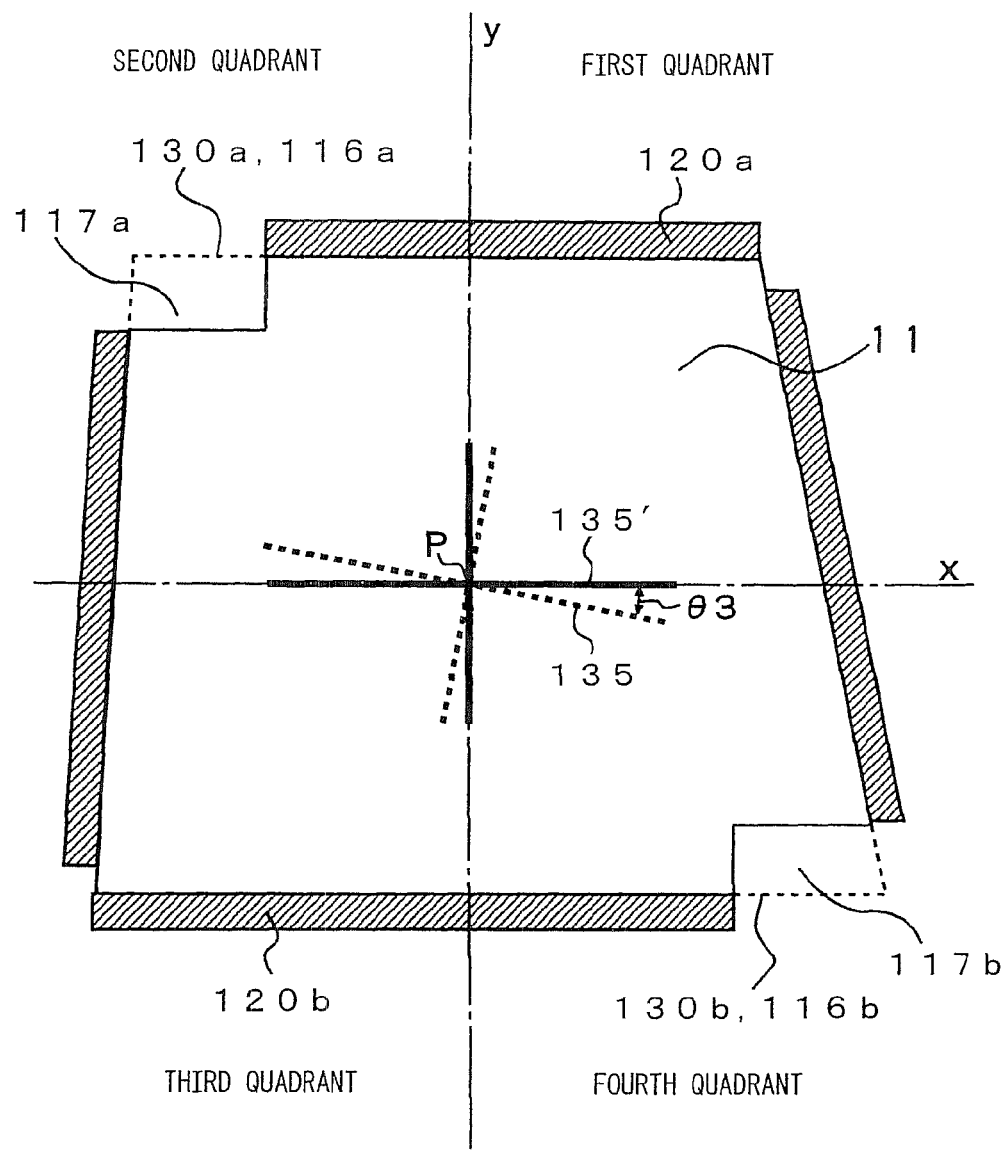
FIG. 41 is an enlarged cross-sectional view for explaining how the second and fourth quadrants of the driving tine of the crystal oscillator piece are etched off in a balance adjustment step according to the third manufacturing method of the present invention.

FIG. 41 is a diagram for explaining the balance adjustment step (step ST43).

In the balance adjustment step, after the driving electrodes on the driving tines 111 and 112 have been formed in the prescribed shape in the preceding electrode forming step, the crystal wafer 101 is re-etched in a collective manner by using the thus formed driving electrodes as masks, and the cross-sectional shapes of the driving tines 111 and 112 of the crystal oscillator piece 107 are corrected to adjust the balance of the vibration, thereby adjusting the leakage amount and suppressing the leakage vibration of the crystal oscillator piece 107.

FIG. 41 is a cross-sectional view taken along line D-D' in FIG. 39 and schematically showing, in enlarged detail, the cross section of the driving tine 111 of the crystal oscillator piece 107 formed on the crystal wafer 101. As earlier described, since one etching mask is larger than the other, this cross-sectional shape is not affected by the mask displacement but becomes top-bottom and left-right asymmetrical due to the etching anisotropy of the crystal.

Because of the thus characterized shape, the principal axis 35 (dashed line) of the driving tine 111 is displaced by an angle θ3 relative to the X axis as shown, resulting in the generation of leakage vibration whose direction can be estimated in advance.

Then, based on the estimated direction of the leakage vibration, the cut-out 130 is formed in each of the driving electrodes 120a and 121c of the driving tines 111 and 112, as shown in FIG. 39 or 40. In the case of the driving tine 111 shown in FIG. 41, the cut-outs 130a and 130b are formed along the edges of the driving electrodes 120a and 121c formed on the respective principal faces. The cut-out 130a on the upper side is formed with its substantially widthwise center displaced relative to the substantially widthwise center of the driving tine 111 in the −X axis direction. On the other hand, the cut-out 130b on the lower side is formed with its substantially widthwise center displaced relative to the substantially widthwise center of the driving tine 111 in the +X axis direction.

The area where the crystal surface of the driving tine is exposed in the cut-out 130a is the adjustment area 116a, and the area exposed in the cut-out 130b is the adjustment area 116b.

The surface portions of the crystal oscillator piece exposed in the cut-outs 130a and 130b are etched off by collective re-etching in the balance adjustment step, forming etch-off portions 117a and 117b (dashed lines in the figure). In the example shown in FIG. 41, the etch-off portion on the upper side is indicated at 117a, and the etch-off portion on the lower side is indicated at 117b. The thickness of the vibrating tine 111 is reduced in these etch-off portions.

As previously described, the amount of etching of the cut-outs 130a and 130b (the etch-off portions 117a and 117b) is determined by considering the formation of residues based on the result of the experiment conducted by the present inventor and the external shape of the crystal oscillator, by estimating the direction of the leakage vibration and the magnitude of the leakage amount, and by converting the amount of etching into an equivalent processing time.

For example, the same etching solution as employed in the experiment for processing the crystal is used, and the conditions such as the temperature of the etching solution are set the same as those used in the experiment. Then, if the magnitude of the leakage amount can be estimated, the amount of etching for the crystal oscillator to be processed can be managed by just managing the etch processing time.

In FIG. 41, when the centroid of the cross section of the driving tine 111 is taken as the origin P, and the first to fourth quadrants are defined by two mutually perpendicular axes x and y passing through the origin P, the etch-off portions 117a and 117b are formed in a pair of quadrants diametrically opposed across the origin P.

In the processing of the cut-outs 130a and 130b, the amount of etching may be the same between any two quadrants diametrically opposed across the origin P and may differ between any two adjacent quadrants.

In the example of FIG. 41, the etch-off portions 117a and 117b are formed in the second and fourth quadrants, because the residue formed at the lower right of the figure is larger than the residue formed at the lower left of the figure, providing the cross-sectional shape such that the balance can be adjusted by etching off the crystal in the fourth quadrant and the crystal in the second quadrant that has an equivalent effect. In such cases as when the positions of the residues are reversed right and left, the tilting of the principal axis of the driving tine 11 can be corrected by forming the cut-outs 130a and 130b in the first and third quadrants, respectively, though not shown here.

FIG. 41 has shown an example in which the etch-off portions 117a and 117b are each formed in such a manner as to straddle between the principal face and side face of the driving tine 111 by etching off an edge portion of the driving tine, but the etch-off portions may be formed only on the respective principal faces. For example, in the case of the cut-outs 130 formed in the electrodes 120a and 121c shown in FIG. 40(b), only the principal faces are etched off.

As described above, according to the present invention, the etch-off portions of the cut-outs 130a and 130b are formed in such a manner as to be displaced relative to the center of the cross section of the driving tine according to the tilting of the principal axis; since this works to correct the tilting of the principal axis of the driving tine, the leakage vibration can be suppressed effectively. While the above description has dealt with the driving tine 111, the same description applies to the driving tine 112.

Further, in the above-described example, the cut-out 130 is formed on each surface of the vibrating tine 111, i.e., the cut-out 130a on the upper surface and the cut-out 130b on the lower surface, but alternatively, the cut-out 130 may be formed on either one of the upper and lower surfaces, if the leakage amount is small. In this case, the leakage amount can be adjusted at an even finer level.

As described above, according to the third manufacturing method, after forming the external shape of the crystal oscillator and further forming the electrodes, the vibrating tines are processed by re-etching and the leakage amount can thus be adjusted to suppress the generation of leakage vibration. Since the leakage vibration can be adjusted without applying an unnecessary external force to the crystal oscillator, the invention can provide a crystal oscillator manufacturing method that can adjust the leakage vibration stably and accurately without degrading the manufacturing yield, reliability, etc., of the crystal oscillator.

Further, since the etching masks formed on the upper and lower surfaces of the crystal wafer are differently sized, the direction of the leakage vibration can be estimated in advance by characterizing the external shape of the crystal oscillator by performing etching that defines the width through the mask formed on one side; as a result, an electrode having a cut-out provided based on the estimated direction of the leakage vibration can be formed on each driving tine.

Furthermore, since the formation of the residues can be estimated from the characterization of the external shape and the experimental results of the residues, not only the direction of the leakage vibration but the magnitude of the leakage amount can be estimated. As a result, since the amount of etching of the cut-outs can be determined by converting the estimated magnitude of the leakage amount directly into the processing time without having to measure the leakage amount, etc., crystal oscillator pieces whose leakage amount has been adjusted to within the specified value can be manufactured in large quantities efficiently and in an extremely short time by a simplified manufacturing process.

Further, since the plurality of crystal oscillator pieces formed on the crystal wafer are collectively re-etched to adjust the leakage vibration, not only can the number of adjustment steps be drastically reduced, but crystal oscillator pieces having reduced leakage vibrations can be manufactured in large quantities efficiently.

The third manufacturing method can be employed advantageously when manufacturing a large number of crystal oscillator pieces efficiently, because the manufacturing process can be simplified when variations in leakage amount within the crystal wafer are small.

The fourth crystal oscillator manufacturing method according to the present invention will be described below.

The feature of the fourth manufacturing method is that after characterizing the crystal oscillator and forming its external shape, the leakage amount of the crystal oscillator is measured and, based on the thus measured leakage amount, the amount of etching for adjusting the balance is determined. Since the fourth manufacturing method is essentially the same as the third manufacturing method except for some differences, the same elements as those in the third manufacturing method are designated by the same reference numerals, and the description already given will not be repeated here.

Figure 42:
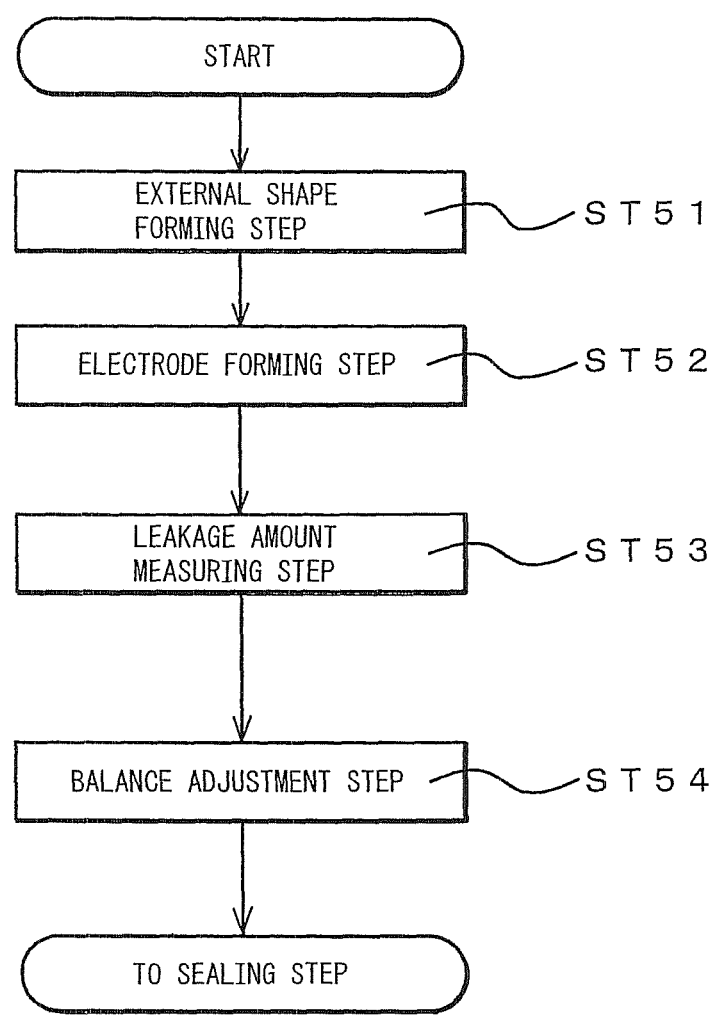
FIG. 42 is a flowchart illustrating the sequence of process steps according to a fourth manufacturing method of the present invention.

FIG. 42 is a flowchart for explaining an overview of the fourth manufacturing method according to the present invention.

The crystal oscillator manufacturing method described here assumes by way of example a manufacturing method that forms a plurality of crystal oscillator pieces on the same crystal wafer and that manufactures an array of such crystal oscillator pieces in a collective manner.

In FIG. 42, the external shape forming step (step ST51) and electrode forming step (step ST52) are the same as the external shape forming step (step ST41) and electrode forming step (step ST42) in the third manufacturing method, and therefore, the description of these steps will not be repeated here.

Next, a leakage amount measuring step (step ST53) is performed that measures the amount of leakage vibration by driving each individual crystal oscillator piece formed on the crystal wafer. In the leakage amount measuring step, the leakage amount should be measured on all the crystal oscillator pieces formed on the crystal wafer, but if variations in leakage amount are small, for example, the leakage amount may be measured by sampling only some of the crystal oscillator pieces.

Next, a balance adjustment step (step ST54) is performed that etches the crystal wafer in a collective manner by a predetermined amount according to the leakage amount by using the electrodes formed in the electrode processing step as masks. In the example shown in FIG. 42, etching is performed on the crystal exposed in the adjustment areas 116 formed in the cut-outs 130 of the respective driving tines 111 and 112. In the fourth manufacturing method, the collective etching in the balance adjustment step is performed only once.

After the leakage vibration adjustment is completed, each individual crystal oscillator is separated from the crystal wafer and sealed in a sealing member to complete the manufacturing of the crystal oscillator as a product. The steps that follow the leakage vibration adjustment are not directly relevant to the present invention, and therefore will not be described.

Next, a detailed description of each step will be given, but since the external shape forming step (step ST51) and the electrode forming step (step ST52) are the same as the corresponding steps in the third manufacturing method, the description of these steps will not be repeated here.

Figure 43:
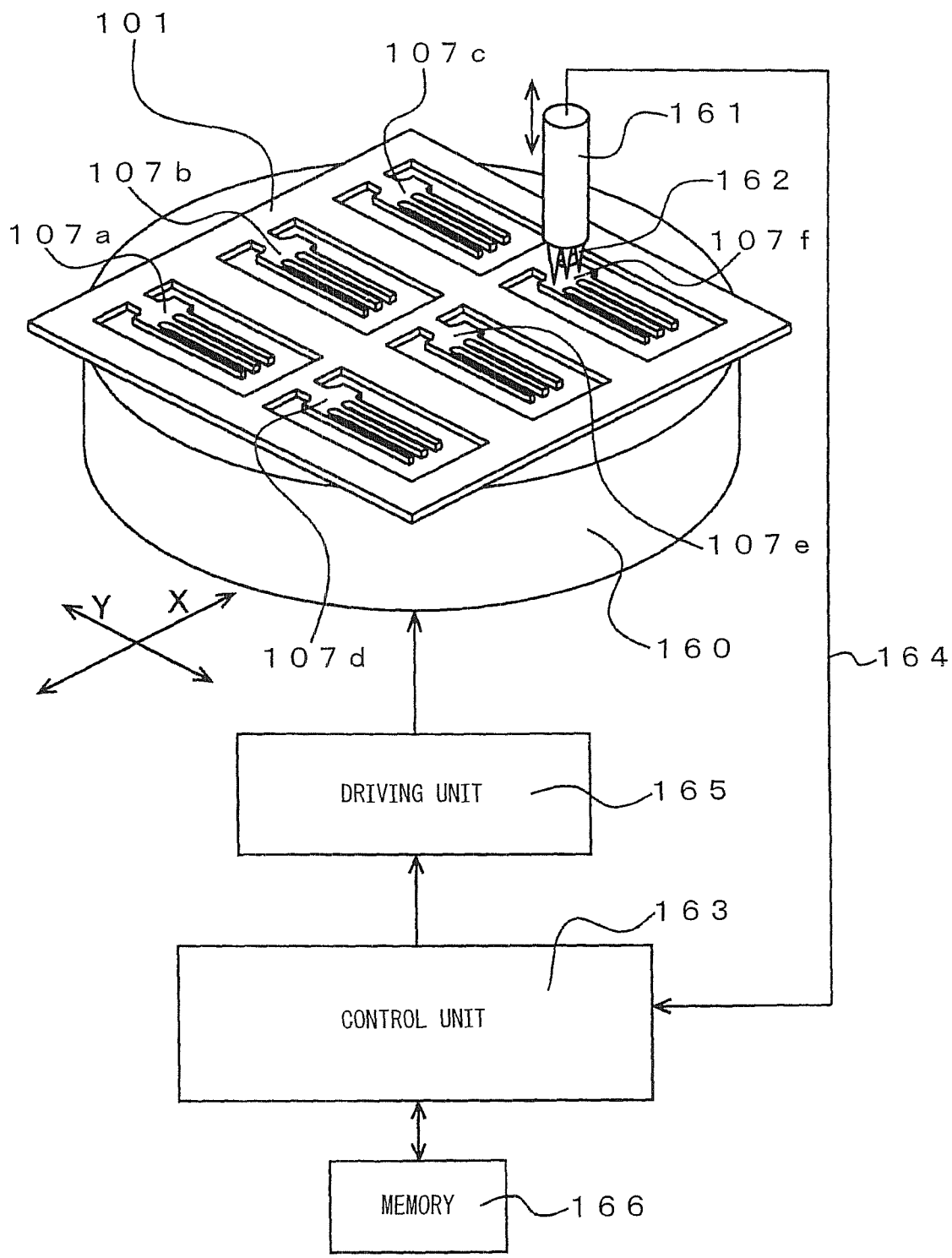
FIG. 43 is an explanatory diagram showing one example of a leakage amount measuring system for implementing a leakage amount measuring step according to the fourth manufacturing method of the present invention.

FIG. 43 is a diagram explaining the details of the leakage measuring step (step ST53) which is a feature of the fourth manufacturing method.

FIG. 43 shows one example of a leakage amount measuring system for implementing the leakage amount measuring step. In FIG. 43, the crystal wafer 101 on which the crystal oscillator pieces 107a to 107f are formed is rigidly mounted on an XY stage 160. A probe 161 having a plurality of electrode terminals 162 is disposed above the XY stage 160, and the electrode terminals 162 of the probe 161 are brought into electrical contact with the driving electrode terminals 123 and 124, detection electrode terminals 125 and 126, and ground terminal 127 (see FIG. 38) formed on each of the crystal oscillator pieces 107a to 107f manufactured on the crystal wafer 101.

A control unit 163 is connected to the probe 161 via a connecting cable 164, and controls the leakage amount measurement. A driving unit 165 drives the XY stage 160 in accordance with a control signal from the control unit 163, and thus moves the crystal wafer 101 in the X or Y direction so that the probe 161 can contact the electrodes of any one of the crystal oscillator pieces. Further, under the control of the control unit 163, leakage amount information of each individual one of the crystal oscillator pieces 107 manufactured on the crystal wafer 101 is stored in a memory 166 connected to the control unit 163, along with the position information of the crystal oscillator piece.

Next, the operation of the leakage amount measuring system will be described. In FIG. 43, the control unit 163 sends a control signal to the driving unit 165 to drive the XY stage 160 and move the crystal wafer 101 so that the electrodes of a designated one of the crystal oscillator pieces 107a to 107f are positioned directly below the probe 161. In the example shown in FIG. 43, the crystal oscillator piece 107f is positioned directly below the probe 161.

Then, the probe 161 is moved down by an up-and-down moving means not shown, and the electrode terminals 162 are brought into contact with the electrodes of the crystal oscillator piece 107f. Next, the control unit 163 sends to the probe 161, via the connecting cable 164, a driving signal for causing the crystal oscillator piece 107f to oscillate and, with the driving signal supplied to the driving electrode terminals 123 and 124 of the crystal oscillator piece 107*f*, the crystal oscillator piece 107*f* starts to oscillate.

Next, the control unit 163 receives a detection signal from the detection electrode terminals 125 and 126 of the crystal oscillator piece 107*f* via the probe 161, detects a leakage signal component from the detection signal, and stores the detected leakage amount in the memory 166 along with the positional relationship information of the crystal oscillator piece 107*f*. That is, the measurement result of the leakage amount measuring step includes the leakage amount of the crystal oscillator piece measured and the positional relationship information of that crystal oscillator piece. The positional relationship information of the crystal oscillator piece is the position information measured as the X-axis position and Y-axis position from the predetermined origin of the XY stage 160. As a matter of course, the leakage amount measurement here is performed without applying an angular velocity.

When the leakage amount measurement of one crystal oscillator piece is completed, the control unit 163 sends a control signal to the driving unit 165 to drive the XY stage 160 and move the crystal wafer 101 so that the electrodes of an adjacent one of the crystal oscillator pieces are positioned directly below the probe 161. For example, when the measurement of the crystal oscillator piece 107*f* is completed, the XY stage 160 is driven so that the crystal oscillator piece 107*e* adjacent to it is positioned directly below the probe 161.

Thereafter, the crystal oscillator pieces formed on the crystal wafer 101 are sequentially driven, and the leakage amount is measured; then, the leakage amount and the positional relationship information of each individual one of the crystal oscillator pieces 107*a* to 107*f* are stored in the memory 166. In this case, the leakage amount information for the six crystal oscillator pieces and the corresponding positional relationship information of the six crystal oscillator pieces are stored in the memory 166.

The leakage amount need not necessarily be measured on all the crystal oscillator pieces manufactured on the crystal wafer 101. For example, if it is expected that variations in leakage amount within the crystal wafer 101 are small, only the crystal oscillator piece 107*a* may be measured, and the measured leakage amount may be assumed to be a value that also represents the other crystal oscillator pieces 107*b* to 107*f*. Such assumption can be made based on the previously measured crystal wafer information or other crystal wafer information, such as the film thickness of the crystal wafer 101 and the etching conditions used in the external shape forming step (step ST51). In this case, the leakage amount information for one crystal oscillator piece and the positional relationship information of each of the six crystal oscillator pieces are stored in the memory 166.

Then, based on the leakage amount information and positional relationship information acquired for each individual crystal oscillator piece in the leakage amount measuring step, re-etching is performed in the subsequent balance adjustment step to adjust the leakage amount. The target value for the amount of etching in the balance adjustment step is determined, for example, by taking the smallest value of all the leakage amounts measured on the crystal wafer or the average value of the leakage amounts of all the crystal oscillator pieces on the crystal wafer, or by taking the leakage amount of a particular one of the crystal oscillator pieces on the crystal wafer as a representative value.

If the smallest value of all the leakage amounts measured is set as the target value of the balance adjustment, the problem of a defective being produced by overetching can be avoided. On the other hand, if the average value taken over the crystal oscillator pieces on the crystal wafer is set as the target value of the balance adjustment, the leakage vibration of each individual crystal oscillator piece on the crystal wafer can be adjusted uniformly. If the leakage amount of a particular one of the crystal oscillator pieces is taken as a representative value and set as the target value of the balance adjustment, it offers a particular advantage in that the leakage amount measurement can be simplified when variations in leakage amount within the crystal wafer are small.

The balance adjustment step (step ST54) in the fourth manufacturing method is basically the same as the balance adjustment step (step ST43 in FIG. 41) in the third manufacturing method.

The amount of etching of the cut-outs 130*a* and 130*b* of the vibrating tine (see FIG. 41) in this balance adjustment step (step ST54) is determined, as earlier described, by converting the amount of etching into an equivalent processing time based on the leakage amount information obtained for each individual crystal oscillator piece in the preceding leakage amount measuring step (step ST53). After the amount of etching is thus determined, then in the balance adjustment step the etching is performed only once based on the converted processing time.

As described above, according to the fourth manufacturing method of the present invention, after characterizing the crystal oscillator and forming its external shape, the leakage amount of the crystal oscillator is measured and, based on the thus measured leakage amount, the amount of etching is determined and the balance adjustment is performed; since the appropriate balance adjustment can be applied to each individual crystal wafer, the invention can provide a manufacturing method that achieves the manufacturing of a high-performance crystal oscillator whose leakage amount is correctly adjusted. Further, since the leakage amount measuring step and the balance adjustment step are each performed only once, the manufacturing process is simplified and the crystal oscillator can be manufactured in a short time.

When the leakage amount varies within the crystal wafer because of the composition, processing conditions, etc., of the crystal wafer, the fourth manufacturing method can be employed advantageously to accommodate such variations occurring within the crystal wafer. Furthermore, even when the leakage amount can be estimated in advance as in the third manufacturing method, a slight leakage can occur due to variations in wafer thickness or variations arising from the formation of electric field forming grooves; in such cases also, since the balance adjustment can be performed according to the leakage amount, the accuracy of the adjustment can be further enhanced.

The fifth manufacturing method according to the present invention will be described below.

The feature of the fifth manufacturing method is that after characterizing the crystal oscillator and forming its external shape, the leakage amount of the crystal oscillator is measured and, based on the thus measured leakage amount, the etching for balance adjustment and the leakage amount measurement are repeated a plurality of times to achieve the manufacturing of a highly precisely adjusted crystal oscillator. Since the fifth manufacturing method is essentially the same as the third and fourth manufacturing methods except for some differences, the same elements as those in the third and fourth manufacturing methods are designated by the same reference numerals, and the description already given will not be repeated here.

Figure 44:
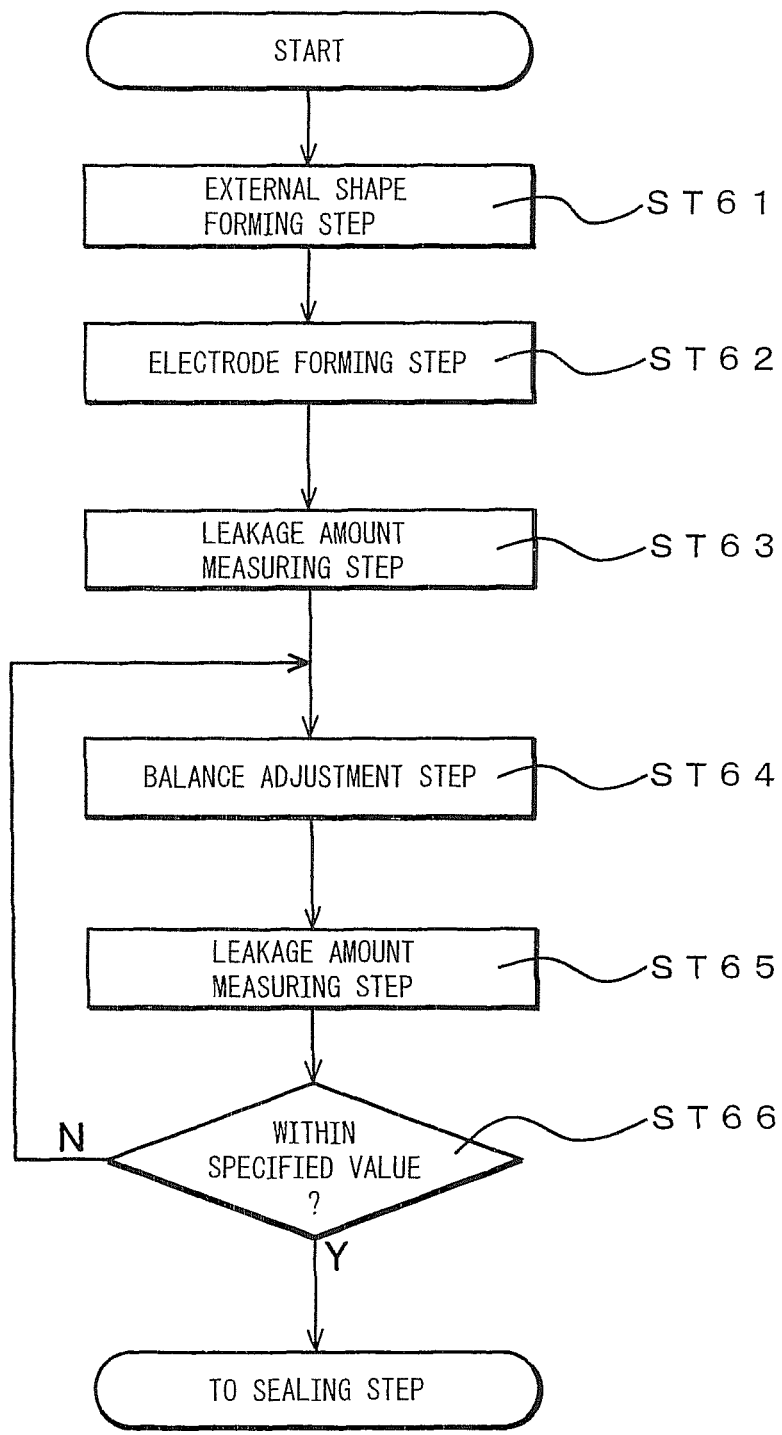
FIG. 44 is a flowchart illustrating the sequence of process steps according to a fifth manufacturing method of the present invention.

FIG. 44 is a flowchart explaining an overview of the fifth crystal oscillator manufacturing method according to the present invention.

The crystal oscillator manufacturing method of this embodiment assumes by way of example a manufacturing method that forms a plurality of crystal oscillator pieces on the same crystal wafer and that manufactures an array of such crystal oscillator pieces in a collective manner.

In FIG. 44, the external shape forming step (step ST61), electrode forming step (step ST62), and leakage amount measuring step (step ST63) are the same as the external shape forming step (step ST51), electrode forming step (step ST52), and leakage amount measuring step (step ST53) in the fourth manufacturing method, and therefore, the description of these steps will not be repeated here.

Next, a balance adjustment step (step ST64) is performed that etches the crystal wafer in a collective manner according to the leakage amount by using the electrodes formed in the electrode processing step as masks. The target value for the amount of etching in the balance adjustment step is determined in the same manner as in the fourth manufacturing method, based on the leakage amount information and positional relationship information acquired for each individual crystal oscillator piece in the preceding leakage amount measuring step (step ST63); more specifically, the target value is determined, for example, by taking the smallest value of all the leakage amounts measured on the crystal wafer or the average value of the leakage amounts of all the crystal oscillator pieces on the crystal wafer, or by taking the leakage amount of a particular one of the crystal oscillator pieces on the crystal wafer as a representative value.

Then, in the balance adjustment step, etching is carried out by setting the amount of etching to a value smaller than the target value and by converting the amount of etching into an equivalent processing time. For example, the amount of etching here is set to about 50% of the target value.

Next, a leakage amount measuring step (step ST65) is carried out again to measure the amount of leakage vibration by driving each individual crystal oscillator piece on the crystal wafer that has been adjusted in the balance adjustment step. By performing this leakage amount measuring step ST65, the result of the leakage amount adjustment made in the preceding balance adjustment step can be checked.

Next, a determination step (step ST66) is carried out that determines, based on the measurement result obtained from the leakage amount measuring step ST65, whether the leakage amount is brought within a specified value. If the determination is affirmative (the leakage amount is brought within the specified value), the leakage vibration adjustment is terminated because the leakage vibration of the crystal oscillator has been suppressed to a negligible level. On the other hand, if the determination is negative (the leakage amount is greater than the specified value), the process returns to step ST64, and the process from step ST64 to step ST66 is repeated until the leakage amount is brought within the specified value.

In this way, the balance adjustment step (step ST64) is repeated a plurality of times until the leakage amount is brought within the specified value; the amount of etching in the balance adjustment step is set, for example, to 50% of the target value determined based on the result of the leakage amount measuring step (step ST65). When repeating the balance adjustment step a plurality of times, etching is carried out in small increments, for example, first by etching 50% of the target value, then etching 50% of the remaining 50%, then etching 50% of the remaining 25%, and so on. Etching in increments of 50% is only one example, and etching may be carried out in other ways, for example, first by etching 80% of the target value, and then etching the remaining 20% in small increments. By etching in small increments, not only can the overetching problem be avoided, but the adjustment accuracy can also be enhanced.

After the leakage vibration adjustment is completed, each individual crystal oscillator is separated from the crystal wafer and sealed in a sealing member to complete the manufacturing of the crystal oscillator as a product. The steps that follow the leakage vibration adjustment are not directly relevant to the present invention, and therefore will not be described here.

If it is determined that the leakage amount is brought within the specified value for some of the crystal oscillator pieces formed on the same crystal wafer but that the leakage amount is greater than the specified value for the others, then the crystal oscillator pieces whose leakage amount has been brought within the specified value may be separated from the crystal wafer and sent to the next sealing step, and the crystal wafer with the other crystal oscillator pieces remaining thereon may be sent back to step ST64. By so doing, the leakage vibration can be reduced even when the leakage amount varies within the same wafer.

In the fifth manufacturing method, the external shape forming step (step ST61), the electrode forming step (step ST62), and the leakage amount measuring step (step ST63) are the same as the corresponding steps in the fourth manufacturing method; therefore, the description of these steps will not be repeated here.

Figure 45:
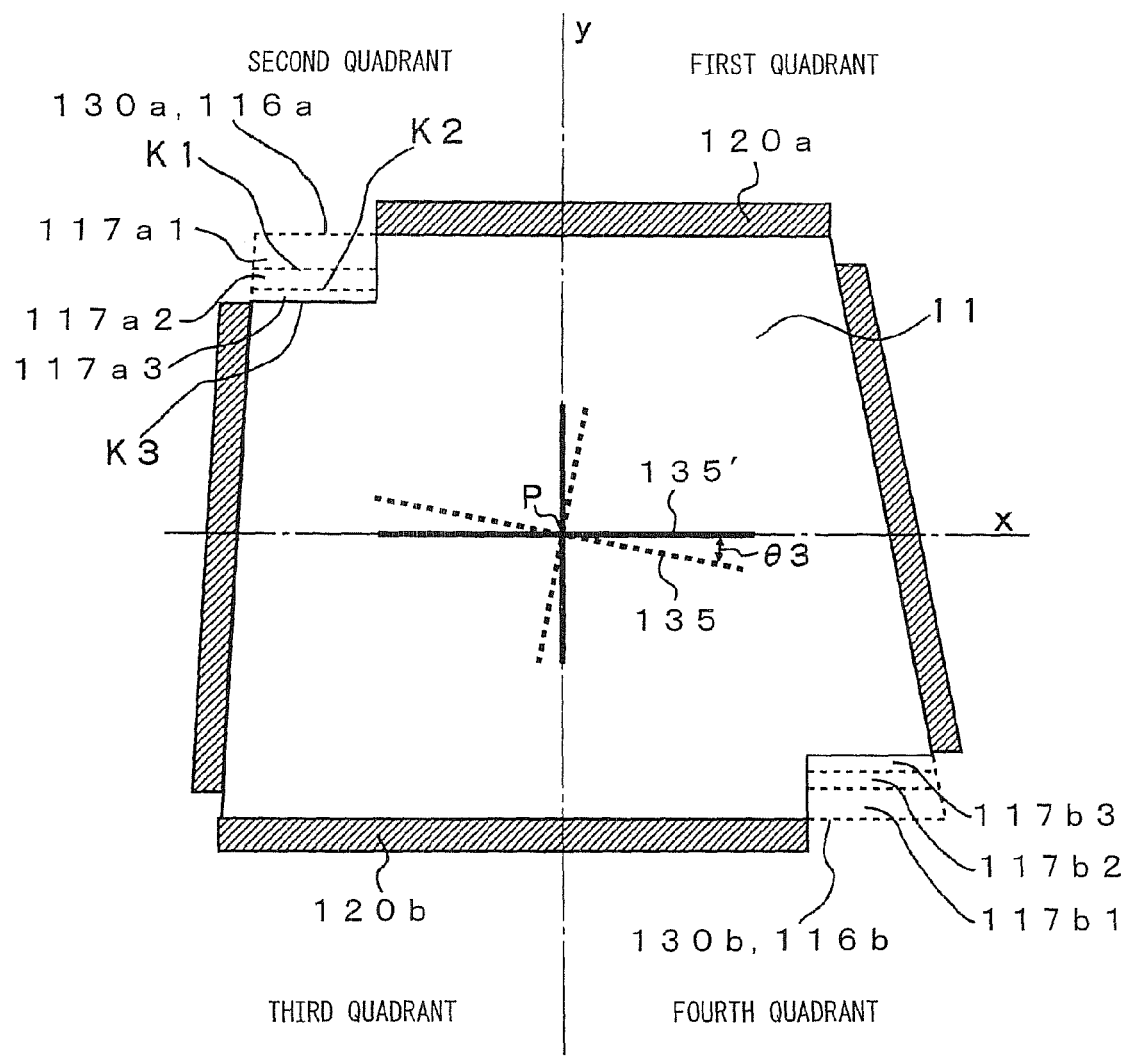
FIG. 45 is an enlarged cross-sectional view how re-etching is performed a plurality of times for balance adjustment in a balance adjustment step according to the fifth manufacturing method of the present invention.

FIG. 45 is a diagram for explaining the details of the process from the balance adjustment step (step ST64) to the determination step (step ST66).

FIG. 45 is a cross-sectional view taken along line D-D' in FIG. 39 and schematically showing, in enlarged detail, the cross section of the driving tine 111 of the crystal oscillator piece 107 formed on the crystal wafer 101. As earlier described, since one etching mask is larger than the other, this cross-sectional shape is not affected by the mask displacement but becomes top-bottom and left-right asymmetrical due to the etching anisotropy of the crystal.

The top-bottom and left-right asymmetry arising from the etching anisotropy and the formation of the cut-outs 130a and 130b and adjustment areas 116a and 116b have been described with reference to the third and fourth manufacturing methods, and therefore, the description will not be repeated here.

The amount of etching of the cut-outs 130a and 130b is set to a value smaller than the target value determined based on the leakage amount information obtained in the leakage amount measuring step, for example, to about 50% of the target value, and the first balance adjustment step (step ST64) is performed by converting the amount of etching into an equivalent processing time; as an example, the etching is performed to a depth K1 as illustrated.

As shown in FIG. 45, when the etch-off portion on the upper side is designated by 117a and the etch-off portion on the lower side by 117b, etch-off portions 117a1 and 117b1 represent the crystal etch-off portions when etched to the depth K1.

Next, the measurement is made once again in the leakage amount measuring step (step ST65). If it is determined in step ST66 that the leakage amount is greater than the specified value, a new target value for the amount of etching is set based on the newly obtained leakage amount information, and the balance adjustment step (step ST64) is once again performed by converting the amount of etching into an equivalent processing time; as an example, the etching is performed this time to a depth K2 as illustrated. Etch-off portions 117a2 and 117b2 represent the crystal etch-off portions when etched to the depth K2.

Next, the measurement is made once again in the leakage amount measuring step (step ST65). If it is determined in step ST66 that the leakage amount is greater than the specified value, a new target value for the amount of etching is set based on the newly obtained leakage amount information, and the balance adjustment step (step ST64) is once again performed by converting the amount of etching into an equivalent processing time; as an example, the etching is performed this time to a depth K3 as illustrated. Etch-off portions 117a3 and 117b3 represent the crystal etch-off portions when etched to the depth K3.

The sum of the etch-off portions 117a1, 117a2, and 117a3 and the sum of the etch-off portions 117b1, 117b2, and 117b3 are each equal to the specified value defining the amount of etching. In this way, the process from step ST64 to step ST66 is repeated a plurality time to perform the balance adjustment until the leakage amount is brought within the specified value.

Here, the relationship between the etching time and the amount of effective adjustment can be determined in advance through experiment, etc. for various aperture widths of the adjustment areas 130a and 130b of the electrodes 120a and 121c, for example, for the aperture width one-half of the width of the vibrating tine 111, 112, the aperture width one-quarter of the width of the vibrating tine, and so on. For example, for the case where the aperture width of each of the adjustment areas 130a and 130b is one-half of the width of the vibrating tine 111, 112, the amount of effective adjustment is 3000 mV when the etching time is 120 (s), and 1500 mV when the etching time is 60 (s). Similarly, for the case where the aperture width of each of the adjustment areas 130a and 130b is one-quarter of the width of the vibrating tine 111, 112, the amount of effective adjustment is 1500 mV when the etching time is 120 (s), and 750 mV when the etching time is 60 (s). The amount of effective adjustment refers to the amount by which the measured leakage amount can be adjusted.

As described above, according to the fifth manufacturing method of the present invention, after characterizing the crystal oscillator and forming its external shape, the leakage amount of the crystal oscillator is measured and, based on the thus measured leakage amount, etching for balance adjustment is performed a plurality of times in small increments, thereby achieving the manufacturing of a very highly precisely adjusted crystal oscillator.

Further, while performing the balance adjustment and the leakage amount measurement repeatedly, any crystal oscillator piece whose leakage amount has been brought within the specified value is separated from the crystal wafer, and the out-of-spec crystal oscillator pieces remaining on the crystal wafer are sent to the next cycle of leakage adjustment, the process being repeated until the leakage amount is brought within the specified value. Since the leakage amount of each individual crystal oscillator piece can thus be adjusted at a fine level, the method can achieve manufacturing of crystal oscillator pieces whose variations in leakage amount are extremely small.

The fifth manufacturing method can be employed advantageously when each individual crystal oscillator piece has to be adjusted particularly precisely or when the leakage amount varies among the crystal oscillator pieces on the crystal wafer because of the composition, processing conditions, etc.

Next, a description will be given of a crystal oscillator having grooves formed therein.

FIG. 46 is a cross-sectional view showing another example of the driving tine 111 of the crystal oscillator piece 107 formed on the crystal wafer 101, in which a plurality of grooves 115 are formed in the upper and lower principal faces of the driving tine 111 along the longitudinal direction of the crystal oscillator piece 107. Crystal oscillator pieces having such grooves 115 are known in the art, but by forming the grooves 115 in such a manner that a groove electrode 115a formed inside each groove 115 faces a portion of the driving electrode 121a or 121b formed on a side face, the electric field applied to the crystal oscillator increases, which serves to increase the driving capability of the crystal oscillator. In the example of FIG. 46, more than one groove 115 is provided, but only one groove may be provided.

Figure 46A:
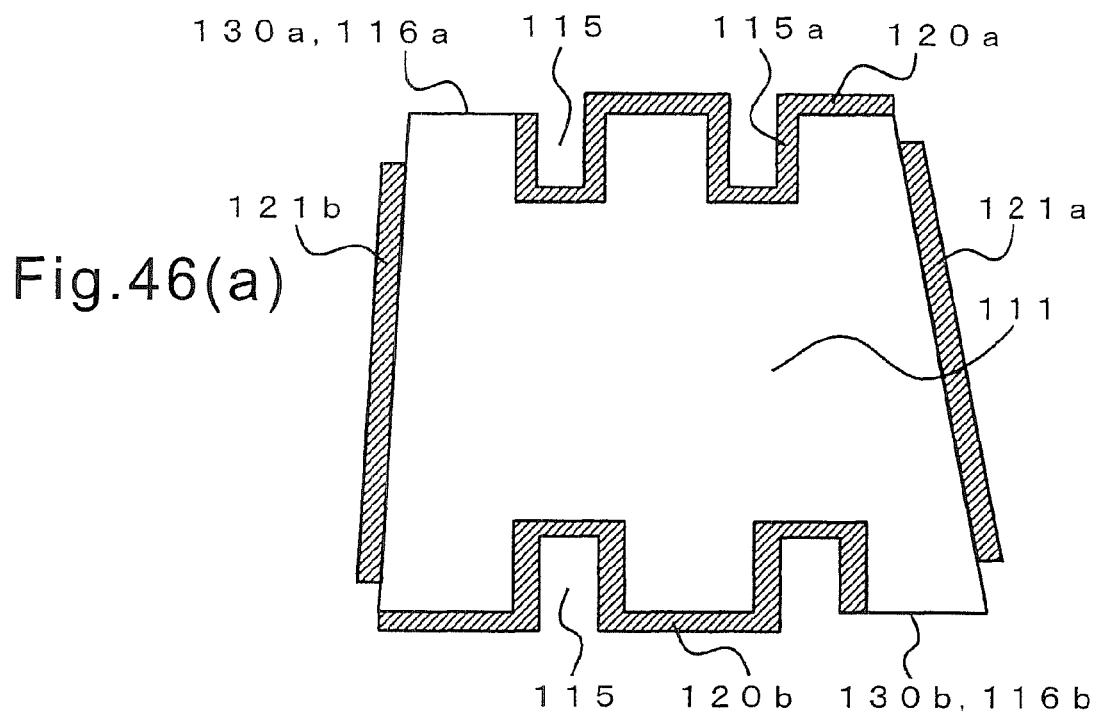
FIGS. 46(a) and 46(b) are cross-sectional views explaining how a leakage adjustment is applied to a grooved crystal oscillator manufactured according to the manufacturing method of the present invention.

In the electrode forming step, the driving electrodes 120a and 120b are formed on the upper and lower principal faces of the driving tine 111 having the grooves 115 as shown in FIG. 46(a), and the cut-outs 130a and 130b are formed along the edges of the respective driving electrodes 120a and 120b to expose the underlying crystal surfaces. As in the earlier described example, the area where the crystal surface of the driving tine is exposed in the cut-out 130a is the adjustment area 116a, and the area exposed in the cut-out 130b is the adjustment area 116b.

Figure 46B:
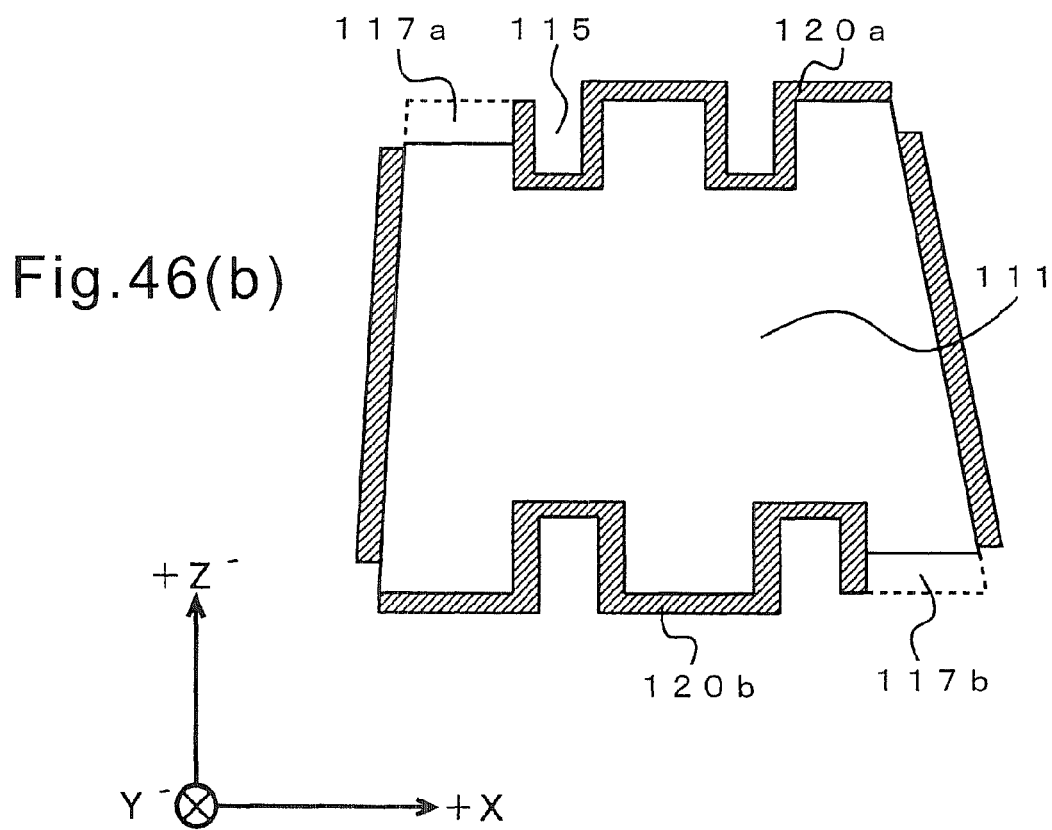

Next, as shown in FIG. 46(b), in the balance adjustment step, the crystal wafer 101 is again immersed in an etching solution for collective re-etching, to etch off the upper and lower surface portions of the driving tine 11 exposed in the cut-outs 130a and 130b, forming the etch-off portions 117a and 117b (indicated by dashed lines). Due to the formation of the etch-off portions, the thickness of the driving tine 111 is slightly reduced in the corresponding portions. By etching off the crystal in the cut-outs 130a and 130b, the top-bottom and left-right asymmetrical cross-sectional shape is corrected, and the leakage vibration is suppressed.

It is preferable that the cut-outs 130a and 130b are each formed in a region extending from the groove 115 to the edge (corner) of the driving tine 111 as shown, but if the width dimension is limited, the cut-outs may each be formed by also using a portion extending toward the center. Further, the positions of the cut-outs 130a and 130b are determined in accordance with the tilting of the principal axis in such a manner as to cancel out the crystal portions formed displaced in a top-bottom and left-right asymmetrical manner.

The balance adjustment of the crystal oscillator having such grooved driving tines can be performed in accordance with the manufacturing process of any one of the third to fifth manufacturing methods.

Next, the sixth manufacturing method according to the present invention will be described.

The feature of the sixth manufacturing method is that the etching mask members arranged on the upper and lower surfaces of the crystal plate are displaced relative to each other by a predetermined amount so that the direction of the leakage vibration of the crystal oscillator can be estimated in advance. Since the sixth manufacturing method is essentially the same as the third to fifth manufacturing methods except for some differences, the same elements as those in the third to fifth manufacturing methods are designated by the same reference numerals, and the description already given will not be repeated here.

The process sequence of any one of the third to fifth manufacturing methods can be employed as the process sequence of the sixth manufacturing method, and therefore, the process sequence itself will not be described here. The details of each process step will be described below.

FIG. 47 is a diagram for explaining the details of the crystal oscillator external shape forming step according to the sixth manufacturing method.

FIG. 47 is a cross-sectional view, similar to FIG. 34 of the third manufacturing method, schematically showing cross sections of the vibrating tines of the crystal oscillator pieces formed on the crystal wafer. In FIG. 47, two crystal oscillator pieces, each identical to the crystal oscillator 110 shown in FIG. 32, are shown arranged side by side, as viewed from the distal ends of the driving tines 111 and 112 and detection tine 113, looking toward the base portion 114.

Figure 47A:
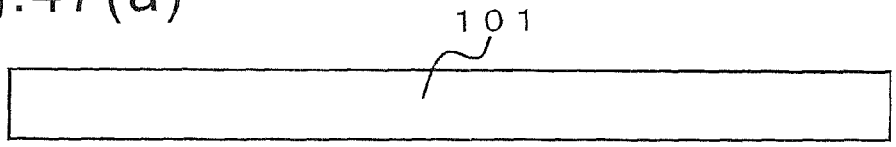
FIGS. 47(a) to 47(e) are cross-sectional views explaining an external shape forming step according to a sixth manufacturing method of the present invention.
Figure 47B:
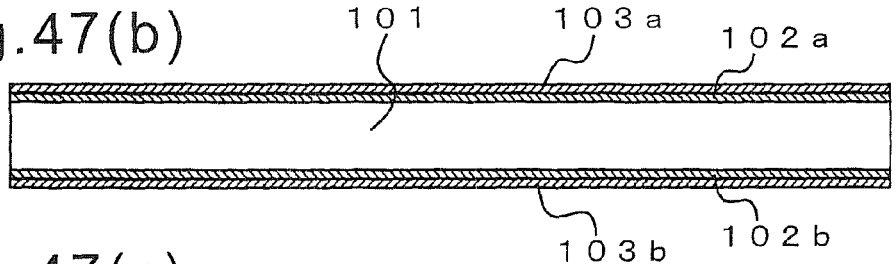

As shown in FIG. 47(b), corrosion resistant metal films 102a and 102b having resistance to crystal etchants and photoresist films 103a and 103b overlying the respective corrosion resistant metal films 102a and 102b are formed on the upper and lower surfaces of the crystal wafer 101 of FIG. 47(a), which is a single planar plate of crystal prepared to a prescribed thickness.

In the example of FIG. 47(b), the corrosion resistant metal films 102a and 102b are each shown as a single-layer film for ease of illustration, but each may be formed as a multilayer film of gold (Au) and chromium (Cr), as earlier described. These metal films can be formed using known evaporation or sputtering techniques.

Figure 47C:
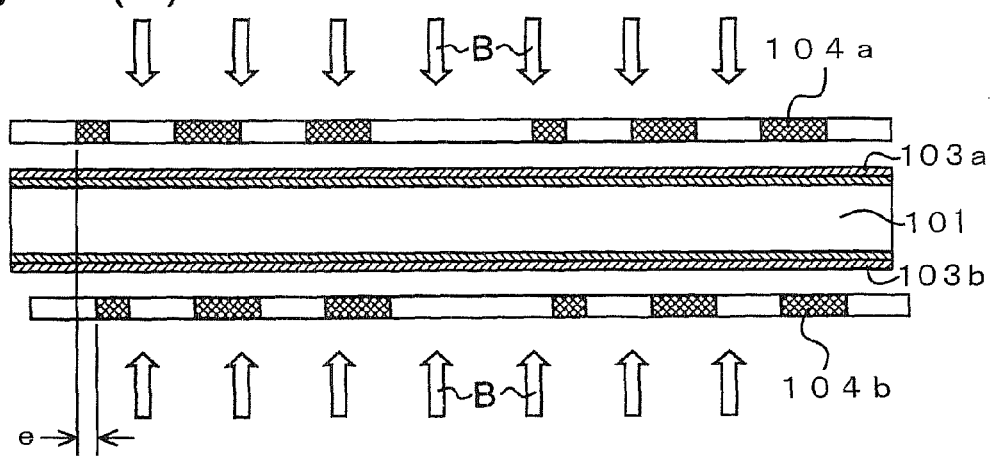

Next, as shown in FIG. 47(c), two photomasks 104a and 104b, on which oscillator patterns are written, are placed over the upper and lower surfaces of the crystal wafer 101, and the photoresist films 103a and 103b are exposed by radiating light (indicated by arrows B) from above the respective photomasks 104a and 104b. Here, the photomasks 104a and 104b are each a photomask on which the oscillator pattern scaled to the exact size is written, but the photomasks 104a and 104b are displaced relative to each other by a predetermined amount in the X axis direction. Here, the amount of displacement between the photomasks 104a and 104b is defined as the amount of positional displacement "e".

Figure 47D:
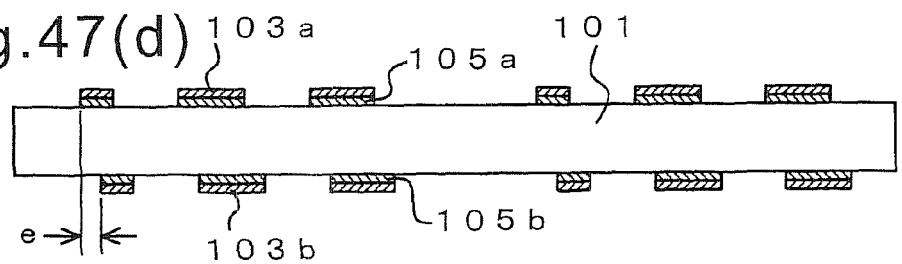

Next, as shown in FIG. 47(d), the photoresist films 103a and 103b are developed, and using the thus developed resist patterns as masks, the corrosion resistant metal films 102a and 102b are patterned, thereby forming etching masks 105a and 105b as the etching resistant mask members. When the corrosion resistant metal films 102a and 102b are multilayer films of gold (Au) and chromium (Cr), these two metal layers are separately etched.

Here, since the photomasks 104a and 104b are displaced relative to each other by the amount "e" in the X axis direction, as described above, the etching masks 105a and 105b formed as the etching resistant mask members are also displaced by the same amount "e".

Figure 47E:
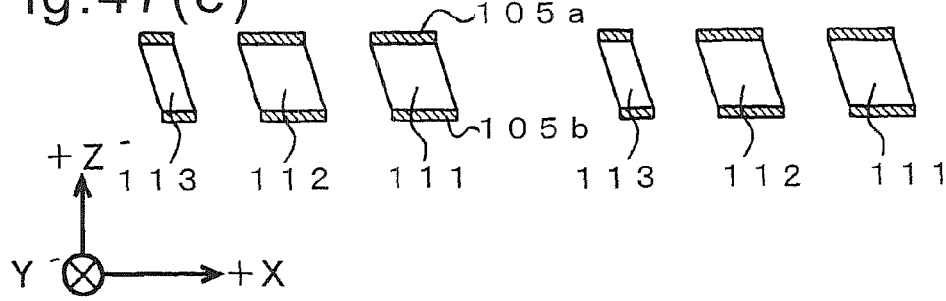

Next, after removing the remaining photoresist films 103a and 103b, the crystal wafer 101 with the etching masks 105a and 105b formed on the upper and lower surfaces thereof is immersed in an etching solution of hydrofluoric acid which is a crystal etching solution; thereupon, the portions not covered with the etching masks 105a and 105b are dissolved from the upper and lower surfaces, as shown in FIG. 47(e). After that, the etching masks 105a and 105b are removed, thus forming the vibrating tines, i.e., the driving tines 111 and 112 and the detection tines 113 of the crystal oscillator pieces.

The crystal wafer 101 is etched from both the upper and lower surfaces thereof using the etching masks 105a and 105b; here, since the etching masks 105a and 105b are displaced by the amount "e", as described above, the cross section of each crystal oscillator piece is formed in a substantially parallelogram shape parallel to the thus displaced etching masks 105a and 105b, as shown. If the amount of etching mask displacement "e" here is sufficiently larger than the amount of positional displacement "e" (see FIG. 47) arising from manufacturing errors as described with reference to the prior art, then the cross section of each crystal oscillator piece is formed in a substantially parallelogram shape parallel by being little affected by manufacturing errors. The residues are not shown here.

By thus characterizing the external shape of the crystal oscillator, the direction of the leakage vibration of the crystal oscillator can be estimated in advance. That is, in the case of the mask displacement arising from manufacturing errors, the direction of the leakage vibration cannot be identified, but when the etching masks are deliberately displaced relative to each other, the direction of the leakage vibration can be estimated in advance.

The electrode forming step in the sixth manufacturing method is the same as the electrode forming step (FIGS. 37 to 40) in the previously described third manufacturing method. That is, as shown in FIG. 39, the driving electrodes 120a and 121c are formed on the principal faces of the respective driving tines 111 and 112 of the crystal oscillator piece 107, and each of the driving electrodes 120a and 121c is provided with the cut-out 130 for balance adjustment. The cut-out 130 is formed as a long narrow region extending longitudinally along one entire side of each of the driving electrode 120a and 121c. More specifically, the cut-out 130 is formed with its substantially widthwise center C2 displaced from the substantially widthwise center C1 of the driving tine 111, 112 in the widthwise direction of the driving tine 111, 112. As in the earlier described example, the cut-out 130a for forming the adjustment area 116a is formed on the upper surface of the driving tine, and the cut-out 130b for forming the adjustment area 116b is formed on the lower surface.

In the adjustment areas 116a and 116b where the crystal surfaces are exposed, the surfaces are dissolved by re-etching in the subsequent balance adjustment step, and the cross-sectional shape of the driving tine 111, 112 is adjusted so as to suppress the generation of leakage vibration. That is, since the external shape of the crystal oscillator is characterized in the external shape forming step so that the direction of the leakage vibration of the crystal oscillator can be estimated in advance, the cut-out 130 is formed in each electrode, based on the estimation, in the electrode forming step. Here, the cut-out 130 may be formed as a portion of each electrode, as illustrated in FIG. 40(a) or 40(b) of the third manufacturing method.

Figure 48:
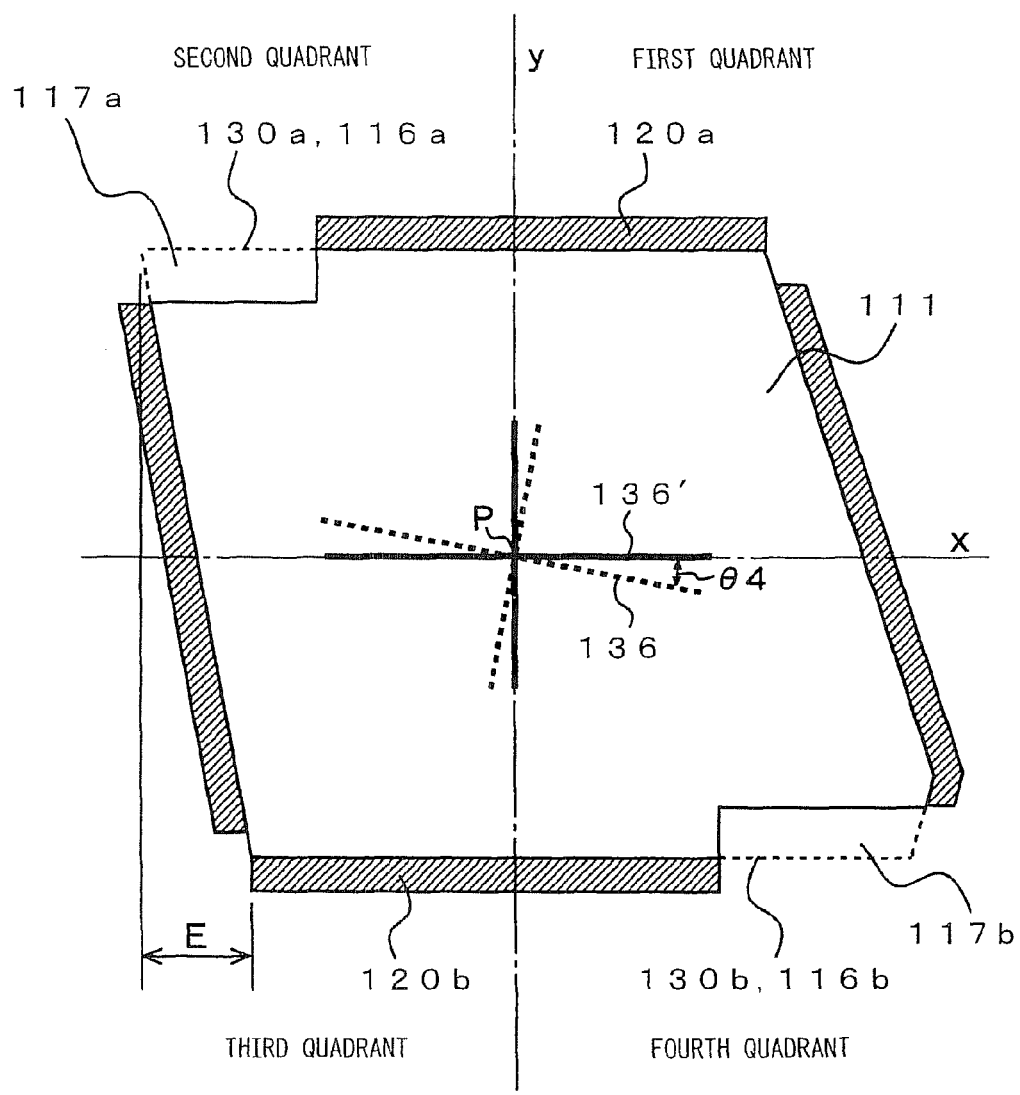
FIG. 48 is an enlarged cross-sectional view explaining how the second and fourth quadrants of the driving tine of the crystal oscillator piece are etched off in a balance adjustment step according to the sixth manufacturing method of the present invention.
Figure 49:
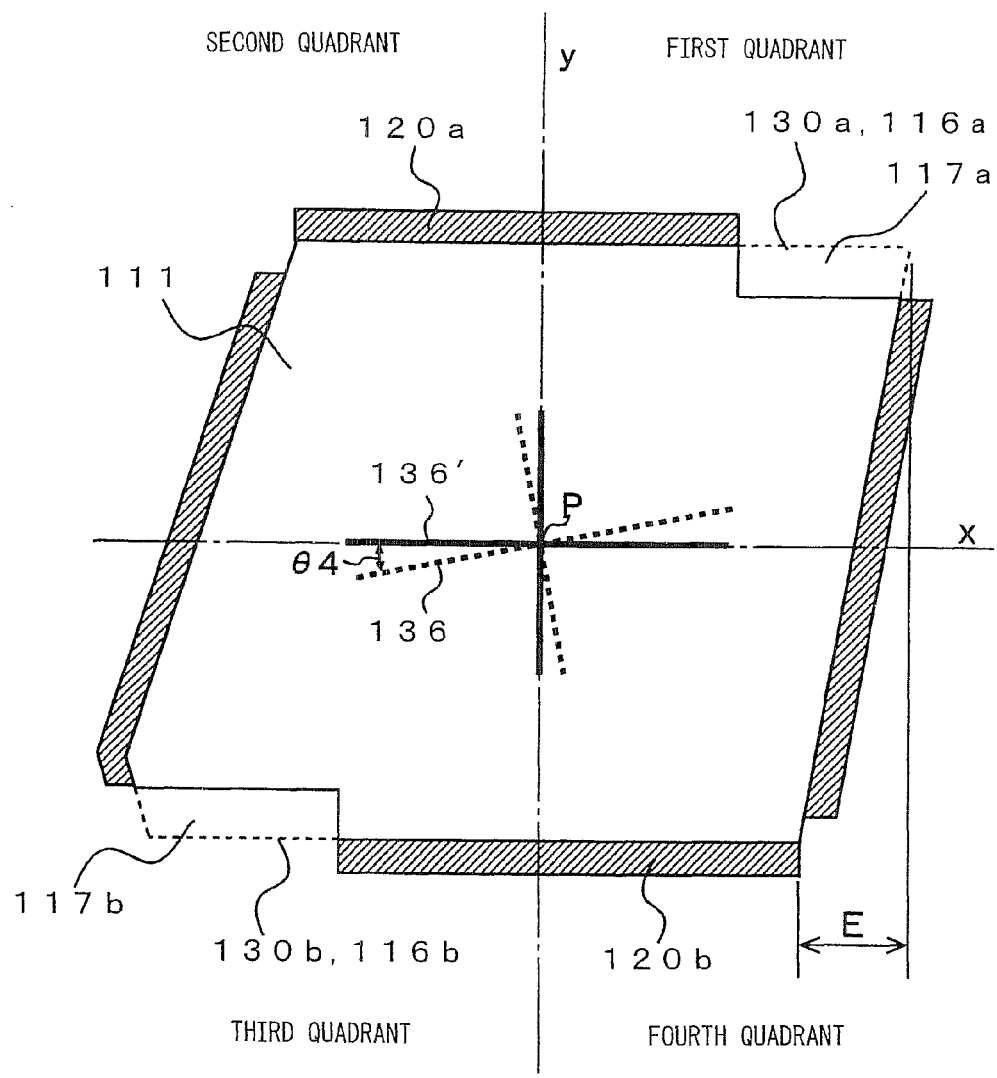
FIG. 49 is an enlarged cross-sectional view explaining how the first and third quadrants of the driving tine of the crystal oscillator piece are etched off in the balance adjustment step according to the sixth manufacturing method of the present invention.

FIGS. 48 and 49 are diagrams for explaining the balance adjustment step in the sixth manufacturing method.

The balance adjustment step is the same as the corresponding step in the third manufacturing method; that is, after the driving electrodes on the driving tines 111 and 112 have been formed in the prescribed shape in the preceding electrode forming step, the crystal wafer 101 is re-etched in a collective manner by using the thus formed driving electrodes as masks, and the cross-sectional shapes of the driving tines 111 and 112 of the crystal oscillator piece 107 are corrected to adjust the balance of the vibration, thereby adjusting the leakage amount and suppressing the leakage vibration of the crystal oscillator piece 107.

FIG. 48 is a cross-sectional view taken along line D-D' in FIG. 39 and schematically showing, in enlarged detail, the cross section of the driving tine 111 of the crystal oscillator piece 107 formed on the crystal wafer 101. Since the lower etching mask is displaced by the amount "E" in the +X axis direction, the cross-sectional shape is substantially a parallelogram; by characterizing the shape of the crystal oscillator piece in this manner, the direction of the leakage vibration can be estimated in advance. That is, the cross-sectional shape of the driving tine 111 thus characterized is top-bottom and left-right asymmetrical, and the principal axis 136 (dashed line) is tilted at an angle θ4 relative to the X axis, resulting in the generation of leakage vibration. Then, the cut-outs are formed so as to cancel out the thus characterized top-bottom and left-right asymmetrical cross-sectional shape, and the crystal in each of the resulting adjustment areas is etched off to suppress the generation of leakage vibration.

In FIG. 48, the driving electrodes 120a and 120b are formed on the respective principal faces of the driving tine 111, and the etch-off portions 117a and 117b are formed in the portions of the driving tine 111 corresponding to the cut-outs 130a and 130b of the driving electrodes 120a and 120b. Here, when the center of the vibrating axis of the driving tine 111 is taken as the origin P, and the first to fourth quadrants are defined by two mutually perpendicular axes x and y passing through the origin P, the cut-outs 130a and 130b of the driving tine 111 are formed in a pair of quadrants diametrically opposed across the origin P, as in the third manufacturing method.

In the processing of the cut-outs 130a and 130b, the amount of etching may or may not be the same between any two quadrants diametrically opposed across the origin P. Similarly, the amount of etching may or may not differ between any two adjacent quadrants.

In the example of FIG. 48, the cut-outs 130a and 130b are formed in the second and fourth quadrants, because the balance can be adjusted by etching off the crystal in the second and fourth quadrants so as to cancel out the top-bottom and left-right asymmetrical cross-sectional shape resulting from the lower etching mask being displaced in the +X direction.

That is, by etching off the crystal in the cut-outs 130a and 130b formed in the second and fourth quadrants, the top-bottom and left-right asymmetrical cross-sectional shape is corrected, though the cross-sectional shape is still top-bottom and left-right asymmetrical, and the principal axis 136 is corrected as indicated by the principal axis 136' (solid line) to suppress the generation of leakage vibration.

As in the third manufacturing method, the amount of etching of the cut-outs 130a and 130b in the sixth manufacturing method can also be determined by considering the formation of residues on the crystal oscillator, by estimating the direction of the leakage vibration and the magnitude of the leakage amount, and by converting the amount of etching into an equivalent processing time. It is also possible to determine the amount of etching by converting it into an equivalent processing time based on the leakage amount information of the crystal oscillator piece, as in the fourth manufacturing method. Alternatively, the amount of etching may be determined based on the leakage amount information of the crystal oscillator piece in such a manner that the etching for the balance adjustment is repeated a plurality of times in small increments, as practiced in the fifth manufacturing method.

FIG. 49 is a diagram showing the cross section formed in a substantially parallelogram shape by displacing the lower etching mask by the amount "e" in the −X axis direction, that is, in the direction opposite to that shown in FIG. 48. In this case, the shape of the crystal oscillator piece is characterized in the opposite direction so that the direction of the leakage vibration can be estimated in advance. In this case, the cut-outs 130a and 130b of the driving tine 111 should be formed in the first and third quadrants so as to cancel out the crystal portions formed in a displaced manner, as shown. That is, by etching off the crystal in the cut-outs 130a and 130b formed in the first and third quadrants, the top-bottom and left-right asymmetrical cross-sectional shape is corrected, though the cross-sectional shape is still top-bottom and left-right asymmetrical, and the principal axis 136 is corrected as indicated by the principal axis 136' (solid line) to suppress the generation of leakage vibration.

As described above, according to the sixth manufacturing method, the etching masks arranged on the upper and lower surfaces of the crystal wafer are displaced relative to each other by a predetermined amount; by thus characterizing the external shape of the crystal oscillator to be formed, the direction of the leakage vibration can be estimated in advance, and the electrodes provided with the cut-outs formed based on the thus estimated direction of the leakage vibration can be formed on the driving tine. As a result, since the leakage vibration can be adjusted in the re-etching step without being affected by errors such as the mask displacement arising from manufacturing variations, it becomes possible to provide a crystal oscillator whose leakage vibration is highly precisely adjusted.

In the third to sixth manufacturing methods described above, the cut-out is formed in advance in each electrode of the driving tine in the electrode forming step, and the leakage vibration of the crystal oscillator is adjusted by re-etching the adjustment area formed in the cut-out; however, in such cases as when variations in leakage amount within the crystal wafer are large, the electrodes may be further processed by laser or the like to form, in addition to the cut-outs formed in advance, additional cut-outs where the crystal surfaces are exposed. In the case of the fourth manufacturing method, for example, the additional electrode processing step can be added after the leakage amount measuring step (step ST53). By adding this electrode processing step, the range of the leakage amount adjustment can be expanded for each individual device, which serves to increase the potential of being able to increase the number of non-defective devices by adjusting the leakage amount even when variations in leakage amount within the crystal wafer are large.

The external shape characterization for estimating the direction of the leakage vibration is not limited to the single-sided mask or mask displacement techniques, but other techniques may be employed in the present invention. Further, the flowcharts, external shape diagrams, etc. shown in the embodiments of the present invention are not limited to those illustrated here, but may be modified as desired without departing from the spirit and purpose of the present invention.

Furthermore, the flowcharts, external shape diagrams, etc. related to the first to sixth manufacturing methods of the present invention are only examples and not limited to those illustrated here, but may be modified as desired without departing from the spirit and purpose of the present invention.

The first to sixth crystal oscillator manufacturing methods of the present invention can provide a compact crystal oscillator at low cost by adjusting its leakage vibration highly precisely, and are therefore employed advantageously for the manufacturing of a compact and high-precision crystal oscillator for use as a gyro sensor.

What is claimed is:

1. A method for manufacturing a crystal oscillator comprising the step of:
    first etching so as to form a prescribed external shape;
    forming an electrode at least in a portion of a surface of said external shape;
    measuring a leakage amount associated with leakage vibration of said external shape;
    processing said electrode into a prescribed shape based on the measurement result of said leakage amount measuring step so that said surface of said external shape has an adjustment area where said electrode has been removed; and
    second etching said external shape by using said electrode processed in said processing step as a mask in order to bring said leakage amount within a specified value, wherein said external shape includes a base portion and at least a vibrating tine extending from said base portion, and wherein said electrode forming step forms said electrode on said vibrating tine.

2. The method for manufacturing the crystal oscillator according to claim 1, wherein, in said electrode processing step, said electrode is processed in such a manner that a substantially widthwise center of an exposed portion formed by processing said electrode becomes displaced from a substantially widthwise center of said vibrating tine in a widthwise direction of said vibrating tine.

3. The method for manufacturing the crystal oscillator according to claim 1, further comprising a step of coarsely adjusting, inserted between said electrode forming step and said leakage amount measuring step, by etching said vibrating tine by using said electrode formed in said electrode processing step as a mask.

4. The method for manufacturing the crystal oscillator according to claim 3, wherein, in said electrode forming step, said electrode is formed in such a manner that a substantially widthwise center of said electrode becomes displaced from a substantially widthwise center of said vibrating tine by a predetermined amount in a widthwise direction of said electrode.

5. The method for manufacturing the crystal oscillator according to claim 1, wherein, in said electrode processing step, said electrode is processed, based on the measurement result of said leakage amount measuring step, in such a manner that either a first region of said electrode, which is a region near the base portion of said vibrating tine, or a second region of said electrode, which is a region near a distal end of said vibrating tine, has a reduced width than its initial state.

6. The method for manufacturing the crystal oscillator according to claim 5, wherein, in said electrode processing step, said electrode is processed in such a manner as to reduce the width of the electrode in said first region when the measurement result of said leakage amount measuring step shows that a large adjustment is necessary, but to reduce the width of the electrode in said second region when said measurement result shows that a small adjustment is necessary.

7. The method for manufacturing the crystal oscillator according to claim 5, wherein said second etching step and said electrode processing step are performed a plurality of times, and said first region of said electrode is first processed in said electrode processing step.

8. The method for manufacturing the crystal oscillator according to claim 1, wherein said second etching step determines the amount of etching of said vibrating tine by converting the amount of etching into an equivalent processing time, based on leakage amount information obtained from the measurement result of said leakage amount measuring step.

9. The method for manufacturing the crystal oscillator according to claim 1, wherein said vibrating tine has a plurality of etch-off portions formed by etching in said second etching step, and when a center of a vibrating axis of a cross section of said vibrating tine is taken as an origin, and a first quadrant, a second quadrant, a third quadrant, and a fourth quadrant are defined by two mutually perpendicular axes passing through said origin, said etch-off portions are provided in quadrants diametrically opposed across said origin.

10. The method for manufacturing the crystal oscillator according to claim 1, wherein when a center of a vibrating axis of a cross section of said vibrating tine is taken as an origin, and a first quadrant, a second quadrant, a third quadrant, and a fourth quadrant are defined by two mutually perpendicular axes passing through said origin, the amount of etching in said second etching step is the same between any two quadrants diametrically opposed across said origin but differs between any two adjacent quadrants.

11. The method for manufacturing the crystal oscillator according to claim 1, wherein in said first etching step, a plurality of said external shapes are formed on a single plate of crystal, and in said second etching step, said plurality of external shapes are etched simultaneously.

12. The method for manufacturing the crystal oscillator according to claim 11, wherein said leakage amount measuring step measures said leakage amount for each one of said plurality of external shapes, and stores positional relationship information associating said measured leakage amount with a corresponding one of said plurality of external shapes.

13. The method for manufacturing the crystal oscillator according to claim 1, wherein said electrode forming step is performed by irradiating said electrode with laser light.

14. A method for manufacturing a crystal oscillator comprising the step of:

first etching so as to form a prescribed external shape;

forming an electrode at least in a portion of a surface of said external shape; and second etching said external shape, wherein, in said first etching step, said external shape whose direction of leakage vibration can be estimated is formed, and in said electrode forming step, said electrode is formed so as to have a cut-out for adjusting balance in accordance with said external shape formed in said etching step, wherein said external shape includes a base portion and at least a vibrating tine extending from said base portion, wherein said electrode forming step forms said electrode on said vibrating tine, and wherein, in said second etching step, said electrode having said cut-out formed in said forming step is used as a mask.

15. The method for manufacturing the crystal oscillator according to claim 14, wherein, in said external shape forming step, mask members are formed on both faces of a planar crystal plate, and said mask members on said both faces are differently sized widthwise so that the direction of leakage vibration of said external shape to be formed can be estimated in advance.

16. The method for manufacturing the crystal oscillator according to claim 14, wherein, in said external shape forming step, mask members are formed on both faces of a planar crystal plate, and said mask members on said both faces are displaced relative to each other by a predetermined amount so that the direction of leakage vibration of said external shape to be formed can be estimated in advance.

17. The method for manufacturing the crystal oscillator according to claim 15, wherein when the amount of offset at a first side face as measured widthwise of said mask members on both said faces is denoted by k1, the amount of offset at a second side face by k2, mask registration accuracy by ±p, etching angle at said first side face by $\alpha$, etching angle at said second side face by $\beta$, and the thickness of said planar crystal plate by t, then the length "c" of a first protruding portion and the length "d" of a second protruding portion satisfy the relations $c=t*\tan(\alpha-90°)+k1$ and $d=t*\tan(\beta-90°)+k2$ where k1, k2>p.

18. A method for manufacturing a crystal oscillator comprising the step of:

first etching so as to form a prescribed external shape;

forming an electrode at least in a portion of a surface of said external shape;

measuring a leakage amount associated with leakage vibration of said external shape; and second etching said external shape by an amount that is determined based on a measurement result of said leakage amount measuring step so as to adjust balance, wherein, in said first etching step, said external shape whose direction of leakage vibration can be estimated is formed, and in said electrode forming step, said electrode is formed so as to have a cut-out for adjusting balance in accordance with said external shape formed in said first etching step, wherein said external shape includes a base portion and at least a vibrating tine extending from said base portion, and wherein said electrode forming step forms said electrode on said vibrating tine.

19. The method for manufacturing the crystal oscillator according to claim 18, wherein, in said external shape forming step, mask members are formed on both faces of a planar crystal plate, and said mask members on said both faces are differently sized widthwise so that the direction of leakage vibration of said external shape to be formed can be estimated in advance.

20. The method for manufacturing the crystal oscillator according to claim 18, wherein, in said external shape forming step, mask members are formed on both faces of a planar crystal plate, and said mask members on said both faces are displaced relative to each other by a predetermined amount so that the direction of leakage vibration of said external shape to be formed can be estimated in advance.

21. The method for manufacturing the crystal oscillator according to claim 19, wherein when the amount of offset at a first side face as measured widthwise of said mask members on both said faces is denoted by $k1$, the amount of offset at a second side face by $k2$, mask registration accuracy by $\pm p$, etching angle at said first side face by $\alpha$, etching angle at said second side face by $\beta$, and the thickness of said planar crystal plate by $t$, then the length "c" of a first protruding portion and the length "d" of a second protruding portion satisfy the relations $c = t*\tan(\alpha - 90°) + k1$ and $d = t*\tan(\beta - 90°) + k2$ where $k1, k2 > p$ where $k1, k2 > p$.

* * * * *